(12) United States Patent
Nishihara

(10) Patent No.: US 7,002,836 B2
(45) Date of Patent: *Feb. 21, 2006

(54) FERROELECTRIC-TYPE NONVOLATILE SEMICONDUCTOR MEMORY AND OPERATION METHOD THEREOF

(75) Inventor: Toshiyuki Nishihara, Kanagawa (JP)

(73) Assignee: Sony Corporation, (JP)

( * ) Notice: Subject to any disclaimer, the term of this patent is extended or adjusted under 35 U.S.C. 154(b) by 33 days.

This patent is subject to a terminal disclaimer.

(21) Appl. No.: 11/070,378

(22) Filed: Mar. 3, 2005

(65) Prior Publication Data

US 2005/0174832 A1   Aug. 11, 2005

Related U.S. Application Data

(63) Continuation of application No. 10/239,388, filed as application No. PCT/JP02/002576 on Jan. 17, 2002, now Pat. No. 6,882,558.

(30) Foreign Application Priority Data

Jan. 23, 2001 (JP) .............................. 2001-015053

(51) Int. Cl.
   *G11C 11/22* (2006.01)
(52) U.S. Cl. ........................................ 365/145; 365/71
(58) Field of Classification Search ................ 365/145, 365/171
   See application file for complete search history.

(56) References Cited

U.S. PATENT DOCUMENTS

| 4,873,664 A | 10/1989 | Eaton, Jr. |
| 6,091,622 A | 7/2000 | Kang |
| 6,370,058 B1 * | 4/2002 | Fukumoto ............... 365/185.08 |
| 6,700,146 B1 * | 3/2004 | Ito ............................. 257/295 |

FOREIGN PATENT DOCUMENTS

| JP | 9-116107 | 5/1997 |
| JP | 09-121032 | 5/1997 |
| JP | 2000-349248 | 12/2000 |

* cited by examiner

Primary Examiner—Michael T. Tran
(74) Attorney, Agent, or Firm—Rader, Fishman & Grauer PLLC; Ronald P. Kananen

(57) ABSTRACT

A method of operating a ferroelectric-type nonvolatile semiconductor memory comprising a memory unit having a bit line, a transistor for selection, a sub-memory unit composed of memory cells that are M in number, plate lines that are M in number, and a sense amplifier connected to the bit line; wherein each memory cell comprises a first electrode, a ferroelectric layer and a second electrode; the first electrodes of the memory cells constituting the sub-memory unit are in common with the sub-memory unit; said common first electrode is connected to the bit line through the transistor for selection; and each second electrode is connected to each plate line; said method comprising reading out data stored in the memory cell at a designated address externally designated, latching said data in the sense amplifier, and then outputting said data latched in the sense amplifier.

1 Claim, 29 Drawing Sheets

FERROELECTRIC-TYPE NONVOLATILE SEMICONDUCTOR MEMORY AND OPERATION METHOD THEREOF This is a continuation application of Ser. No. 10/239,388, filed on Sep. 23, 2002, now U.S. Pat. No. 6,882,558, issued Apr. 19, 2005, which in turn is a 371 of PCT/JP02/002576, filed Jan. 17, 2002, the entire contents of which are hereby incorporated by reference.

TECHNICAL FIELD

The present invention relates to a ferroelectric-type nonvolatile semiconductor memory and an operation method thereof.

BACKGROUND ART

In recent years, studies are actively made with regard to a mass-storage ferroelectric-type nonvolatile semiconductor memory. A ferroelectric-type nonvolatile semiconductor memory (to be sometimes abbreviated as "nonvolatile memory" hereinafter) permits fast access and is nonvolatile, and it is small in size and consumes low-level electric power. Further, the ferroelectric-type nonvolatile semiconductor memory is highly impact-resistant, and it is expected to be used as a main memory in various electronic devices having file storage and resume functions, such as a portable computer, a cellular phone and a game machine, or to be used as a recording medium for recording voices and video images.

The above nonvolatile memory is a fast rewritable nonvolatile memory according to a method in which fast polarization inversion of a ferroelectric thin film and residual polarization thereof are used, and a change in an accumulated charge amount in a memory cell (capacitor member) having a ferroelectric layer is detected. In principle, the nonvolatile memory comprises the memory cell and a transistor for selection (transistor for switching). The memory cell comprises, for example, a lower electrode, an upper electrode and a ferroelectric layer interposed between them. Data is written into and read out from the above nonvolatile memory by application of a P-E hysteresis loop of a ferroelectric material shown in FIG. 27. That is, when an external electric field is applied to the ferroelectric layer and then removed, the ferroelectric layer exhibits residual polarization. The residual polarization comes to be $+P_r$ when an external electric field in the plus direction is applied, and it comes to be $-P_r$ when an external electric field in the minus direction is applied. In this case, a case where the residual polarization is in a $+P_r$ state (see "D" in FIG. 27) is taken as "0", and a case where the residual polarization is in a $-P_r$ state (see "A" in FIG. 27) is taken as "1".

For discriminating states of "1" and "0", an external electric field, for example, in the plus direction is applied to the ferroelectric layer, whereby the polarization of the ferroelectric layer comes to be in a "C" state in FIG. 27. When the data is "0", the polarization state of the ferroelectric layer changes from "D" to "C". When the data is "1", the polarization state of the ferroelectric layer changes from "A" to "C" through "B". When the data is "0", no polarization inversion takes place in the ferroelectric layer. When the data is "1", polarization inversion takes place in the ferroelectric layer. As a result, there is caused a difference in the accumulated charge amount in the memory cell. The transistor for selection in a selected nonvolatile memory is turned on, whereby the accumulated charge is detected as a signal current. When the external electric field is changed to 0 after the data is read out, the polarization state of the ferroelectric layer comes into a "D" state in FIG. 27 both when the data is "0" and when the data is "1". That is, when the data is read out, the data "1" is once destroyed when the data is "1", therefore, an external electric field in the minus direction is applied, so that the polarization state is brought into "A" state through "D" and "E" to re-write data "1".

The structure and the operation of a currently mainstream nonvolatile memory are proposed by S. Sheffiled et al in U.S. Pat. No. 4,873,664. The above nonvolatile memory is constituted of two nonvolatile memory cells as shown in an equivalent circuit diagram of FIG. 28. In FIG. 28, each nonvolatile memory is surrounded by a dotted line. Each nonvolatile memory is constituted, for example, of transistors for selection $TR_{11}$ and $TR_{12}$ and memory cells $MC_{11}$ and $MC_{12}$.

Concerning two-digit or three-digit subscripts, for example, a subscript "11" is a subscript that should be shown as "1,1", and for example, a subscript "111" is a subscript that should be shown as "1,1,1". For simplified showing, the subscripts are shown as two-digit or three-digit subscripts in some cases. Further, a subscript "M" is used to show, for example, all of a plurality of memory cells or plate lines, and a subscript "m" is used to show individuals, for example, of a plurality of the memory cells or the plate lines. A subscript "N" is used to show, for example, all of transistors for selection or sub-memory units, and a subscript "n" is used to show, for example, individuals of the transistors for selection or the sub-memory units.

Complement data is written into each memory cell, and the memory cells store 1 bit. In FIG. 28, symbol "WL" stands for a word line, symbol "BL" stands for a bit line, and symbol "PL" stands for a plate line. When one nonvolatile memory is taken, word line $WL_1$ is connected to a word line decoder/driver WD. Bit lines $BL_1$ and $BL_2$ are connected to a sense amplifier SA. Further, plate line $PL_1$ is connected to a plate line decoder/driver PD.

When stored data is read out in the thus-structured nonvolatile memory, the word line $WL_1$ is selected, and further, the plate line $PL_1$ is driven. In this case, complement data appears in a pair of the bit lines $BL_1$ and $BL_2$ as voltages (bit line voltages) from a pair of the memory cells $MC_{11}$ and $MC_{12}$ through the transistors for selection $TR_{11}$ and $TR_{12}$. The voltages (bit line voltages) in a pair of the bit lines $BL_1$ and $BL_2$ are detected with the sense amplifier SA.

One nonvolatile memory occupies a region surrounded by the word line $WL_1$ and a pair of the bit lines $BL_1$ and $BL_2$. If the word lines and the bit lines are arranged at a smallest pitch, therefore, the smallest area that one nonvolatile memory can have is $8F^2$ when the minimum processable dimension is F. The thus-structured nonvolatile memory therefore has a smallest area of $8F^2$.

When it is attempted to increase the capacity of the above-structured nonvolatile memory, all that can be done relies on conversion of processable dimensions to finer dimensions. Further, two transistors for selection and two memory cells are required for constituting one nonvolatile memory. Furthermore, it is required to arrange the plate lines at the same pitch as that at which the word lines are arranged. It is therefore almost impossible to arrange nonvolatile memories at the minimum pitch, and in reality, the area that one nonvolatile memory occupies comes to be much larger than $8F^2$.

Moreover, it is also required to arrange the word line decoder/drivers WD and the plate line decoder/drivers PD at a pitch equivalent to a pitch at which the nonvolatile memories are arranged. In other words, two decoder/drivers are required for selecting one low-address. It is therefore difficult to layout peripheral circuits, and the area that the peripheral circuits occupy comes to be large.

One of means for decreasing the area of the nonvolatile memory is disclosed in JP-A-9-121032. As shown in an equivalent circuit diagram of FIG. 29, the nonvolatile memory disclosed in the above Publication comprises a plurality of memory cells $MC_{1M}$ (for example, M=4) ends of which are connected to one end of one transistor for selection $TR_1$ in parallel, and a nonvolatile memory forming a pair with the above nonvolatile memory also comprises a plurality of memory cells $MC_{2M}$ ends of which are connected to one end of one transistor for selection $TR_2$ in parallel. The other ends of the transistors for selection $TR_1$ and $TR_2$ are connected to bit lines $BL_1$ and $BL_2$, respectively. The bit lines $BL_1$ and $BL_2$ forming a pair are connected to a sense amplifier SA. Further, the other ends of the memory cells $MC_{1m}$ and $MC_{2m}$ (m=1, 2 . . . M) are connected to a plate line $PL_m$, and the plate line $PL_m$ is connected to a plate line decoder/driver PD. Further, a word line WL is connected to a word line decoder/driver WD.

Complement data is stored in a pair of the memory cells $MC_{1m}$ and $MC_{2m}$ (m=1, 2 . . . M). For reading out the data stored, for example, in the memory cells $MC_{1m}$ and $MC_{2m}$ (wherein m is one of 1, 2, 3 and 4), the word line WL is selected, and in a state where a voltage of (½) $V_{cc}$ is applied to the plate lines $PL_k$ (k≠m), the plate line $PL_m$ is driven. The above $V_{cc}$ is, for example, a power source voltage. By the above procedure, the complement data appears in a pair of the bit lines $BL_1$ and $BL_2$ as voltages (bit line voltages) from a pair of the memory cells $MC_{1m}$ and $MC_{2m}$ through the transistors for selection $TR_1$ and $TR_2$. And, the sense amplifier SA detects the voltages (bit line voltages) in a pair of the bit lines $BL_1$ and $BL_2$.

A pair of the transistors for selection $TR_1$ and $TR_2$ in a pair of the nonvolatile memories occupy a region surrounded by the word line WL and a pair of the bit lines $BL_1$ and $BL_2$. If the word lines and the bit lines are arranged at a smallest pitch, therefore, a pair of the transistors for selection $TR_1$ and $TR_2$ in a pair of the nonvolatile memories have a minimum area of $8F^2$. Since, however, a pair of the transistors for selection $TR_1$ and $TR_2$ are shared by M sets of pairs of the memory cells $MC_{1m}$ and $MC_{2m}$ (m=1, 2 . . . M), the number of the transistors for selection $TR_1$ and $TR_2$ per bit can be decreased, and the layout of the word lines WL is moderate, so that the nonvolatile memory can be easily decreased in size. Further, with regard to peripheral circuits, M bits can be selected with one word line decoder/driver WD and M plate line decoder/drivers PD. When the above constitution is employed, therefore, the layout in which the cell area is close to $8F^2$ can be attained, and a chip size almost equivalent to a DRAM can be attained.

The method of writing data in the nonvolatile memory disclosed in JP-A-9-121032 will be explained below. The following explanation is based on an assumption that data is written into a pair of the memory cells $MC_{11}$ and $MC_{21}$, that data "1" is written into the memory cell $MC_{11}$ and that data "0" is written into the memory cell $MC_{21}$. FIG. 11 shows a waveform of an operation. In FIG. 11, parenthesized numerals correspond to numbers of steps to be explained below.

(1) In a standby state, the word line and all of the plate lines have 0 volt. Further, the bit lines $BL_1$ and $BL_2$ are equalized to have 0 volt. It is also assumed that data to be written is held in the sense amplifier SA.

(2) When writing of data is started, a high potential $V_{BL-H}$ (=$V_{cc}$) is applied to the bit line $BL_1$, and a low potential $V_{BL-L}$ (=0 volt) is applied to the bit line $BL_2$. The above $V_{cc}$ refers to a power source voltage.

(3) Then, the potential of the word line WL is brought to a high level, thereby to bring the transistors for selection $TR_1$ and $TR_2$ into an ON-state. A high potential $V_{PL-H}$ (=$V_{cc}$) is also applied the selected plate line $PL_1$, and an intermediate potential $V_{PL-M}$ [=(½)$V_{cc}$] is applied to a non-selected plate lines $PL_k$ (k=2, 3, 4). By the above procedures, in the memory cell $MC_{21}$, the potential of the selected plate line $PL_1$ is a high potential $V_{PL-H}$ and the potential of the bit line $BL_2$ is a low potential $V_{BL-L}$, so that data "0" is written.

(4) Then, the potential of the selected plate line $PL_1$ is changed to a low potential $V_{PL-L}$ (=0 volt), whereby, in the memory cell $MC_{11}$, the potential of the selected plate line $PL_1$ is a low potential $V_{PL-L}$ and the potential of the bit line $BL_1$ is a high potential $V_{BL-H}$, so that data "1" is written.

When writing of data is finished, the potential of the word line WL is brought to a low level, thereby to bring the transistors for selection $TR_1$ and $TR_2$ to an OFF-state. Then, the bit line $BL_1$ is discharged to a level of 0 volt, and the non-selected plate lines $PL_k$ (k=2, 3, 4) are discharged to a level of 0 volt.

In the above writing operation, (½) $V_{cc}$ is applied to the non-selected plate lines $PL_k$ (=2, 3, 4). Therefore, a voltage of ±(½) $V_{cc}$ is applied to each of the non-selected memory cells $MC_{1k}$ and $MC_{2k}$ (k=2, 3, 4). In some data stored in the non-selected memory cells $MC_{1k}$ and $MC_{2k}$ (k=2, 3, 4), therefore, an electric field may work on the ferroelectric layers of the memory cells constituting the non-selected memory cells $MC_{1k}$ and $MC_{2k}$ in the direction in which the polarization is inversed, and the data holding state may be deteriorated by disturbance. The disturbance refers to a phenomenon that an electric field works on the ferroelectric layer in the memory cell constituting the non-selected memory cell in the direction in which the polarization is inversed, that is, held data is deteriorated or destroyed.

As measures to be taken against the above disturbance, in the nonvolatile memory disclosed in JP-A-9-121032, the memory cells $MC_{1m}$ and $MC_{2m}$ in the memory unit composed of the memory cells $MC_{1M}$ and the memory cells $MC_{2M}$ are accessed from m=1 to m=M consecutively and collectively. By the above procedures, the number of disturbances that the memory cells $MC_{1m}$ and $MC_{2m}$ suffer is limited to (M−1) times. In this operation, data is written into the memory cells consecutively from the memory cells $MC_{11}$ and $MC_{21}$ in the first place to the memory cells $MC_{M1}$ and $MC_{2M}$ in the M-th place without particularly external addressing. That is, data is written into the memory cells $MC_{11}$ and $MC_{21}$ located in the position of m=1, then, data is written into the memory cells $MC_{12}$ and $MC_{22}$ located in the position of m=2, and this operation is repeated until m=M is reached. In this manner, the number of disturbances that the memory cells $MC_{1m}$ and $MC_{2m}$ suffer is limited to (M−1) times. In reading-out of data and re-writing of data in the memory cells $MC_{1m}$ and $MC_{2m}$, the memory cells $MC_{1m}$ and $MC_{2m}$ are similarly accessed consecutively and collectively from m=1 to m=M.

The method of decreasing the area of the nonvolatile memory, disclosed in JP-A-9-121032, is very effective. However, writing of data, reading-out of data and re-writing of data are consecutively started in the memory cells located in the first place. It is said that reading-out of data and re-writing of data in the memory cells $MC_{1m}$ and $MC_{2m}$ take a time period of approximately 100 nanoseconds. Therefore, reading-out and re-writing of data, for example, in memory cells $MC_{18}$ and $MC_{28}$ located in the eighth place take place approximately 0.8 microseconds after the reading-out and re-writing of data is started. There is therefore involved a problem that reading-out and re-writing of data in a desired memory cell take a time. Further, when writing of data is carried out, data are written into all of the memory cells constituting the memory unit. There is therefore involved a problem that writing of data in a desired memory cell takes a time. With an increase in the number of memory cells constituting the memory unit, the area efficiency improves, but accessing a memory cell comes to be slow on the other hand.

It is therefore an object of the present invention to provide a ferroelectric-type nonvolatile semiconductor memory that permits a prompt access to a desired memory cell while suppressing the influence of disturbance, and an operation method thereof.

DISCLOSURE OF THE INVENTION

The method of operating a ferroelectric-type nonvolatile semiconductor memory, according to a first aspect of the present invention for achieving the above object, is concerned with reading-out of data and is a method of operating a ferroelectric-type nonvolatile semiconductor memory comprising a memory unit having;

(A) a bit line, (B) a transistor for selection, (C) a sub-memory unit composed of memory cells that are M ($M \geq 2$) in number, (D) plate lines that are M in number, and (E) a sense amplifier connected to the bit line, wherein each memory cell comprises a first electrode, a ferroelectric layer and a second electrode, the first electrodes of the memory cells constituting the sub-memory unit are in common with the sub-memory unit, said common first electrode is connected to the bit line through the transistor for selection, and each second electrode is connected to each plate line, said method comprising reading out data stored in the memory cell at a designated address externally designated, latching said data in the sense amplifier, and then outputting said data latched in the sense amplifier.

In explanations to be given hereinafter, the memory cell at the designated address will be denoted as $MC_J$ ($1 \leq J \leq M$), and other memory cell constituting the sub-memory unit (memory cell other than the memory cell at the designated address) will be denoted as $MC_k$ ($k \neq J$).

In the method of operating a ferroelectric-type nonvolatile semiconductor memory according to the first aspect of the present invention (to be referred to as "nonvolatile memory operation method according to the first aspect of the present invention" hereinafter), there may be employed a constitution in which, after said data latched in the sense amplifier is outputted, said data latched in the sense amplifier is re-written into said memory cell $MC_J$ at said designated address, and then data stored in other memory cell $MC_k$ constituting the sub-memory unit is read out without external addressing and is latched in the sense amplifier.

In the above case, further, there may be employed a constitution in which, after the data stored in other memory cell $MC_k$ constituting the sub-memory unit is read out and latched in the sense amplifier, said data latched in the sense amplifier is re-written into said other memory cell $MC_k$. The above constitution will be referred to as "No. 1A constitution" for convenience. In the No. 1A constitution, the memory cells are accessed in a so-called random access manner, to read out and re-write data. In this case, desirably, reading-out and re-writing of the data are carried out consecutively in all other memory cells constituting the sub-memory unit without external addressing [that is, consecutively in the order of the memory cell $MC_{J+1}$ in the (J+1)-th place, the memory cell $MC_{J+2}$ in the (J+2)-th place ... the memory cell $MC_M$ in the M-th place, the memory cell $MC_1$ in the first place, the memory cell $MC_2$ in the second place ... the memory cell $MC_{J-2}$ in the (J-2)-th place and the memory cell $MC_{J-1}$ in the (J-1)-th place]. In this manner, the disturbance in other memory cells $MC_k$ can be reliably prevented.

Alternatively, in the above case, there may be employed a constitution in which, after the data stored in other memory cell $MC_k$ constituting the sub-memory unit is read out and latched in the sense amplifier, said data latched in the sense amplifier is outputted. There may be further employed a constitution in which, after the data stored in other memory cell $MC_k$ constituting the sub-memory unit is read out and latched in the sense amplifier, said data latched in the sense amplifier is outputted, and then, said data latched in the sense amplifier is re-written into said other memory cell $MC_k$. The above constitution will be referred to as "No. 1B constitution". In this No. 1B constitution, the memory cells are accessed in a so-called sequential access manner, to read out, output and re-write data. In this case, desirably, reading-out, outputting and re-writing of the data are carried out consecutively in all other memory cells constituting the sub-memory unit without external addressing [that is, consecutively in the order of the memory cell $MC_{J+1}$ in the (J+1)-th place, the memory cell $MC_{J+2}$ in the (J+2)-th place ... the memory cell $MC_M$ in the M-th place, the memory cell $MC_1$ in the first place, the memory cell $MC_2$ in the second place ... the memory cell $MC_{J-2}$ in the (J-2)-th place and the memory cell $MC_{J-1}$ in the (J-1)-th place]. In this manner, the disturbance in other memory cells $MC_k$ can be reliably prevented.

In the nonvolatile memory operation method according to the first aspect of the present invention, the No. 1A constitution and the No. 1B constitution may be combined. That is, there may be employed a constitution in which the operation method of the No. 1B constitution is carried out consecutively with regard to a predetermined number of memory cells starting in the memory cell $MC_{J+1}$ in the (J+1)-th place, and the operation method of the No. 1A constitution is carried out with regard to the remaining other memory cells. There may be also employed a constitution in which the operation method of the No. 1A constitution is carried out with regard to a predetermined number of memory cells starting in the memory cell $MC_{J+1}$ in the (J+1)-th place, and then the operation method of the No. 1B constitution is carried out with regard to the remaining other memory cells.

The method of operating a ferroelectric-type nonvolatile semiconductor memory, according to a second aspect of the present invention for achieving the above object, is concerned with writing of data and is a method of operating a ferroelectric-type nonvolatile semiconductor memory comprising a memory unit having;

(A) a bit line, (B) a transistor for selection, (C) a sub-memory unit composed of memory cells that are M ($M \geq 2$) in number, (D) plate lines that are M in number, and (E) a sense amplifier connected to the bit line, wherein each memory cell comprises a first electrode, a ferroelectric layer and a second electrode, the first electrodes of the memory cells constituting the sub-memory unit are in common with the sub-memory unit, said common first electrode is connected to the bit line through the transistor for selection, and each second electrode is connected to each plate line, said method comprising latching, in the sense amplifier, data to be written and writing said latched data into the memory cell at a designated address externally designated.

In the method of operating a ferroelectric-type nonvolatile semiconductor memory according to the second aspect of the present invention (to be referred to as "nonvolatile memory operation method according to the second aspect of the present invention" hereinafter), there may be employed a constitution in which, after said data latched in the sense amplifier is written into the memory cell $MC_J$ at said designated address, data to be written is latched in the sense amplifier and then written into other memory cell $MC_k$ constituting the sub-memory unit without external addressing. The above constitution will be referred to as a No. 2A constitution for convenience. In the No. 2A constitution, data are written into all the memory cells constituting the sub-memory unit. In this case, preferably, writing of the data is carried out consecutively in all other memory cells constituting the sub-memory unit without external addressing [that is, consecutively in the order of the memory cell $MC_{J+1}$ in the (J+1)-th place, the memory cell $MC_{J+2}$ in the (J+2)-th place ... the memory cell $MC_M$ in the M-th place, the memory cell $MC_1$ in the first place, the memory cell $MC_2$ in the second place ... the memory cell $MC_{J-2}$ in the (J-2)-th place and the memory cell $MC_{J-1}$ in the (J-1)-th place].

Alternatively, in the nonvolatile memory operation method according to the second aspect of the present invention, there may be employed a constitution in which, after said data latched in the sense amplifier is written into said memory cell $MC_J$ at said designated address, data stored in other memory cell $MC_k$ constituting the sub-memory unit is read out without external addressing, latched in the sense amplifier and then re-written into said other memory cell $MC_k$. The above constitution will be referred to as a No. 2B constitution for convenience. In the No. 2B constitution, data is written only into the memory cell $MC_J$ at the designated address, and, in other memory cell $MC_k$, reading-out and re-writing of data are carried out. In this case, preferably, reading-out and re-writing of data are carried out consecutively in all other memory cells $MC_M$ constituting the sub-memory unit without external addressing [that is, consecutively in the order of the memory cell $MC_{J+1}$ in the (J+1)-th place, the memory cell $MC_{J+2}$ in the (J+2)-th place ... the memory cell $MC_M$ in the M-th place, the memory cell $MC_1$ in the first place, the memory cell $MC_2$ in the second place ... the memory cell $MC_{J-2}$ in the (J-2)-th place and the memory cell $MC_{J-1}$ in the (J-1)-th place]. In this manner, the disturbance in other memory cells $MC_k$ can be reliably prevented.

In the nonvolatile memory operation method according to the second aspect of the present invention, the No. 2A constitution and the No. 2B constitution may be combined. That is, there may be employed a constitution in which the operation method of the No. 2B constitution is carried out consecutively with regard to a predetermined number of memory cells starting in the memory cell $MC_{J+1}$ in the (J+1)-th place, and then the operation method of the No. 2A constitution is carried out with regard to the remaining other memory cells. There is also employed a constitution in which the operation method of the No. 2A constitution is carried out with regard to a predetermined number of memory cells starting in the memory cell $MC_{J+1}$ in the (J+1)-th place, and the operation method of the No. 2B constitution is carried out with regard to the remaining other memory cells.

A ferroelectric-type nonvolatile semiconductor memory of the present invention for achieving the above object comprises a memory unit having;

(A) a bit line, (B) a transistor for selection, (C) a sub-memory unit composed of memory cells that are M ($M \geq 2$) in number, (D) plate lines that are M in number, and (E) a sense amplifier connected to the bit line, wherein each memory cell comprises a first electrode, a ferroelectric layer and a second electrode, the first electrodes of the memory cells constituting the sub-memory unit are in common with the sub-memory unit, said common first electrode is connected to the bit line through the transistor for selection, and each second electrode is connected to each plate line, said ferroelectric-type nonvolatile semiconductor memory further comprising;

(F) a designated-plate-line address register for storing a plate-line address externally designated, and (G) a plate-line address counter for consecutively incrementing a plate-line address which designates the plate line.

Preferably, the ferroelectric-type nonvolatile semiconductor memory of the present invention (to be sometimes referred to as "nonvolatile memory of the present invention" hereinafter) further comprises a comparator that is connected to the designated-plate-line address register and the plate-line address counter and is for comparing a value of a designated plate-line address stored in the designated-plate-line address register and a value of a plate-line address in the plate-line address counter.

The nonvolatile memory in the nonvolatile memory operation method according to the first or second aspect of the present invention may be a nonvolatile memory comprising a first memory unit and a second memory unit;

said first memory unit having;

(A-1) a first bit line, (B-1) first transistor(s) for selection that are N ($N \geq 1$) in number, (C-1) first sub-memory unit(s) that are N in number, each of which is composed of first memory cells that are M ($M \geq 2$) in number, and (D-1) plate lines that are M in number, each plate line being shared with each first memory cell constituting the sub-memory unit(s) that are N in number, and said second memory unit having;

(A-2) a second bit line, (B-2) second transistor(s) for selection that are N in number, (C-2) second sub-memory unit(s) that are N in number, each of which is composed of second memory cells that are M ($M \geq 2$) in number, and (D-2) the plate lines that are M in number, each plate line being shared with each second memory cell constituting the sub-memory unit(s) that are N in number, said plate lines being shared with the plate lines that are M in number and constitute said first memory unit, and said nonvolatile memory further comprising;

(E) a sense amplifier connected to the first and second bit lines, wherein each memory cell comprises a first electrode, a ferroelectric layer and a second electrode, wherein, in the first memory unit, the first electrodes of the first memory cells constituting the first sub-memory unit in the n-th place (n=1, 2 ... N) are in common with the n-th place first sub-memory unit, said common first electrode is connected to the first bit line through the n-th place first transistor for selection, and each second electrode is connected to each shared plate line, and further wherein, in the second memory unit, the first electrodes of the second memory cells constituting the n-th place second sub-memory unit are in common with the n-th place second sub-memory unit, said common first electrode is connected to the second bit line through the n-th place second transistor for selection, and each second electrode is connected to each shared plate line.

In the nonvolatile memory of the present invention, the memory unit may be constituted of the above two memory units (first memory unit and second memory unit) as well.

In the above constitution in the operation method according to the first aspect of the present invention, the following constitution may be employed. When data stored in the first memory cell is read out, the first transistor for selection is brought into an ON-state, the second transistor for selection is brought into an OFF-state and a reference potential is applied to the second bit line, and when data stored in the second memory cell is read out, the second transistor for selection is brought into an ON-state, the first transistor for selection is brought into an OFF-state and a reference potential is applied to the first bit line.

The operation method according to the first aspect of the present invention may employ a constitution in which the m-th place first memory cell (m=1, 2 ... M) constituting the n-th place first sub-memory unit and the m-th place second memory cell constituting the n-th place second sub-memory unit are formed as a pair, and complement data is read out from them.

In the above constitution in the operation method according to the second aspect of the present invention, the following constitution may be employed. When data is written into the first memory cell, the first transistor for selection is brought into an ON-state and the second transistor for selection is brought into an OFF-state, and when data is written into the second memory cell, the second transistor for selection is brought into an ON-state and the first transistor for selection is brought into an OFF-state.

The operation method according to the second aspect of the present invention may employ a constitution in which the m-th place first memory cell (m=1, 2 ... M) constituting the n-th place first sub-memory unit and the m-th place second memory cell constituting the n-th place second sub-memory unit are formed as a pair, and complement data is written into them.

In the nonvolatile memory or in the nonvolatile memory for the operation method, provided by the present invention (these will be sometimes simply generically referred to as "the present invention" hereinafter), for accomplishing a further higher integration degree, there may be employed a constitution in which nonvolatile memories are stacked or there may be employed a constitution in which the first memory unit constituting the nonvolatile memory and the first memory unit constituting the nonvolatile memory contiguous to the above nonvolatile memory in the extending direction of the first bit line are stacked through an insulating interlayer, and the second memory unit constituting the nonvolatile memory and the second memory unit constituting the nonvolatile memory contiguous to the above nonvolatile memory in the extending direction of the second bit line are stacked through the insulating interlayer. Alternatively, there may be also employed a constitution in which the first sub-memory units constituting the first memory unit are stacked one on another (each on the other) through an insulating interlayer and the second sub-memory units constituting the second memory unit are stacked one on another (each on the other) through the insulating interlayer. Alternatively, there may be also employed a constitution in which the first sub-memory units constituting the first memory unit and the second sub-memory units constituting the second memory unit are stacked one on another through an insulating interlayer.

In the present invention, it is sufficient to satisfy M≧2, and the actual value of M includes exponents of 2 (2, 4, 8, 16, 32 ... ). Further, it is sufficient to satisfy N≧1, and the actual value of N includes exponents of 2 (1, 2, 4, 8 ... ).

The material for constituting the ferroelectric layer in the present invention includes bismuth layer compounds, more specifically, a Bi-containing layer-structured perovskite-type ferroelectric material. The Bi-containing layer-structured perovskite-type ferroelectric material comes under so-called non-stoichiometric compounds, and shows tolerance of compositional deviations in both sites of a metal element and anions (O, etc.). Further, it is not a rare case that the above material having a composition deviated from its stoichiometric composition to some extent exhibits optimum electric characteristics. The Bi-containing layer-structured perovskite-type ferroelectric material can be expressed, for example, by the general formula, $$(Bi_2O_2)^{2+}(A_{m-1}B_mO_{3m+1})^{2-}$$

wherein "A" is one metal selected from the group consisting of metals such as Bi, Pb, Ba, Sr, Ca, Na, K, Cd, etc., and "B" is one metal selected from the group consisting of Ti, Nb, Ta, W, Mo, Fe, Co and Cr or a combination of a plurality of these metals combined in any amount ratio, and m is an integer of 1 or more.

Alternatively, the material for constituting the ferroelectric layer preferably contains, as a main crystal phase, a crystal phase represented by the formula (1), $$(Bi_x, Sr_{1-x})_2(Sr_y, Bi_{1-y})(Ta_z, Nb_{1-z})_2O_d \qquad (1)$$

wherein 0.9≦X≦1.0, 0.7≦Y≦1.0, 0≦Z≦1.0, and 8.7≦d≦9.3.

Otherwise, the material for constituting the ferroelectric layer preferably contains, as a main crystal phase, a crystal phase represented by the formula (2), $$Bi_xSr_yTa_2O_d \qquad (2)$$

wherein X+Y=3, 0.7≦Y≦1.3 and 8.7≦d≦9.3.

In the above case, more preferably, the material for constituting the ferroelectric layer preferably contains, as a main crystal phase, at least 85% of a crystal phase represented by the formula (1) or (2). In the above formula (1), $(Bi_x, Sr_{1-x})$ means that Sr occupies the site that Bi should have occupied in a crystal structure and that the Bi:Sr amount ratio is X:(1-X). Further, $(Sr_y, Bi_{1-y})$ means that Bi occupies the site that Sr should have occupied in a crystal structure and that the Sr:Bi amount ratio is Y:(1-Y). The material for constituting the ferroelectric layer and containing, as a main crystal phase, the crystal phase of the above formula (1) or (2), may contain an oxide of Bi, oxides of Ta and Nb and composite oxides of Bi, Ta and Nb to some extent.

Alternatively, the material for constituting the ferroelectric layer may contain a crystal phase represented by the formula (3), $$Bi_x(Sr, Ca, Ba)_y(Ta_z, Nb_{1-z})_2O_d \qquad (3)$$

wherein $1.7 \leq X \leq 2.5$, $0.6 \leq Y \leq 1.2$, $0 \leq Z \leq 1.0$ and $8.0 \leq d \leq 10.0$. (Sr, Ca, Ba) stands for one element selected from the group consisting of Sr, Ca and Ba. When the above material for the ferroelectric layer, having the above formulae, is expressed by a stoichiometric composition, the composition includes $Bi_2SrTa_2O_9$, $Bi_2SrNb_2O_9$, $Bi_2BaTa_2O_9$ and $Bi_2SrTaNbO_9$. Otherwise, the material for constituting the ferroelectric layer also includes $Bi_4SrTi_4O_{15}$, $Bi_4Ti_3O_{12}$ and $Bi_2PbTa_2O_9$. In these cases, the amount ratio of the metal elements may be varied to such an extent that the crystal structure does not change. That is, the above material may have a composition deviated from its stoichiometric composition in both sites of metal elements and oxygen element.

Further, the material for constituting the ferroelectric layer includes $PbTiO_3$, lead titanate zirconate [PZT, $Pb(Zr_{1-y}, Ti_y)O_3$ wherein $0<y<1$] which is a solid solution of $PbZrO_3$ and $PbTiO_3$ having a perovskite structure, and PZT-containing compounds such as PLZT which is a metal oxide prepared by adding La to PZT and PNZT which is a metal oxide prepared by adding Nb to PZT.

For forming the ferroelectric layer, a ferroelectric thin film is formed, and in a step to come thereafter, the ferroelectric thin film is patterned. In some cases, it is not required to pattern the ferroelectric thin film. The ferroelectric thin film can be formed by a method suitable for a material that is used to constitute the ferroelectric thin film, such as an MOCVD method, a pulse laser abrasion method, a sputtering method, a sol-gel method, an MOD (metal organic decomposition) method using a bismuth organic metal compound (bismuth alkoxide compound) having a bismuth-oxygen bond as a raw material, and an LSMCD (liquid source mist chemical deposition) method. Further, the ferroelectric thin film can be patterned, for example, by an anisotropic ion etching (RIE) method.

In the present invention, the material for constituting the first electrode and second electrode includes, for example, Ir, $IrO_{2-x}$, $SrIrO_3$, Ru, $RuO_{2-x}$, $SrRuO_3$, Pt, $Pt/IrO_{2-x}$, $Pt/RuO_{2-x}$, Pd, a Pt/Ti stacked structure, a Pt/Ta stacked structure, a Pt/Ti/Ta stacked structure, $La_{0.5}Sr_{0.5}CoO_3$ (LSCO), a Pt/LSCO stacked structure and $YBa_2Cu_3O_7$. The value of the above X is in the range of $0 \leq X < 2$. In the above stacked structures, a material described before "/" constitutes the upper layer, and a material described after "/" constitutes the lower layer. The first electrode and the second electrode may be constituted of one material, materials of the same kind or materials of different kinds. For forming the first electrode or the second electrode, a first electrode material layer or a second electrode material layer is formed, and in a step to come thereafter, the first electrode material layer or the second electrode material layer is patterned. The first electrode material layer or the second electrode material layer can be formed by a method properly suitable for the materials for constituting the first electrode material layer or the second electrode material layer, such as a sputtering method, a reactive sputtering method, an electron beam deposition method, an MOCVD method and a pulse laser abrasion method. The first electrode material layer or the second electrode material layer can be patterned, for example, by an ion milling method or an RIE method.

In the present invention, the material for constituting the insulating interlayer includes silicon oxide ($SiO_2$), silicon nitride (SiN), SiON, SOG, NSG, BPSG, PSG, BSG and LTO.

In the nonvolatile memory of the present invention, there may be employed a constitution in which the first electrode is formed below the ferroelectric layer and the second electrode is formed on the ferroelectric layer (that is, the first electrode corresponds to the lower electrode and the second electrode corresponds to the upper electrode), or there may be employed a constitution in which the first electrode is formed on the ferroelectric layer and the second electrode is formed below the ferroelectric layer (that is, the first electrode corresponds to the upper electrode and the second electrode corresponds to the lower electrode). There may be employed a constitution in which the plate line extends from the second electrode, or the plate line is formed separately from the second electrode and is connected to the second electrode. In the latter case, the wiring material for constituting the plate line includes, for example, aluminum and an aluminum-containing alloy. The structure in which the first electrodes are in common specifically includes a structure in which the first electrode in the form of stripes is formed and the ferroelectric layer is formed on the entire surface of the striped first electrode. In the above structure, an overlapping region of the first electrode, the ferroelectric layer and the second electrode corresponds to a memory cell. The structure in which the first electrodes are in common includes a structure in which the ferroelectric layers are formed on predetermined regions of the first electrode and the second electrodes are formed on the ferroelectric layers, and a structure in which the first electrodes are formed in predetermined surface regions of a wiring layer, the ferroelectric layers are formed on the first electrodes and the second electrodes are formed on the ferroelectric layers, although the above structure shall not be limited thereto.

The transistor for selection (transistor for switching) can be constituted, for example, of a known MIS type FET or a MOS type FET. The material for constituting the bit line includes an impurity-doped polysilicon and a refractory metal material. The common first electrode and the transistor for selection can be electrically connected through a contact hole made in an insulating layer formed between the common first electrode and the transistor for selection or through a contact hole made in the insulating layer and a wiring layer formed on the insulating layer. The material for constituting the insulating layer includes silicon oxide ($SiO_2$), silicon nitride (SiN), SiON, SOG, NSG, BPSG, PSG, BSG and LTO.

For the sense amplifier, a known latch circuit can be employed, and for the designated-plate-line address register, the plate-line address counter and the comparator, a known register, counter and comparator can be employed.

In the nonvolatile memory operation method according to the first aspect of the present invention, data stored in a memory cell at a designated address externally designated is read out and latched in the sense amplifier, and then said data latched in the sense amplifier is outputted. In the nonvolatile memory operation method according to.the second aspect of the present invention, data to be written is latched in the sense amplifier, and then, said data is written into a memory cell at a designated address externally designated. Therefore, a desired memory cell can be accessed promptly. In the Nos. 1A, 1B, 2A and 2B constitutions of the present invention, data are written or re-written into other memory cells, so that the disturbance in the other memory cells can be reliably suppressed.

BRIEF DESCRIPTION OF DRAWINGS

The present invention will be explained on the basis of Examples with reference to drawings.

BEST MODE FOR CARRYING OUT THE INVENTION

EXAMPLE 1

Figure 1:
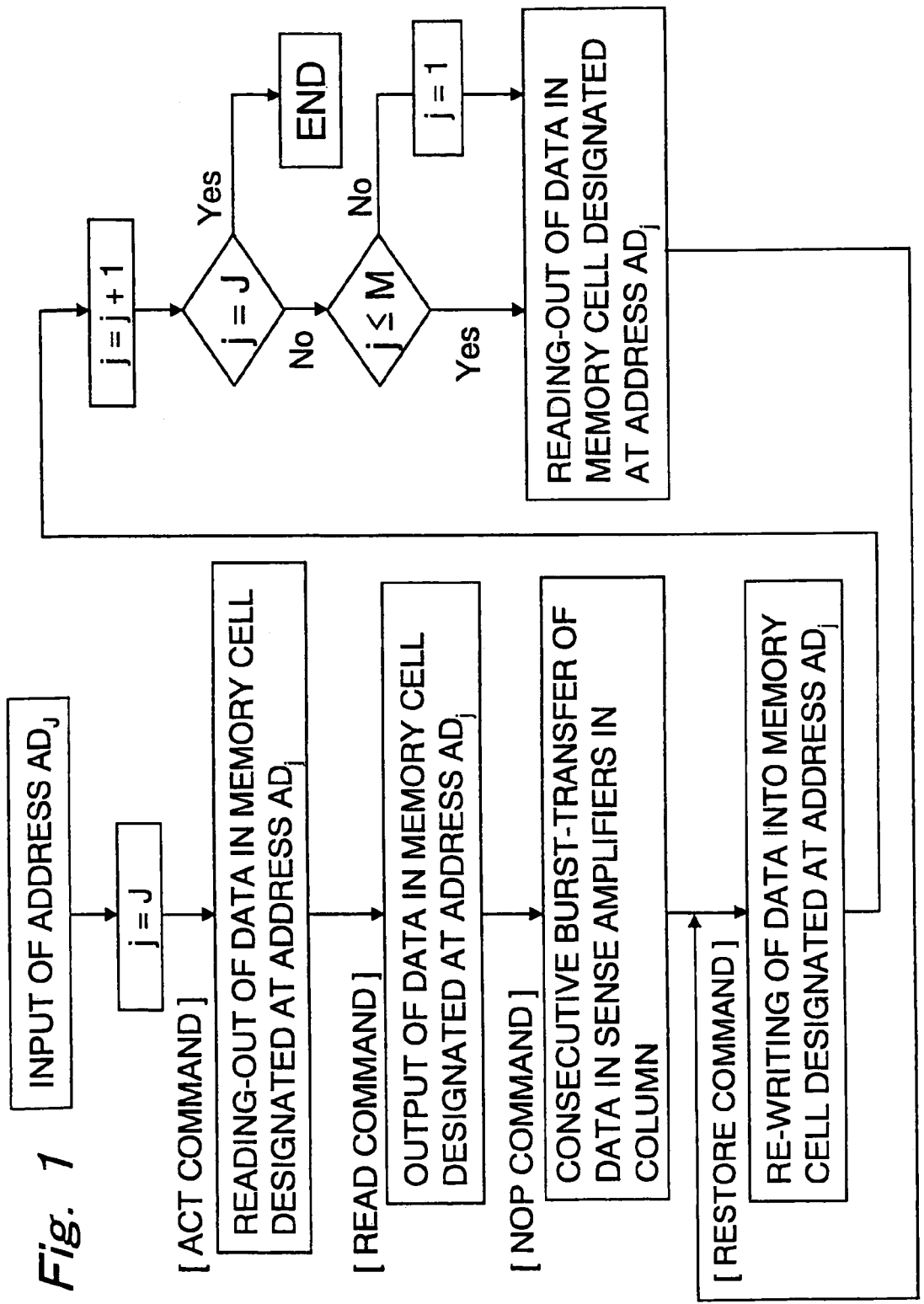
FIG. 1 is a flow chart of an operation method of a ferroelectric-type nonvolatile semiconductor memory in Example 1.
Figure 5:
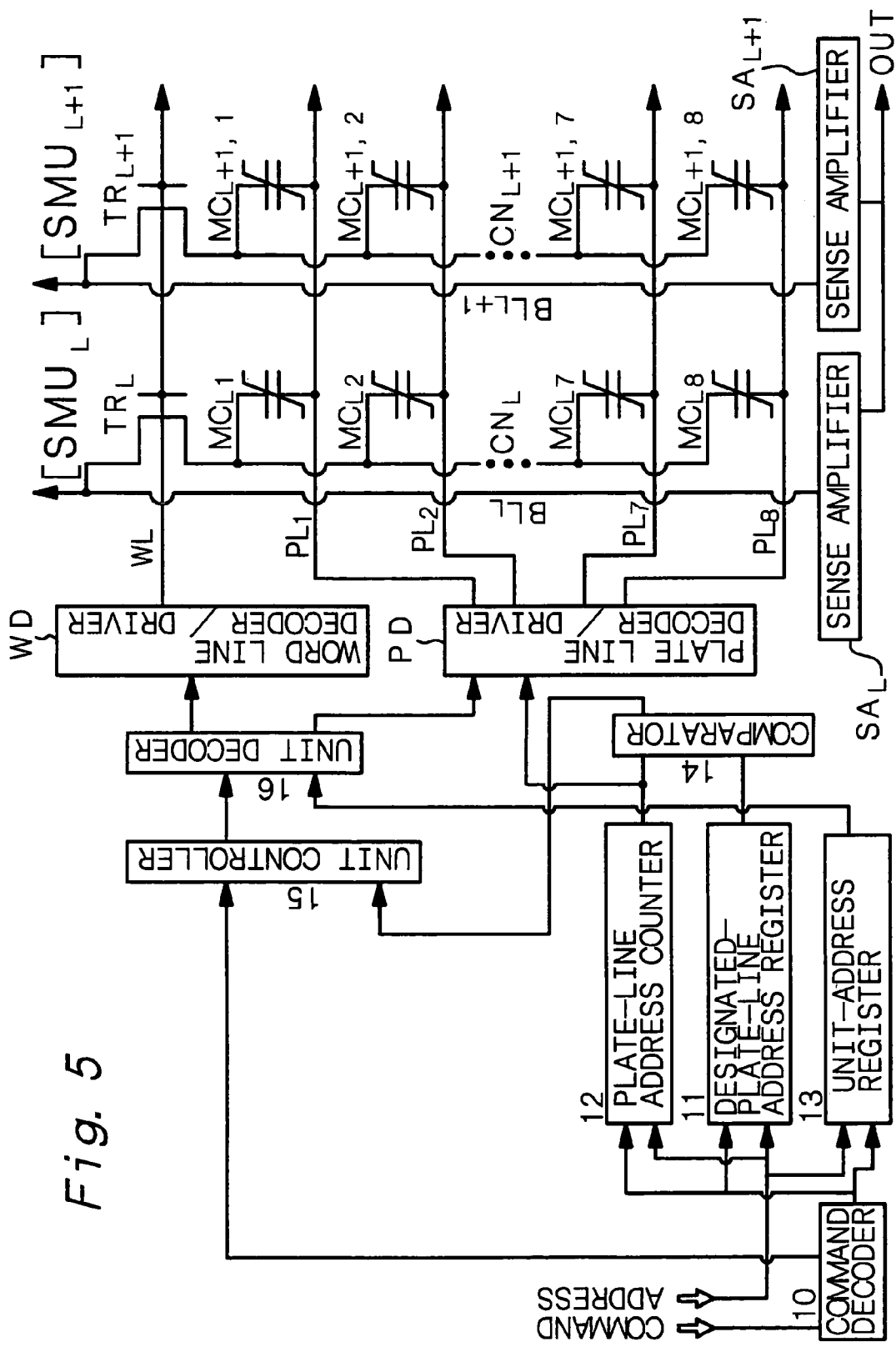
FIG. 5 is an equivalent circuit diagram of a ferroelectric-type nonvolatile semiconductor memory in Example 1.

Example 1 is concerned with the nonvolatile memory operation method according to the first aspect of the present invention and the nonvolatile memory of the present invention, more specifically, concerned with the nonvolatile memory operation method according to the No. 1A constitution. FIG. 1 shows a flow chart of the nonvolatile memory operation method of a nonvolatile memory in Example 1. FIG. 5 shows an equivalent circuit diagram of the nonvolatile memory in Example 1, and FIG. 6 shows a schematic partial cross-sectional view of a memory unit.

Figure 6:
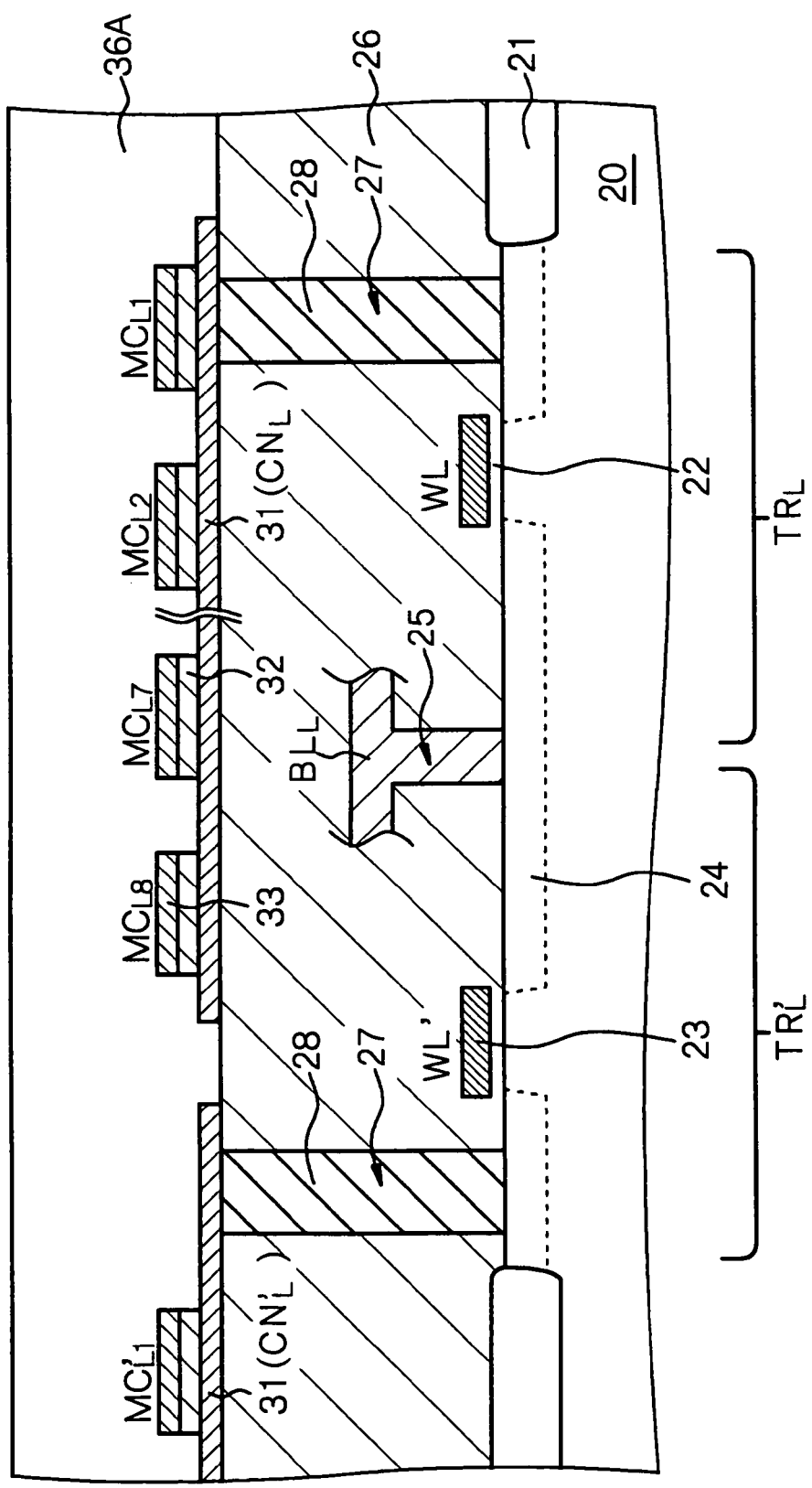
FIG. 6 is a schematic partial cross-sectional view of a memory unit of the ferroelectric-type nonvolatile semiconductor memory in Example 1.

The nonvolatile memory shown in FIGS. 5 and 6 comprises a memory unit having (A) a bit line $BL_L$, (B) a transistor for selection $TR_L$, (C) a sub-memory unit $SMU_L$ composed of memory cells $MC_{LM}$ that are M ($M \geq 2$, M=8 in Example 1) in number, (D) plate lines $PL_M$ that are M (M=8 in Example 1) in number, and (E) a sense amplifier $SA_L$ connected to the bit line $BL_L$. FIG. 5 also shows a sub-memory unit $SMU_{L+1}$ that is contiguous to the sub-memory unit $SMU_L$ and shares a word line WL and the plate lines $PL_M$.

Each memory cell $MC_{Lm}$ comprises a first electrode 31 (lower electrode), a ferroelectric layer 32 and a second electrode 33 (upper electrode). The first electrodes 31 of the memory cells $MC_{Lm}$ constituting the sub-memory unit $SMU_L$ are in common with the sub-memory unit $SMU_L$. The common first electrode 31 (to be called "common node $CN_L$") is connected to the bit line $BL_L$ through the transistor for selection $TR_L$, and each second electrode 33 is connected to each plate line $PL_m$.

Further, the above nonvolatile memory has a designated-plate-line address register 11 for storing a plate-line address externally designated, a plate-line address counter 12 for consecutively incrementing a plate-line address which designates the plate line, and a comparator 14. The comparator 14 is connected to the designated-plate-line address register 11 and the plate-line address counter 12 and is for comparing a value of a designated plate-line address stored in the designated-plate-line address register 11 and a value of a plate-line address in the plate-line address counter 12. The designated-plate-line address register 11 is constituted of a known register, the plate-line address counter 12 is constituted of a known 2-bit cyclic counter, and the comparator 14 is constituted of a known comparator.

The above nonvolatile memory further comprises a command decoder 10 for receiving and decoding an external command, a unit-address register 13, a unit controller 15, a unit decoder 16, a word line decoder/driver WD and a plate line decoder/driver PD. The command decoder 10 is connected to the unit controller 15, the designated-plate-line address register 11, the plate-line address counter 12 and the unit-address register 13. The unit-address register 13 is connected to the unit decoder 16. Further, the plate-line address counter 12 is connected to the plate line decoder/driver PD, the comparator 14 is connected to the unit controller 15, the unit controller 15 is connected to the unit decoder 16, and the unit decoder 16 is connected to the word line decoder/driver WD and the plate line decoder/driver PD. The word line WL is connected to the word line decoder/driver WD, and the plate lines $PL_m$ that are M in number are connected to the plate line decoder/driver PD. These components can be constituted of known circuits.

FIG. 6 shows the transistor for selection $TR_L$ and the memory cells $MC_{Lm}$ together with parts of a transistor for selection $TR'_L$ and memory cells $MC'_{Lm}$ that are contiguous in the extending direction of the bit line $BL_L$. The bit line $BL_L$ is shared with the memory cells $MC_{Lm}$, $MC'_{Lm}$ . . . contiguous in the extending direction of the bit line $BL_L$.

In the nonvolatile memory operation method in Example 1, a memory cell at a designated address J ($1 \leq J \leq M$) that is externally designated will be denoted as a memory cell $MC_{LJ}$. An address-designated sub-memory unit will be denoted as a sub-memory unit $SMU_L$. In Example 1, data stored in the memory cell $MC_{LJ}$ at an address externally designated is read out and latched in the sense amplifier $SA_L$, and then, the data latched in the sense amplifier $SA_L$ is outputted to an outside.

In Example 1, further, after the data latched in the sense amplifier $SA_L$ is outputted, the data latched in the sense amplifier $SA_L$ is re-written into the memory cell $MC_{LJ}$ at the address externally designated. Then, data stored in other memory cell $MC_{Lk}$ ($k \neq J$) constituting the sub-memory unit $SMU_L$ is read out without external addressing (without externally designating any address) and latched in the sense amplifier $SA_L$. Then, the data latched in the sense amplifier $SA_L$ is re-written into the other memory cell $MC_{Lk}$. In Example 1, the memory cells are accessed in a so-called random access manner, to read out and re-write data.

Figure 7:
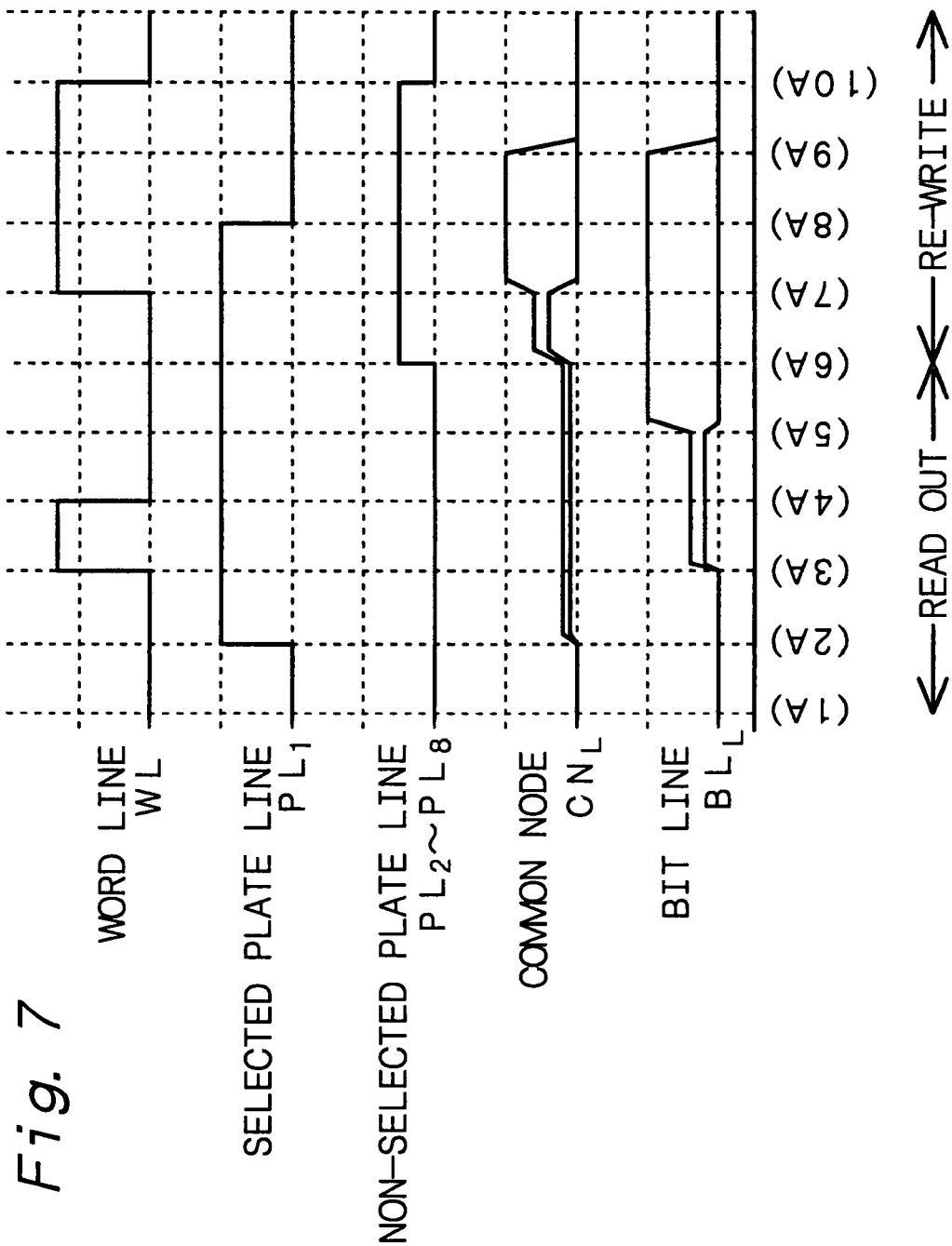
FIG. 7 is a diagram for showing waveforms in operations of reading-out and re-writing of data in the ferroelectric-type nonvolatile semiconductor memory in Example 1.

The operation method in Example 1 will be explained hereinafter with reference to FIGS. 1 and 5 and FIG. 7 showing operation waveforms. Commands and executed contents in the following explanation are as follows. Each command is inputted synchronously with a clock and determined by a combination of "0" and "1" to be inputted to a plurality of predetermined input pins of an integrated circuit constituting the command decoder 10. The address includes an RAS address for selecting a sub-memory unit and a plate line (and further, a memory cell constituting the sub-memory unit) in the row direction, and a CAS address for selecting a sense amplifier in the column direction, and these addresses are selected and used depending upon each command.

ACT command . . . a command for reading out data from a memory cell $MC_j$ designated at an address $AD_j$ ($1 \leq j \leq M$) which is a higher component of the RAS address and allowing the sense amplifier to latch the data.

RAS_INC command . . . a command for re-writing data latched in the sense amplifier into the memory cell $MC_j$ designated at the address $AD_j$ ($1 \leq j \leq M$) which is a higher component of the RAS address, then incrementing the address, reading out data stored in the memory cell at the incremented address and allowing the sense amplifier to latch the data. Data is outputted by executing READ command, and data is (re-)written by executing WRITE command thereafter.

READ command . . . a command for outputting data corresponding to the CAS address inputted concurrently with the command, from a data group latched in the sense amplifier, to an outside. This command is inputted after ACT command or RAS_INC command.

RESTORE command . . . a command for (re-)writing the data latched in the sense amplifier into the memory cell $MC_j$ designated at the address $AD_j$, then, incrementing the address, reading out data in the memory cell at the incremented address, and allowing the sense amplifier to latch the data.

WRITE command . . . a command for allowing a desired sense amplifier to latch data from an outside according to the CAS address. This command is inputted after ACT command or RAS_INC command, and data in the selected sense amplifier is updated. Data that has been read out is retained in a non-selected sense amplifier.

NOP command . . . NO OPERATION command for advancing a clock when the execution of a previously inputted command is not finished in 1 clock. Further, this command is also usable for burst transfer. That is, after READ command, data in each sense amplifier is consecutively burst-outputted while incrementing the CAS address. After WRITE command, data is burst-written into each sense amplifier while incrementing the CAS address.

[Step-100]

First, ACT command is inputted to the command decoder 10, and an address (RAS address) which designates a sub-memory unit and a memory cell is inputted together. The RAS address is separated to a higher component and a lower component with a shift register (not shown). The higher component for designating an address $AD_J$ of a memory cell $MC_{LJ}$ is latched in the designated-plate-line address register 11 and the plate-line address counter 12. On the other hand, the lower component for designating an address of a sub-memory unit $SMU_L$ is latched in the unit-address register 13. The higher component for designating the address of the memory cell $MC_J$, which is latched in the designated-plate-line address register 11, will be referred to as an address "J", the higher component for designating the address of the memory cell $MC_J$, which is latched in the plate-line address counter 12, will be referred to as an address "j" (=J), and the lower component for designating a sub-memory unit $SMU_L$, which is latched in the unit-address register 13, will be referred to as an address "L".

Further, upon receipt of a signal from the command decoder 10, the unit controller 15 transmits a signal to the unit decoder 16 to activate the unit decoder 16. In addition, upon receipt of a signal from the unit-address register 13, the unit decoder 16 selects the sub-memory unit $SMU_L$. On the other hand, a signal from the plate-line address counter 12 is transmitted to the plate line decoder/driver PD. By the above operation, the word line decoder/driver WD and the plate line decoder/driver PD are activated, and the plate line $PL_J$ is selected by the plate line decoder/drive PD.

[Step-110]

And, data stored in the memory cell $MC_{Lj}$ designated at the address $AD_j$ (specifically, the memory cell $MC_{LJ}$) is read out and latched in the sense amplifier SA. A specific operation will be explained later.

In the above steps, a plurality of sub-memory units and memory cells connected to one word line and one plate line may be selected. That is, memory cells $MC_{L,J}$, $MC_{L+1,J}$, $MC_{L+2,J}$ . . . in sub-memory units $SMU_L$, $SMU_{L+1}$, $SMU_{L+2}$ . . . may be selected. By the above operation, data in the memory cells $MC_{L,J}$, $MC_{L+1,J}$, $MC_{L+2,J}$ . . . are latched in the sense amplifiers $SA_L$, $SA_{L+1}$, $SA_{L+2}$ . . . .

[Step-120]

Then, READ command is inputted to the command decoder 10, and the CAS address for designating the sense amplifier $SA_L$ is also inputted together. According to the above command and the CAS address, an instruction is transmitted to the sense amplifier $SA_L$ through a line (not shown), and the data latched in the sense amplifier $SA_L$ is outputted to an outside.

[Step-130]

When the data for the memory cells $MC_{L+1,J}$, $MC_{L+2,J}$ . . . are latched in the sense amplifiers $SA_{L+1}$, $SA_{L+2}$ . . . , then, NOP command is inputted, whereby data latched in these sense amplifiers are consecutively burst-transferred with a counter (not shown). An access between these sense amplifiers and an outside can be made by an access method completely similar to a method in a conventional synchronous DRAM, etc., although it is not shown.

[Step-140]

After completion of date output to an outside, RESTORE command is inputted. By this operation, first, the data latched in the sense amplifer $SA_L$ is re-written into the memory cell $MC_{Lj}$ at the designated address (which is, specifically, the memory cell $MC_{L,J}$). The specific operation thereof will be described later. In reality, RESTORE command is not completed in 1 clock, so that NOP command for advancing a clock is executed.

Then, the data stored in other memory cell $MC_{Lk}$ (k≠J) constituting the sub-memory unit $SMU_L$ is read out without external addressing (without externally designating any address), and latched in the sense amplifier $SA_L$. And, the data latched in the sense amplifier $SA_L$ is re-written into the other memory cell $MC_{Lk}$. Specifically, the plate-line address counter 12 is incremented, the value of the plate-line address counter 12 and the value of the designated-plate-line address register 11 are compared, and if the values are the same, the operation is finished. If the values are not the same, it is judged whether or not the value of the plate-line address counter 12 is over the value of "M". If it is over the value of "M", the value of the plate-line address counter 12 is re-set to be "1", and data in a memory cell $MC_{Lj}$ (corresponding to memory cell $MC_{Lk}$) at a designated address $AD_j$ is read out and latched in the sense amplifier $SA_L$. The plate-line address counter 12 is incremented, so that it is no longer required to externally designate the address of the memory cell.

The operation of the above [Step-140] is carried out with regard to all of the other memory cells $MC_k$ constituting the sub-memory unit $SMU_L$ without external addressing (without externally designating any address). That is, data are read out from and re-written into the memory cells consecutively in the order of the memory cell $MC_{L,J+1}$ in the (J+1)-th place, the memory cell $MC_{L,J+2}$ in the (J+2)-th place . . . , the memory cell $MC_{L,M}$ in the M-th place, the memory cell $MC_{L,1}$ in the first place, the memory cell $MC_{L,2}$ in the second place . . . the memory cell $MC_{L,J-2}$ in the (J-2)-th place and the memory cell $MC_{L,J-1}$ in the (J-1)-th place. In Example 1, the data latched in the sense amplifier $SA_L$ is not outputted to an outside.

Upon completion of the operation, the comparator 14 notifies the unit controller 15 to that effect, and the unit controller 15 deactivates the unit decoder 16 and brings the word lines WL and all of the plate lines $PL_M$ back to a non-selected state.

By the above steps, any memory cell can be rapidly accessed, and re-writing with regard to all the data stored in other memory cells in one sub-memory unit can be executed once.

In the above case, the worst value of the number of times of the disturbances is as follows. That is, "P" is designated as an address, a memory cell $MC_P$ ($1 \leq P \leq M$) is selected by an access with ACT command, and re-writing is performed in other memory cells by RESTORE command that follows. In this case, the number of times of the disturbances to the memory cell $MC_P$ is (M−1) times. Then, "P+1" is designated as an address, a memory cell $MC_{P+1}$ is selected by an access with ACT command, and re-writing is performed in other memory cells by RESTORE command that follows. In this case, re-writing is performed in the memory cell $MC_P$ after the memory cell $MC_P$ receives disturbances (M−1) times. In the above case, therefore, the memory cell $MC_P$ receives disturbances 2×(M−1) times after the data is re-written and before the data is re-written again. Almost no deterioration of data by disturbances takes place as far as the number of times of the disturbances is as described above. Therefore, a random access to a memory cell can be performed, and at the same time, the disturbances can be suppressed.

The operation of reading-out and re-writing of data in the nonvolatile memory of Example 1 will be explained below with reference to FIG. 7 showing waveforms. As an example, it is assumed that data will be read out from the memory cell $MC_{L1}$ connected to the plate line $PL_1$ and re-written into the memory cell $MC_{L1}$. In the waveforms in the drawing, parenthesized numerals correspond to Nos. of steps to be explained below.

(1A) In [Step-100], before ACT command is inputted, that is, in a standby state, the bit line, the word line and all of the plate lines have 0 volt. Further, the common node $CN_L$ also has 0 volt and is in a floating state.

(2A) In [Step-100], upon the input of ACT command, the word line decoder/driver WD and the plate line decoder/driver PD are activated, and the plate line $PL_1$ is also selected. In [Step-110], then, reading-out of data is started. That is, a high potential $V_{PL-H \, (=Vcc)}$ is applied to the selected plate line $PL_1$. In this case, if data "1" has been stored in the selected memory cell $MC_{L1}$, polarization inversion takes place in the ferroelectric layer, an accumulated charge amount increases, and the potential of the common node $CN_L$ increases. If data "0" has been stored in the selected memory cell $MC_{L1}$, no polarization inversion takes place in the ferroelectric layer, and the potential of the common node $CN_L$ hardly increases. That is, the common node $CN_L$ is coupled with a plurality of non-selected plate lines $PL_k$ (k=2, 3 . . . M) through the ferroelectric layers of the non-selected memory cells $MC_{Lk}$, so that the potential of the common node $CN_L$ is maintained at a level relatively close to 0 volt. In this manner, a change is caused on the potential of the common node $CN_L$ depending upon data stored in the selected memory cell $MC_{L1}$.

(3A) Then, the bit line $BL_L$ is brought into a floating state, and the word line WL is brought into a high level, whereby the transistor for selection $TR_L$ is brought into an ON-state. By this operation, the potential that is caused on the common first electrode (common node $CN_L$) on the basis of the data stored in the selected memory cell $MC_{L1}$ appears in the bit line $BL_L$, and latched in the sense amplifier $SA_L$.

(4A) Then, the word line WL is brought into a low level, thereby to bring the transistor for selection $TR_L$ into an OFF-state, and the common node $CN_L$ and the bit line $BL_L$ in the sub-memory unit $SMU_L$ is disconnected.

(5A) Then, the sense amplifier $SA_L$ connected to the bit line $BL_L$ is activated to amplify the data, and the operation of reading-out of the data is completed. By READ command in [Step-120], the data latched in the sense amplifier $SA_L$ is outputted to an outside.

By the above operation, the data stored in the selected memory cell $MC_{L1}$ is once destroyed, so that the data is re-written.

(6A) For the above purpose, first, the potential of the non-selected plate lines $PL_k$ (k=2, 3 . . . M) are brought to $V_{PL-M}$ [=($\frac{1}{2}$)$V_{cc}$] in [Step-140].

(7A) Then, the word line WL is brought into a high level, to bring the transistor for selection $TR_L$ into an ON-state. By this operation, the potential of the common node $CN_L$ comes to be equal to the potential of the bit line $BL_L$. That is, when the data stored in the selected memory cell $MC_{L1}$ is "1", the potential of the common node $CN_L$ comes to be $V_{BL-H}$ (=$V_{cc}$), when data stored in the selected memory cell $MC_{L1}$ is "0", the potential of the common node $CN_L$ comes to be $V_{BL-L}$ (=0 volt). Since the potential of the selected plate line $PL_1$ remains $V_{BL-H}$ (=$V_{cc}$), data "0" is re-written into the selected memory cell $MC_{L1}$ when the common node $CN_L$ is 0 volt.

(8A) Then, the potential of the selected plate line $PL_1$ is brought into $V_{BL-L}$ (=0 volt). By this operation, when the data stored in the selected memory cell $MC_{L1}$ is "1", data "1" is re-written since the potential of the common node $CN_L$ is $V_{BL-H}$ (=$V_{cc}$). When the selected memory cell $MC_1$ has data "0" already re-written, no change is caused in the selected memory cell $MC_{Lk}$.

(9A) Then, the bit line $BL_L$ is brought into 0 volt.

(10A) Finally, the non-selected plate lines $PL_k$ are brought into 0 volt, to bring the transistor for selection $TR_L$ into an OFF-state.

For reading out data from other memory cell $MC_k$ (k=2, 3 . . . M) and re-writing the data, a nearly similar operation can be repeatedly carried out on the basis of RESTORE command.

The method of producing the nonvolatile memory in Example 1 will be explained hereinafter. Nonvolatile memories in other Examples or variants thereof can be also produced by substantially the same method.

First, a MOS type transistor that is to work as a transistor for selection in a nonvolatile memory is formed in a semiconductor substrate 20. For this purpose, a device isolation region 21 having, for example, a LOCOS structure is formed by a known method. The device isolation region 21 may have a trench structure, or may have a combination of a LOCOS structure and a trench structure. Then, the surface of the semiconductor substrate 20 is oxidized, for example, by a pyrogenic method, to form a gate insulating layer 22. Then, a polysilicon layer doped with an impurity is formed on the entire surface by a CVD method and then patterned, to form a gate electrode 23. The gate electrode 23 is also to work as a word line WL. The gate electrode 23 can be constituted of polycide or metal silicide in place of a polysilicon layer. Then, the semiconductor substrate 20 is ion-implanted, to form an LDD structure. Then, an $SiO_2$ layer is formed on the entire surface by a CVD method, and the $SiO_2$ layer is etched back, to form gate-side-walls (not shown) on side walls of the gate electrode 23. Then, the semiconductor substrate 20 is ion-implanted, and an implanted impurity is annealed for activation, to form the source/drain regions 24.

Then, a lower insulating layer made of $SiO_2$ is formed by a CVD method, and then, an opening portion is made through the lower insulating layer above one source/drain region 24 by an RIE method. And, a polysilicon layer doped with an impurity is formed on the lower insulating layer and inside the above opening portion, whereby a contact hole 25 can be formed. Then, the polysilicon layer on the lower insulating layer is patterned to form the bit line $BL_L$. Then, an upper insulating layer made of BPSG is formed on the entire surface by a CVD method. After the formation of the upper insulating layer made of BPSG, preferably, the upper insulating layer is reflowed in a nitrogen gas atmosphere, for example, at 900° C. for 20 minutes. Further, desirably, the top surface of the upper insulating layer is chemically and mechanically polished by a chemical/mechanical polishing method (CMP method), to flatten the upper insulating layer. The lower insulating layer and the upper insulating layer will be collectively referred to as "insulating layer 26".

Then, an opening portion 27 is formed through the insulating layer 26 above the other source/drain region 24 by an RIE method, and then the opening portion is filled with polysilicon doped with an impurity, to complete a contact hole 28. The bit line BLL is extending on the lower insulating layer leftward and rightward in the drawing such that it is not in contact with the contact hole 28.

The contact hole 28 can be also formed by filling the opening portion 27 made through the insulating layer 26, for example, with a metal wiring material made of a refractory metal or metal silicide such as tungsten, Ti, Pt, Pd, Cu, TiW, TiNW, $WSi_2$ or $MoSi_2$. The top surface of the contact hole 28 may be nearly at the same level as the level of the surface of the insulating layer 26, or the top portion of the contact hole 28 may be extending on the surface of the insulating layer 26. Table 1 below shows conditions of forming the contact hole 28 by filling the opening portion 27 with tungsten. Before filing the opening portion 27 with tungsten, preferably, a Ti layer and a TiN layer are consecutively formed on the insulating layer 26 and inside the opening portion 27 by, for example, a magnetron sputtering method. The reason for forming the above Ti layer and the above TiN layer is that a ohmic low contact resistance is obtained, that damage that may be caused on the semiconductor substrate 20 by a blanket tungsten CVD method is prevented, and that the adhesion of tungsten is improved.

TABLE 1

| Sputtering condition for Ti layer (thickness: 20 nm) | |
| --- | --- |
| Process gas | Ar = 35 sccm |
| Pressure | 0.52 Pa |
| RF power | 2 kW |
| Heating of substrate | No |
| Sputtering condition for TiN layer (thickness: 100 nm) | |
| Process gas | $N_2$/Ar = 100/35 sccm |
| Pressure | 1.0 Pa |
| RF power | 6 kW |
| Heating of substrate | No |
| Tungsten CVD formation condition | |
| Source gas | $WF_6$/$H_2$/Ar = 40/400/2250 sccm |
| Pressure | 10.7 kPa |
| Forming temperature | 450° C. |
| Etching conditions of tungsten layer, TiN layer and Ti layer | |
| Etching on first stage: Etching of tungsten layer | |
| Source gas | $SF_6$/Ar/He = 110:90:5 sccm |
| Pressure | 46 Pa |
| RF power | 275 W |

TABLE 1-continued

Etching on second stage: Etching of TiN layer/Ti layer

| Source gas | $Ar/Cl_2$ = 75/5 sccm |
|---|---|
| Pressure | 6.5 Pa |
| RF power | 250 W |

Then, desirably, an adhesion layer (not shown) made of TiN is formed on the insulating layer 26. Then, a first electrode material layer for forming a first electrode (lower electrode) 31 made of Ir is formed on the adhesion layer, for example, by a sputtering method, and the first electrode material layer and the adhesion layer are patterned by photolithography and a dry etching method, whereby the first electrode 31 (common node $CN_L$) can be obtained.

Then, a ferroelectric thin film made of a Bi-containing layer-structured perovskite type ferroelectric material (specifically, $Bi_2SrTa_2O_9$ for example) is formed on the entire surface, for example, by an MOCVD method. Then, the ferroelectric thin film is dried in air at 250° C. and then heat-treated in an oxygen gas atmosphere at 750° C. for 1 hour to promote crystallization of the ferroelectric material.

Then, an $IrO_{2-x}$ layer and a Pt layer are consecutively formed on the entire surface by sputtering methods, and then, the Pt layer, the $IrO_{2-x}$ layer and the ferroelectric thin film are consecutively patterned by photolithography and a dry etching technique, to form the second electrodes 33 that are also to work as a plate line $PL_m$ and the ferroelectric layer 32. When the etching damages the ferroelectric layer 32, the ferroelectric layer 32 can be heat-treated at a temperature required for recovery from the damage. Thereafter, an upper insulating layer 36A is formed on the insulating layer 26 and the memory cells.

Each second electrode 33 is not necessarily required to work as a plate line $PL_m$. In such a case, after the upper insulating layer is formed on the insulating layer 26 and the memory cells, the plate line $PL_m$ can be formed on the upper insulating layer, and the second electrode 33 and the plate line $PL_m$ can be connected through a contact hole (via hole) made through the upper insulating layer. Further, the ferroelectric thin film may not be patterned.

Table 2 below shows a condition of forming a ferroelectric thin film made of $Bi_2SrTa_2O_9$. In Table 2, "thd" stands for tetramethylheptanedione. Further, source materials shown in Table 2 are in the form of a solution thereof in a solvent containing tetrahydrofuran (THF) as a main component.

TABLE 2

Formation by MOCVD method

| Source materials | $Sr(thd)_2$-tetraglyme |
|---|---|
|  | $Bi(C_6H_5)_3$ |
|  | $Ta(O\text{—}iC_3H_7)_4(thd)$ |
| Forming temperature | 400–700° C. |
| Process gas | $Ar/O_2$ = 1000/1000 cm$^3$ |
| Forming rate | 5–20 nm/minute |

Alternatively, a ferroelectric thin film made of $Bi_2SrTa_2O9$ can be formed on the entire surface by a pulse laser abrasion method, a sol-gel method or an RF sputtering method as well. Tables 3, 4 and 5 below show forming conditions in these cases. When a ferroelectric thin film having a large thickness is formed by a sol-gel method, spin coating and drying can be repeated as required, or spin coating and calcining (or annealing) can be repeated as required.

TABLE 3

Formation by pulse laser abrasion method

| Target | $Bi_2SrTa_2O_9$ |
|---|---|
| Laser used | KrF Excimer laser |
|  | (wavelength 248 nm, |
|  | pulse width 25 |
|  | nanoseconds, 5 Hz) |
| Forming temperature | 400–800° C. |
| Oxygen concentration | 3 Pa |

TABLE 4

Formation by sol-gel method

| Source materials | $Bi(CH_3(CH_2)_3CH(C_2H_5)COO)_3$ |
|---|---|
|  | [Bismuth.2-ethylhexanoic acid, $Bi(OOc)_3$] |
|  | $Sr(CH_3(CH_2)_3CH(C_2H_5)COO)_2$ |
|  | [Strontium.2-ethylhexanoic acid, $Sr(OOc)_2$] |
|  | $Ta(OEt)_5$ [Tantalum ethoxide] |
| Spin coating conditions | 3000 rpm × 20 seconds |
| Drying | 250° C. × 7 minutes |
| Calcining | 400–800° C. × 1 hour (RTA treatment added as required) |

TABLE 5

Formation by RF sputtering method

| Target | $Bi_2SrTa_2O_9$ ceramic target |
|---|---|
| RF power | 1.2 W–2.0 W/target 1 cm$^2$ |
| Ambient pressure | 0.2–1.3 Pa |
| Forming temperature | room temperature - 600° C. |
| Process gas | $Ar/O_2$ flow rate = 2/1–9/1 |

Table 6 below shows a condition of forming PZT or PLZT when a ferroelectric layer is formed of PZT or PLZT by a magnetron sputtering method. Otherwise, a ferroelectric layer made of PZT or PLZT can be formed by a reactive sputtering method, an electron beam deposition method, a sol-gel method or an MOCVD method.

TABLE 6

| Target | PZT or PLZT |
|---|---|
| Process gas | $Ar/O_2$ = 90 vol %/10 vol % |
| Pressure | 4 Pa |
| Power | 50 W |
| Forming temperature | 500° C. |

Further, a ferroelectric layer made of PZT or PLZT can be formed by a pulse laser abrasion method as well. Table 7 shows forming a condition in this case.

TABLE 7

| Target | PZT or PLZT |
|---|---|
| Laser used | KrF Excimer laser |
|  | (wavelength 248 nm, |
|  | pulse width 25 |
|  | nanoseconds, 3 Hz) |

TABLE 7-continued

| | |
|---|---|
| Output energy | 400 mJ (1.1 J/cm$^2$) |
| Forming temperature | 550–600° C. |
| Oxygen concentration | 40–120 Pa |

EXAMPLE 2

The nonvolatile memory operation method of Example 2 is a variant of the nonvolatile memory operation method explained in Example 1. Further, the nonvolatile memory of Example 2 is a variant of the nonvolatile memory of Example 1. As shown in an equivalent circuit diagram of FIG. 8, the nonvolatile memory of Example 2 comprises a first memory unit and a second memory unit.

The first memory unit has;

(A-1) a first bit line $BL_{L1}$, (B-1) first transistor(s) for selection $TR_{L1}$ that are N in number (N≧1, N=1 in Example 2), (C-1) first sub-memory unit(s) $SMU_{L1}$ that are N in number, each of which is composed of first memory cells $MC_{L1M}$ that are M (M≧2, M=8 in Example 2) in number, and (D-1) plate lines $PL_M$ that are M in number, each plate line $PL_M$ being shared with each first memory cell $MC_{L1M}$ constituting each of the sub-memory unit(s) $SMU_{L1}$ that are N in number.

The second memory unit has;

(A-2) a second bit line $BL_{L2}$, (B-2) second transistor(s) for selection $TR_{L2}$ that are N in number, (C-2) second sub-memory unit(s) $SMU_{L2}$ that are N in number, each of which is composed of second memory cells $MC_{L2M}$ that are M in number, and (D-2) the plate lines $PL_M$ that are M in number, each plate line $PL_M$ being shared with each second memory cell $MC_{L2M}$ constituting each of the sub-memory unit(s) $SMU_{L1}$ that are N in number, said plate lines being shared with the plate lines $PL_M$ constituting the first memory unit.

The nonvolatile memory further comprises;

(E) a sense amplifier $SA_L$ connected to the first and second bit lines.

Each memory cell $MC_{L1M}$ comprises a first electrode (lower electrode) 31, a ferroelectric layer 32 and a second electrode (upper electrode) 33. In the first memory unit, the first electrodes 31 of the first memory cells $MC_{L1M}$ constituting the first sub-memory unit $SMU_{L1}$ in the n-th place (n=1, 2 . . . N) are in common (shown as "common node $CN_{L1}$") with the n-th place first sub-memory unit $SMU_{L1}$. The above common first electrode (common node CNL1) is connected to the first bit line $BL_{L1}$ through the n-th place first transistor for selection $TR_{L1}$, and each second electrode 33 is connected to each shared plate line $PL_m$. Further, in the second memory unit, the first electrodes 31 of the second memory cells $MC_{L2M}$ constituting the n-th place second sub-memory unit $SMU_{L2}$ are in common (shown as "common node $CN_{L2}$") with the n-th place second sub-memory unit $SMU_{L2}$. The above common first electrode (common node $CN_{L2}$) is connected to the second bit line $BL_{L2}$ through the n-th place second transistor for selection $TR_{L2}$, and each second electrode 33 is connected to each shared plate line $PL_m$. The n-th place first transistor for selection $TR_{L1}$ and the n-th place second transistor for selection $TR_{L2}$ are connected to the same word line WL.

Any other constitution of the nonvolatile memory of Example 2 can be the same as that of the nonvolatile memory of Example 1, so that a detailed explanation thereof is omitted.

In the nonvolatile memory of Example 2, in a pair of the m-th place (m=1, 2 . . . M) first memory cell $MC_{L1m}$ constituting the n-th place first sub-memory unit $SMU_{L1}$ and the m-th place second memory cell $MC_{L2m}$ constituting the n-th place second sub-memory unit $SMU_{L2}$, 1 bit for constituting complement data is read out, and 1 bit for constituting the complement data is re-written.

Figure 9:
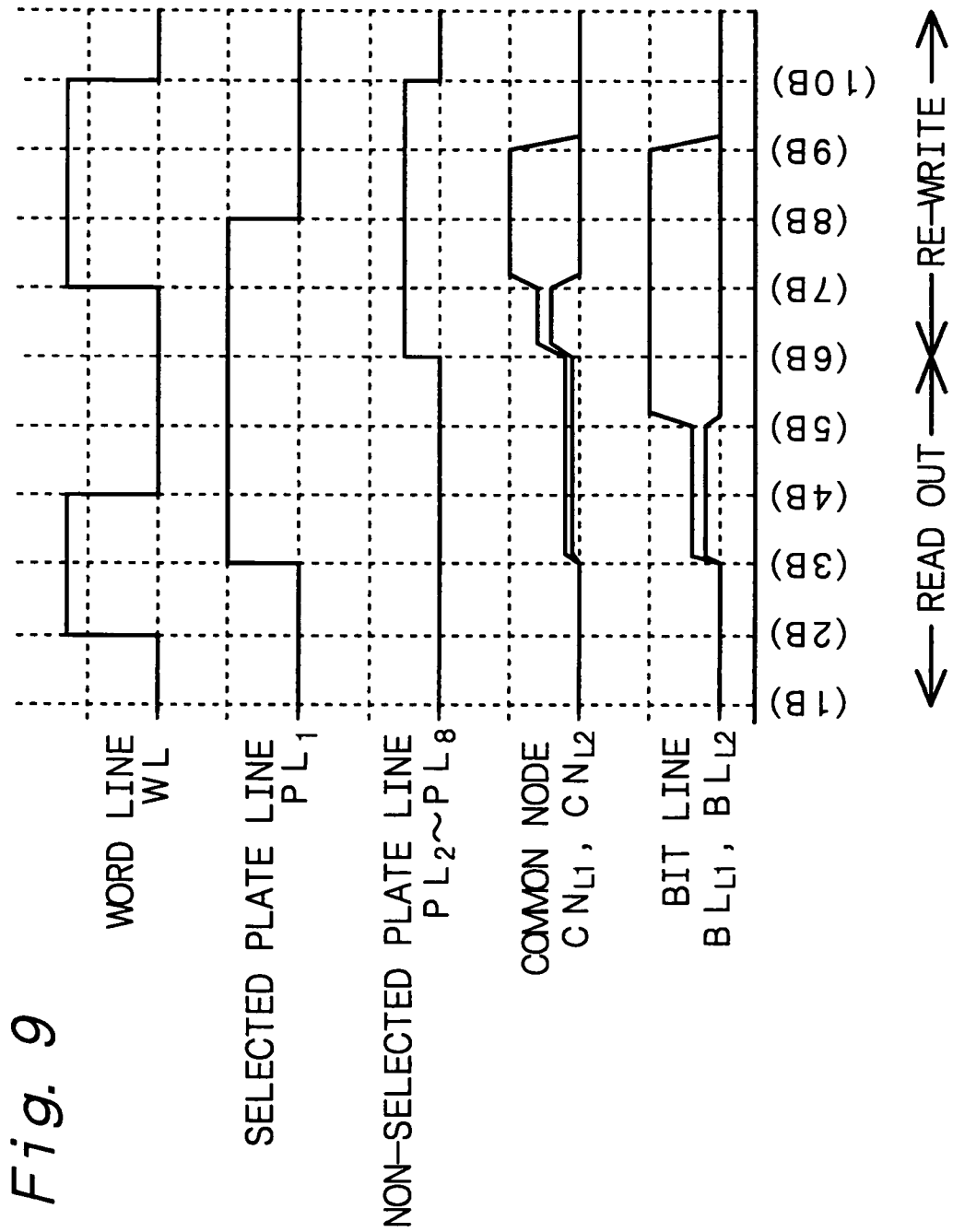
FIG. 9 is a diagram for showing waveforms in operations of reading-out and re-writing of data in ferroelectric-type nonvolatile semiconductor memories in Examples 2 and 3.

The nonvolatile memory operation method of reading-out and re-writing of data in the nonvolatile memory of Example 2 will be explained below. Steps of reading-out and re-writing of data can be the same as [Step-100] to [Step-140] in Example 1, so that a detailed explanation thereof is omitted. As an example, it is assumed that data is read out from and re-written into the memory cells ($MC_{L11}$, $MC_{L21}$) that share the plate line $PL_1$ (i.e., forms a pair). It is assumed that the first memory cell $MC_{L11}$ has data "1" stored therein and that the second memory cell $MC_{L21}$ has data "0" stored therein. FIG. 9 shows operation waveforms. In FIG. 9, parenthesized numerals correspond to Nos. of steps to be explained below.

First, the data in the selected memory cells ($MC_{L11}$, $MC_{L21}$) is read out.

(1B) In an initial state, all of the bit lines, all of the word lines and all of the plate lines have 0 volt. Further, the common nodes $CN_{L1}$, and $CN_{L2}$ also have 0 volt and are in a floating state.

(2B) For starting to read out the data, the word line WL is brought into a high level, thereby to bring the first transistor for selection $TR_{L1}$ and the second transistor for selection $TR_{L2}$ into an ON-state. By the above operation, the common node $CN_{L1}$ of the first sub-memory unit $SMU_{L2}$ is connected to the first bit line $BL_{L1}$, and the common node $CN_{L2}$ of the second sub-memory unit $SMU_{L2}$ is connected to the second bit line $BL_{L2}$. The first bit line $BL_{L1}$ and the second bit line $BL_{L2}$ are kept in a floating state.

(3B) Then, $V_{PL-H}$ (=$V_{cc}$) is applied to the selected plate line $PL_1$. The non-selected plate lines $PL_k$ are kept at a level of $V_{PL-L}$ (=0 volt). In this case, since the selected first memory cell $MC_{L11}$ has data "1" already written therein, polarization inversion in the ferroelectric layer takes place, and the potential of the common node $CN_{L1}$ and, further, the potential of the first bit line $BL_{L1}$ increase. On the other hand, since the selected second memory cell $MC_{L21}$ has data "0" already written therein, no polarization inversion in the ferroelectric layer takes place, and the potential of the common node $CN_{L2}$ and, further, the potential of the second bit line $BL_{L2}$ are somewhat higher than 0 volt. By the above operation, a potential difference is caused between the first bit line $BL_{L1}$ and the second bit line $BL_2$.

(4B) Then, the word line WL is brought into a low level, thereby to bring the first transistor for selection $TR_{L1}$ and the second transistor for selection $TR_{L2}$ into an OFF-state, the common node $CN_{L1}$ and the first bit line $BL_{L1}$ in the sub-memory unit $SMU_{L1}$ are disconnected, and the common node $CN_{L2}$ and the second bit line $BL_{L2}$ in the sub-memory unit $SMU_{L2}$ are disconnected.

(5B) Then, the sense amplifier $SA_L$ is activated to decide data, such data is read out and outputted to an outside, and the first bit line $BLL_1$ and the second bit line $BL_{L2}$ are charged and discharged.

Then, the data is re-written into the selected memory cells ($MC_{L11}$, $MC_{L21}$).

(6B) When re-writing of the data is started, the first transistor for selection $TR_{L1}$ and the second transistor for selection $TR_{L2}$ are in an OFF-state. Further, the plate line $PL_1$ connected to the selected first and second memory cells $MC_{L11}$ and $MC_{L21}$ has high potential $V_{PL-H}(=V_{cc})$ applied thereto. In this state, an intermediate potential $V_{PL-M}[=(\frac{1}{2})V_{cc}]$ is applied to the plate lines $PL_k$ connected to the non-selected memory cells $MC_{1k}$ and $MC_{2k}$. Since the data to be re-written into the selected first memory cell $MC_{L11}$ is "1", the first bit line $BL_{L1}$ has a high potential $V_{BL-H}(=V_{cc})$, and since the data to be re-written into the selected second memory cell $MC_{L21}$ is "0", the second bit line $BL_{L2}$ has a low potential $V_{BL-L}$ (=0 volt).

(7B) Then, the word line WL is brought to a high level, to bring the first transistor for selection $TR_{L1}$ and the second transistor for selection $TR_{L2}$ into an ON-state, so that the common node $CN_{L1}$ and the first bit line $BL_{L1}$ of the sub-memory unit $SMU_{L1}$ are connected to each other through the first transistor for selection $TR_{L1}$, and that the common node $CN_{L2}$ and the second bit line $BL_{L2}$ of the sub-memory unit $SMU_{L2}$ are connected to each other through the second transistor for selection $TR_{L2}$.

(8B) Then, a low potential $V_{PL-L}$ (=0 volt) is applied to the selected plate line $PL_1$.

When a high potential $V_{BL-H}(=V_{cc})$ is applied to the first bit line $BL_{L1}$ in step (6B), and when the first transistor for selection $TR_{L1}$ is brought into an ON-state, and the common node $CN_{L1}$ and the first bit line $BL_{L1}$ are connected to each other through the first transistor for selection $TR_{L1}$ in step (7B), data is not written into the selected first memory cell $MC_{L11}$, since the selected plate line $PL_1$ has a high potential $V_{PL-H}$ (=$V_{cc}$) applied thereto. Then, in step (8B), a low potential $V_{PL-L}$ is applied to the selected plate line $PL_1$, so that data "1" is re-written into the selected first memory cell $MC_{L11}$.

On the other hand, when the second bit line $BL_{L2}$ has a low potential $V_{BL-L}$ applied thereto in step (6B), and when the second transistor for selection $TR_{L2}$ is brought into an ON-state, and the common node $CN_{L2}$ and the second bit line $BL_{L2}$ are connected to each other through the second transistor for selection $TR_{L2}$ in step (7B), data "0" is re-written into the selected second memory cell $MC_{L21}$, since the selected plate line $PL_1$ has a high potential $V_{PL-H}$ applied thereto. Then, in step (8B), a low potential $V_{PL-L}$ (=0 volt) is applied to the selected plate line $PL_1$, while data "0" stored in the selected second memory cell $MC_{L21}$ suffers no change.

(9B) Then, the first bit line $BL_{L1}$ and the second bit line $BL_{L2}$ are brought to a level of 0 volt.

(10B) Finally, the plate lines $PL_k$ are brought to a level of 0 volt, and the first and second transistors for selection $TR_{L1}$ and $TR_{L2}$ are brought into an OFF-state.

Thereafter, steps (1B) to (10B) are carried out consecutively with regard to the memory cells ($MC_{L1m}$, $MC_{L2m}$) (m=2, 3 . . . 8). However, no data is outputted to an outside.

As waveforms in Example 2, the waveforms explained in Example 1 can be also employed.

EXAMPLE 3

The nonvolatile memory operation method of Example 3 is also a variant of the nonvolatile memory operation method explained in Example 1. Further, the nonvolatile memory of Example 3 is a variant of the nonvolatile memory of Example 2. In the nonvolatile memory in Example 3, as shown in the equivalent circuit diagram of FIG. 10, the first transistor for selection $TR_{L1}$ is connected to the first word line $WL_1$, the second transistor for selection $TR_{L2}$ is connected to the second word line $WL_2$, and these are independently controlled with the word line decoder/driver WD. The constitution of the nonvolatile memory of Example 3 is the same as that of the nonvolatile memory of Example 2 except for the above points.

In the nonvolatile memory operation method in Example 3, for reading out data stored in the first memory cell $MC_{L1m}$, the first transistor for selection $TR_{L1}$ is brought into an ON-state, the second transistor for selection $TR_{L2}$ is brought into an OFF-state, and a reference potential is applied to the second bit line $BL_{L2}$. For reading out data stored in the second memory cell $MC_{L2m}$, the second transistor for selection $TR_{L2}$ is brought into an ON-state, the first transistor for selection $TR_{L1}$ is brought into an OFF-state, and a reference potential is applied to the first bit line $BL_{L1}$.

The nonvolatile memory operation method for reading-out and re-writing of data in the nonvolatile memory of Example 3 will be explained below. Since, however, the steps of reading-out and re-writing of data can be the same as [Step-100] to [Step-140] in Example 1, so that a detailed explanation thereof is omitted. As an example, it is assumed that data is read out from and re-written into the memory cells $MC_{L11}$. The memory cells ($MC_{L11}$, $MC_{L21}$) share the plate line $PL_1$ (i.e., forms a pair). As operation waveforms, those shown in FIG. 9 are employed. In FIG. 9, parenthesized numerals correspond to Nos. of steps to be explained below, in which alphabet "B" following parenthesized numerals in FIG. 9 corresponds to "C" following numerals in Nos. of steps in the following explanation.

First, the data in the selected first memory cell $MC_{L11}$ is read out.

(1C) In an initial state, all of the bit lines, all of the word lines and all of the plate lines have 0 volt. Further, the common nodes $CN_{L1}$ and $CN_{L2}$ have 0 volt and are in a floating state.

(2C) When reading-out of the data is started, the word line $WL_1$ is brought into a high level, thereby to bring the first transistor for selection $TR_{L1}$ into an ON-state. By this operation, the common node $CN_{L1}$ of the first sub-memory unit $SMU_{L1}$ is connected to the first bit line $BL_{L1}$. The first bit line $BL_{L1}$ and the second bit line $BL_{L2}$ are kept in a floating state.

(3C) Then, $V_{PL-H}$ (=$V_{cc}$) is applied to the selected plate line $PL_1$. The non-selected plate lines $PL_k$ are kept at $V_{PL-L}$ (=0 volt). In this case, the selected memory cell $MC_{L11}$ has data "1" already written therein, polarization inversion in the ferroelectric layer takes place, and the potential of the common node $CN_{L1}$ of the sub-memory unit $SMU_{L1}$ and further, the potential of the first bit line $BL_{L1}$ increase. When the selected memory cell $MC_{L11}$ has data "0" already written therein, no polarization inversion in the ferroelectric layer takes place, and the potential of the common node $CN_{L1}$ of the sub-memory unit $SMU_{L1}$ and further, the potential of the first bit line $BL_{L1}$ slightly increase to be somewhat higher than 0 volt. On the other hand, with a dummy cell or the like, a reference potential that is intermediate between a bit line potential for data "1" and a bit line potential for data "0" is applied to the second bit line $BL_{L2}$.

(4C) Then, the word line $WL_1$ is brought into a low level, to bring the first transistor for selection $TR_{L1}$ into an OFF-state, and the common node $CN_{L1}$ and the first bit line $BL_{L1}$ are disconnected.

(5C) Then, the sense amplifier $SA_L$ is activated, to decide data, said data is read out and outputted to an outside, and the first bit line $BL_{L1}$ is charged and discharged.

Then, the data is re-written into the selected memory cell $MC_{L11}$.

(6C) when re-writing of the data is started, the first transistor for selection $TR_{L1}$ is in an OFF-state. Further, the plate line $PL_1$ connected to the selected memory cell $MC_{L11}$ has a high potential $V_{PL-H}$ (=$V_{cc}$) applied thereto. In the above state, an intermediate potential $V_{PL-M}$ [=(½)$V_{cc}$] is applied to the plate lines $PL_k$ connected to the non-selected memory cells $MC_{Lk}$. When the data to be re-written into the selected memory cell $MC_{L11}$ is "1", the first bit line $BL_{L1}$ has a high potential $V_{BL-H}$ (=$V_{cc}$), and when the data to be re-written is "0", the first bit line $BL_{L1}$ has a low potential $V_{BL-L}$ (=0 volt).

(7C) Then, the first transistor for selection $TR_{L1}$ is brought into an ON-state, and the common node $CN_{L1}$ and the first bit line $BL_{L1}$ are connected to each other through the first transistor for selection $TR_{L1}$.

(8C) Then, a low potential $V_{PL-L}$ (=0 volt) is applied to the selected plate line $PL_1$.

When the first bit line $BL_{L1}$ has a low potential $V_{BL-L}$ (=0 volt) applied thereto in step (6C), and when the first transistor for selection $TR_{L1}$ is brought into an ON-state, and the common node $CN_{L1}$ and the first bit line $BL_{L1}$ are connected to each other through the first transistor for selection $TR_{L1}$ in step (7C), data "0" is re-written into the selected memory cell $MC_{L11}$, since the selected plate line $PL_1$ has a high potential $V_{PL-H}$ (=$V_{cc}$) applied thereto. Then, in step (8C), even if a low potential $V_{PL-L}$ (=0 volt) is applied to the selected plate line $PL_1$, data "0" written into the selected memory cell $MC_{L11}$ suffers no change.

On the other hand, when the first bit line $BL_{L1}$ has a high potential $V_{BL-H}$ applied thereto in step (6C), and when the first transistor for selection $TR_{L1}$ is brought into an ON-state, and the common node $CN_{L1}$ and the first bit line $BL_{L1}$ are connected to each other through the first transistor for selection $TR_{L1}$ in step (7C), no data is written into the selected memory cell $MC_{L11}$, since the selected plate line $PL_1$ has a high potential $V_{PL-H}$ applied thereto. Then, in step (8C), a low potential (=0 volt) is applied to the selected plate line $PL_1$, whereby data "1" is re-written into the selected memory cell $MC_{L11}$.

(9C) Then, the first bit line $BL_{L1}$ is brought to a level of volt.

(10C) Finally, the non-selected plate lines $PL_k$ are brought into a level of 0 volt, and the first transistor for selection $TR_{L1}$ is brought into an OFF-state.

Thereafter, steps (1C) to (10C) are carried out consecutively with regard to the memory cells $MC_{L21}$, $MC_{L1m}$, $MC_{L2m}$) (m=2, 3 . . . 8). However, no data is outputted to an outside.

As operation waveforms in Example 3, the waveforms explained in Example 1 can be also employed.

EXAMPLE 4

Figure 2:
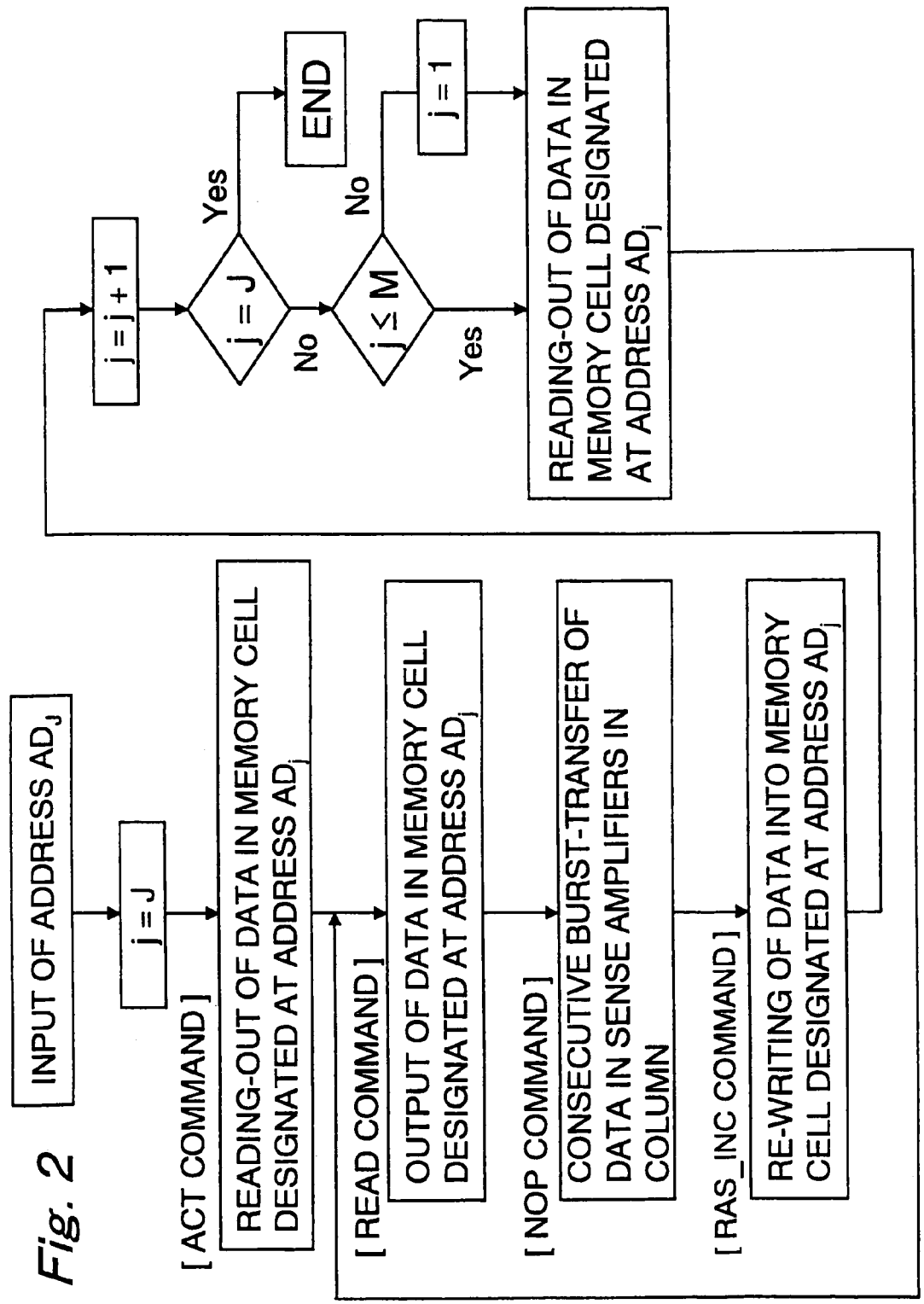
FIG. 2 is a flow chart of an operation method of a ferroelectric-type nonvolatile semiconductor memory in Example 4.

Example 4 is also concerned with the nonvolatile memory operation method according to the first aspect of the present invention and the nonvolatile memory of the present invention, and more specifically, to the nonvolatile memory operation method according to No. 1B constitution. FIG. 2 shows a flow chart of the nonvolatile memory operation method of Example 4. While Example 4 uses a nonvolatile memory having an equivalent circuit diagram shown in FIG. 8, there may be used a nonvolatile memory having an equivalent circuit diagram shown in FIG. 5 or FIG. 10.

In the nonvolatile memory operation method of Example 4, it is assumed that the memory cell at a designated address (J, $1 \leq J \leq M$) externally designated is a memory cell $MC_{LJ}$. Further, it is assumed that the address-designated sub-memory unit is a sub-memory unit $SMU_L$. In Example 4, data is read out from the memory cell $SMU_L$ at the address externally designated and is latched in the sense amplifier $SA_L$, and then the data latched in the sense amplifier $SA_L$ is outputted to an outside.

In Example 4, further, after the data latched in the sense amplifier $SA_L$ is outputted to an outside, the data latched in the sense amplifier $SA_L$ is re-written into the memory cell $MC_{LJ}$ at the address externally designated. Then, the data stored in other memory cell $MC_{Lk}$ (k≠J) constituting the sub-memory unit $SMU_L$ is read out without external addressing (without externally designating any address) and is latched in the sense amplifier $SA_L$, and the data latched in the sense amplifier $SA_L$ is outputted to an outside. Then, the data latched in the sense amplifier $SA_L$ is re-written into other memory cell $MC_{Lk}$. In Example 4, the memory cells are sequentially accessed to read out, output and re-write the data.

The operation method of Example 4 will be explained below with reference to FIGS. 2 and 8. Since the operation waveforms can be substantially the same as those shown in FIG. 9, so that a detailed explanation thereof is omitted.

[Step-400]

First, ACT command is inputted to the command decoder 10, and an address (RAS address) designating a sub-memory unit and a memory cell is inputted together. The RAS address is separated into a higher component and a lower component with a shift register (not shown). The higher component for designating the address $AD_J$ of the memory cells $MC_{L1J}$ and $MC_{L2J}$ is latched in the designated-plate-line address register 11 and the plate-line address counter 12. On the other hand, the lower component for designating the address of the sub-memory units $SMU_{L1}$ and $SMU_{L2}$ is latched in the unit-address register 13. The above higher component for designating the address of the memory cells $MC_{L1J}$ and $MC_{L2J}$, which is latched in the designated-plate-line address register 11, will be referred to as an address "J", the higher component for designating the address of the memory cells $MC_{L1J}$ and $MC_{L2J}$, which is latched in the plate-line address counter 12, will be referred to as an address "j" (=J), and the lower component for designating the address of the sub-memory units $SMU_{L1}$ and $SMU_{L2}$, which is latched in the unit-address register 13, will be referred to as an address "L".

Further, upon receipt of a signal from the command decoder 10, the unit controller 15 transmits a signal to the unit decoder 16 to activate the unit decoder 16. In addition, the unit decoder 16 receives a signal from the unit-address register 13 and selects the sub-memory units $SMU_{L1}$ and $SMU_{L2}$. On the other hand, a signal from the plate-line address counter 12 is transmitted to the plate line decoder/driver PD. By the above operation, the word line decoder/driver WD and the plate line decoder/driver PD are activated, and the plate line $PL_J$ is selected by the plate line decoder/driver PD.

[Step-410]

And, the data stored in the memory cells $MC_{L1j}$ and $MC_{L2j}$ (specifically, the memory cells $MC_{L1J}$ and $MC_{L2J}$) designated by the address $AD_J$ is read out and latched in the sense amplifier $SA_L$.

In the above steps, a plurality of sub-memory units and memory cells connected to the same word line and the same plate line can be selected. That is, memory cells $MC_{L,1,J}$, $MC_{L,2,J}$, $MC_{L+1,1,J}$, $MC_{L+1,2,J}$, $MC_{L+2,1,J}$, $MC_{L+2,2,J}$ . . . in sub-memory units $SMU_{L,1}$, $SMU_{L,2}$, $SMU_{L+1,1}$, $SMU_{L+1,2}$, $SMU_{L+2,1}$, $SMU_{L+2,2}$ . . . may be selected. By the above operation, the data in the memory cells $MC_{L,1,J}$, $MC_{L,2,J}$, $MC_{L+1,1,J}$, $MC_{L+1,2,J}$, $MC_{L+2,1,J}$, $MC_{L+2,2,J}$ . . . are latched in the sense amplifiers $SA_L$, $SA_{L+1}$, $SA_{L+2}$ . . . .

[Step-420]

Then, READ command is inputted to the command decoder 10, and the CAS address for designating the sense amplifier $SA_L$ is inputted together. According to the above command and the CAS address, an instruction is transmitted to the sense amplifier $SA_L$ through a line (not shown), and the data latched in the sense amplifier $SA_L$ is outputted to an outside.

[Step-430]

When the data in the memory cells $MC_{L+1,1,J}$, $MC_{L+1,2,J}$, $MC_{L+2,1,J}$, $MC_{L+2,2,J}$ . . . are latched in the sense amplifiers $SA_{L+1}$, $SA_{L+2}$ . . . , NOP command is inputted, whereby the data latched in these sense amplifiers are burst-transferred with a counter (not shown). While an access of the above sense amplifiers to an outside is not shown, there can be employed an access method completely similar to that of a conventional synchronous DRAM or the like.

After completion of data output to an outside, RAS_INC command is inputted. By this operation, first, the data latched in the sense amplifier $SA_L$ is re-written into the memory cells $MC_{L1j}$ and $MC_{L2j}$ (specifically, the memory cells $MC_{L1,J}$ and $MC_{L2,J}$) at the designated address.

Then, data stored in other memory cells $MC_{L1k}$ and $MC_{L2k}$ (k≠J) constituting the sub-memory unit $SMU_L$ is read out without external addressing (without externally designating any address), and latched in the sense amplifier $SA_L$. Specifically, the plate-line address counter 12 is incremented, and the value of the plate-line address counter 12 and the value of the designated-plate-line address register 11 are compared with the comparator 14. If the values are the same, the operation is finished. If the values are not the same, it is judged whether or not the value of the plate-line address counter 12 is over the value of "M". If it is over the value of "M", the value of the plate-line address counter 12 is re-set to be "1", and the data in the memory cells $MC_{L1j}$ and $MC_{L2j}$ (corresponding to memory cells $MC_{L1k}$ and $MC_{L2k}$) at the designated address $AD_j$ is read out and latched in the sense amplifier $SA_L$. The plate-line address counter 12 is incremented, so that it is no longer required to externally designate the address of the memory cell.

[Step-450]

Thereafter, the operations of [Step-420] and steps thereafter are repeated. That is, the operations of from [Step-420] to [Step-450] are carried out in all of other memory cells $MC_{L1k}$ and $MC_{L2k}$ constituting the sub-memory units $SMU_{L1}$ and $SMU_{L2}$ without external addressing (without externally designating any address). That is, the data are read out from and re-written into the memory cells consecutively in the order of the memory cells $MC_{L,1,J+1}$ and $MC_{L,2,J+1}$ in the (J+1)-th place, the memory cells $MC_{L,1,J+2}$ and $MC_{L,2,J+2}$ in the (J+2)-th place . . . , the memory cells $MC_{L,1,M}$ and $MC_{L,2,M}$ in the M-th place, the memory cells $MC_{L,1,1}$ and $MC_{L,2,1}$ in the first place, the memory cells $MC_{L,1,2}$ and $MC_{L,2,2}$ in the second place . . . the memory cells $MC_{L,1,J-2}$ and $MC_{L,2,J-2}$ in the (J-2)-th place and the memory cells $MC_{L,1,J-1}$ and $MC_{L,2,J-b\,1}$ in the (J-1)-th place. In Example 4, the data latched in the sense amplifier $SA_L$ is outputted to an outside unlike Example 2.

In the end of the operation, the comparator 14 notifies the unit controller 15 to that effect, and the unit controller 15 deactivates the unit decoder 16 and brings all of the word lines WL and the plate lines $PL_M$ back to a non-selected state.

By the above steps, any memory cell can be rapidly accessed. Further, all of data stored in other memory cells in the same sub-memory unit can be outputted to an outside, and all of such data can be re-written into such other memory cells once.

EXAMPLE 5

Figure 3:
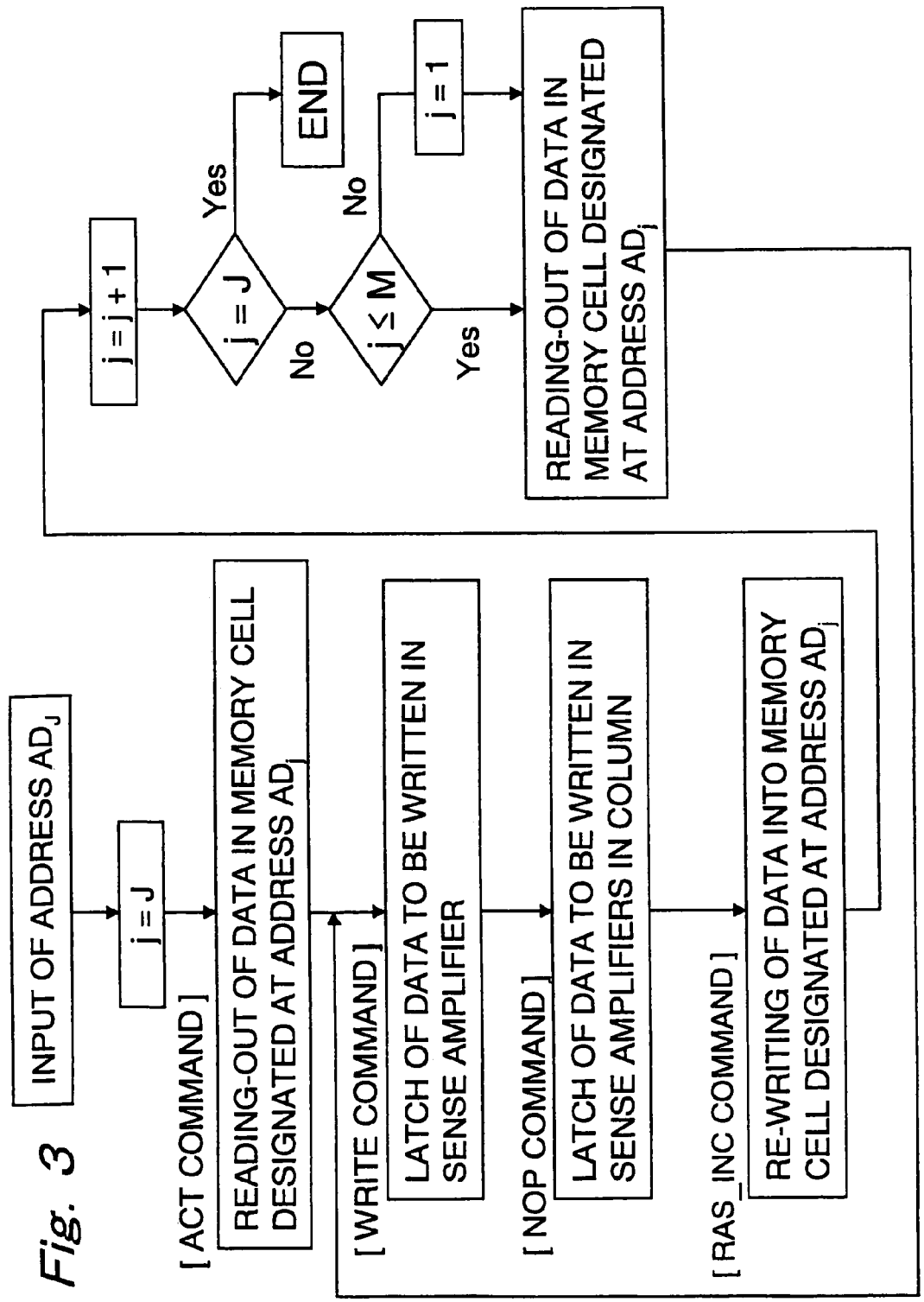
FIG. 3 is a flow chart of an operation method of a ferroelectric-type nonvolatile semiconductor memory in Example 5.

Example 5 is concerned with the nonvolatile memory operation method according to the second aspect of the present invention and the nonvolatile memory of the present invention. More specifically, it is concerned with the nonvolatile memory operation method according to No. 2A constitution. FIG. 3 shows a flow chart of the nonvolatile memory operation method of Example 5. While Example 5 uses a nonvolatile memory having an equivalent circuit diagram shown in FIG. 8, there can be used a nonvolatile memory having an equivalent circuit diagram shown in FIG. 5 or FIG. 10. FIG. 11 shows operation waveforms. In FIG. 11, parenthesized numerals correspond to Nos. of steps to be explained later.

In the nonvolatile memory operation method in Example 5, data to be written is latched in the sense amplifier $SA_L$, and then the data is written into memory cells $MC_{L1J}$ and $MC_{L2J}$ at a designated address (J, $1 \leq J \leq M$) externally designated. Then, data to be written is latched in the sense amplifier, and then, the data is written into other memory cells $MC_{L1k}$ and $MC_{L2k}$ constituting the sub-memory units $SMU_{L1}$ and $SMU_{L2}$ without external addressing (without externally designating any address). In Example 5, data are written into all of the memory cells $MC_{L1k}$ and $MC_{L2k}$ constituting the sub-memory units $SMU_{L1}$ and $SMU_{L2}$. In all of other memory cells constituting the sub-memory units $SMU_{L1}$ and $SMU_{L2}$, further, data are written into the memory cells consecutively, i.e., in the order of the memory cells $MC_{L,1,J+1}$ and $MC_{L,2,J+1}$ in the (J+1)-th place, the memory cells $MC_{L,1,J+2}$ and $MC_{L,2,J+2}$ in the (J+2)-th place . . . , the memory cells $MC_{L,1,M}$ and $MC_{L,2,M}$ in the M-th place, the memory cells $MC_{L,1,1}$ and $MC_{L,2,1}$ in the first place, the memory cells $MC_{L,1,2}$ and $MC_{L,2,2}$ in the second place . . . the memory cells $MC_{L,1,J-2}$ and $MC_{L,2,J-2}$ in the (J-2)-th place and the memory cells $MC_{L,1,J-1}$ and $MC_{L,2,J-1}$ in the (J-1)-th place, without external addressing (without externally designating any address).

Figure 8:
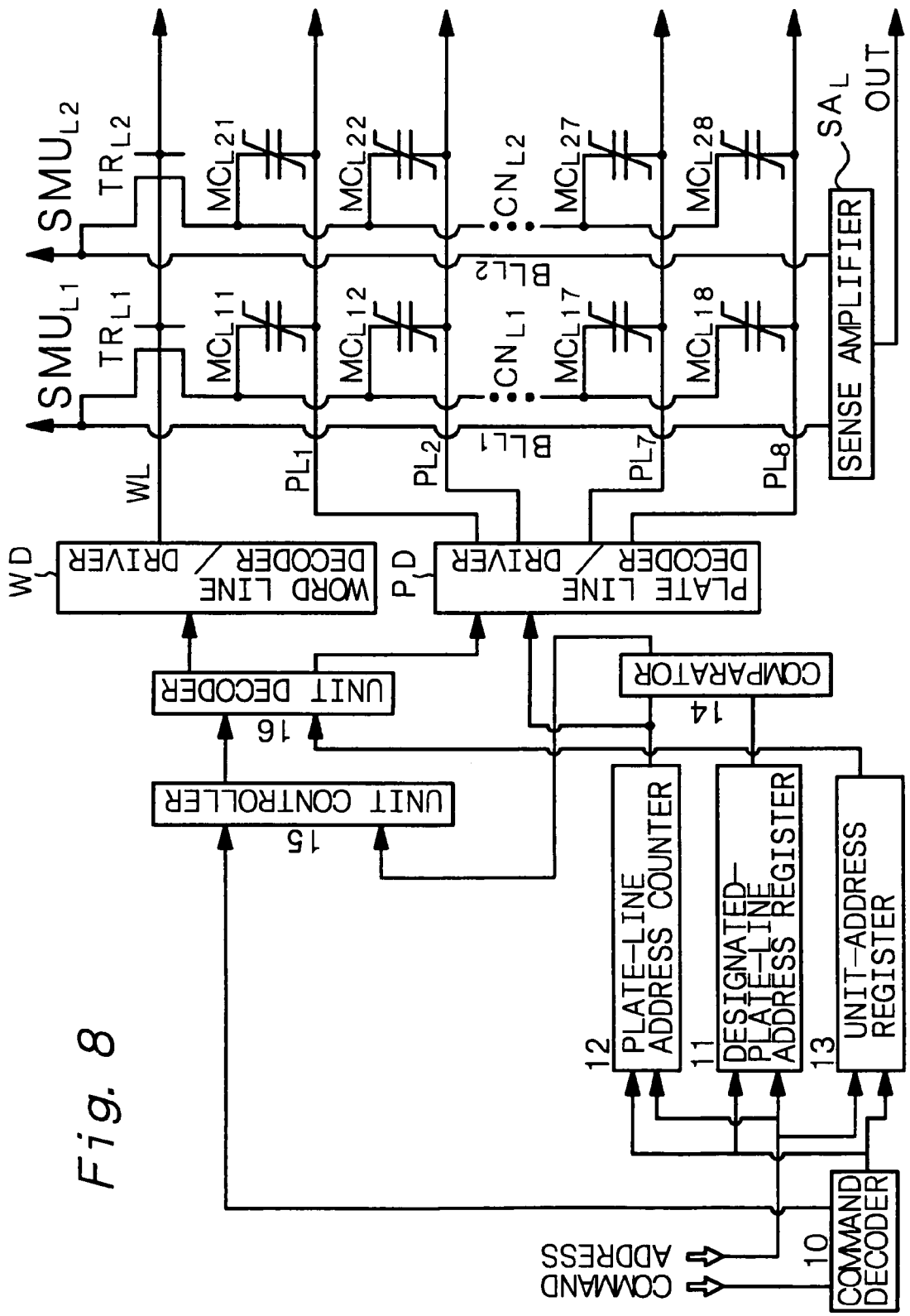
FIG. 8 is an equivalent circuit diagram of a ferroelectric-type nonvolatile semiconductor memory in Example 2.

The operation method in Example 5 will be explained below with reference to FIGS. 3 and 8 and FIG. 11 showing operation waveforms.

[Step-500]

First, ACT command is inputted to the command decoder 10, and an address (RAS address) for designating a sub-memory unit and a memory cell is inputted together. The above RAS address is separated into a higher component and a lower component with a shift register (not shown). The higher component for designating the address $AD_J$ of the memory cells $MC_{L1J}$ and $MC_{L2J}$ is latched in the designated-plate-line address register 11 and the plate-line address counter 12. The lower component for designating the address of the sub-memory units $SMU_{L1}$ and $SMU_{L2}$ is latched in the unit-address register 13. The higher component designating the address $AD_J$ of the memory cells $MC_{L1J}$ and $MC_{L2J}$, which is latched in the designated-plate-line address register 11, will be referred to as an address "J", the higher component designating the address of the memory cells $MC_{L1J}$ and $MC_{L2J}$, which is latched in the plate-line address counter 12, will be referred to as an address "j" (=J), and the lower component designating the address of the sub-memory unit $SMU_{L1}$ and $SMU_{L2}$, which is latched in the unit-address register 13, will be referred to as an address "L". And, data stored in the memory cells $MC_{L1J}$ and $MC_{L2J}$ designated by the address $AD_J$ is read out and latched in the sense amplifier $SA_L$.

[Step-510]

Further, upon input of WRITE command, the command decoder 10 transmits a signal to a sense amplifier control circuit (not shown) and executes the process of latching data from an outside in the sense amplifier $SA_L$. That is, update of data in the sense amplifier $SA_L$ is performed.

In the above steps, a plurality of sub-memory units and memory cells connected to the same word line and the same plate line may be selected. That is, there may be employed a constitution in which, first, data in a plurality of sense amplifiers are latched according to ACT command, and burst-writing in the sense amplifiers is performed according to NOP command after WRITE command.

[Step-520]

Then, RAS_INC command is inputted to the command decoder 10, and according to the above command, the unit controller 15, which has received a signal from the command decoder 10, transmits a signal to the unit decoder 16 to activate the unit decoder 16. In addition, the unit decoder 16, which has received a signal from the unit-address register 13, selects the sub-memory units $SMU_{L1}$ and $SMU_{L2}$. A signal from the plate-line address counter 12 is transmitted to the plate line decoder/driver PD. By the above operation, the word line decoder/driver WD and the plate line decoder/driver PD are activated, and further, the plate line $PL_J$ is selected by the plate line decoder/driver PD. And, the data latched in the sense amplifier $SA_L$ is written into the memory cells $MC_{L1J}$ and $MC_{L2J}$.

[Step-530]

Then, data are written into other memory cells $MC_{L1j}$ and $MC_{L2j}$ (specifically, $MC_{L1k}$ and $MC_{L2k}$) constituting the sub-memory units $SMU_{L1}$ and $SMU_{L2}$ without external addressing (without externally designating any address). Specifically, the plate-line address counter 12 is incremented, and the value of the plate-line address counter 12 and the value of the designated-plate-line address register 11 are compared with the comparator 14. If the values are the same, the operation is finished. If the values are not the same, it is judged whether or not the value of the plate-line address counter 12 is over the value of "M". If it is over the value of "M", the value of the plate-line address counter 12 is re-set to be "1". And, data from the memory cell is latched in the sense amplifier $SA_L$. That is, data is once read out into the sense amplifier, and then the data is written into the memory cell.

The operations of the above [Step-510] to [Step-530] are performed in all of other memory cells $MC_{L1k}$ and $MC_{L2k}$ constituting the sub-memory units $SMU_{L1}$ and $SMU_{L2}$ without external addressing (without externally designating any address). That is, data are written into the memory cells consecutively in the order of the memory cells $MC_{L,1,J+1}$ and $MC_{L,2,J+1}$ in the (J+1)-th place, the memory cells $MC_{L,1,J+2}$ and $MC_{L,2,J+2}$ in the (J+2)-th place . . . , the memory cells $MC_{L,1,M}$ and $MC_{L,2,M}$ in the M-th place, the memory cells $MC_{L,1,1}$ and $MC_{L,2,1}$ in the first place, the memory cells $MC_{L,1,2}$ and $MC_{L,2,2}$ in the second place . . . the memory cells $MC_{L,1,J-2}$ and $MC_{L,2,J-2}$ in the (J-2)-th place and the memory cells $MC_{L,1,J-1}$ and $MC_{L,2,J-1}$ in the (J-1)-th place.

In the end of the operation, the comparator 14 notifies the unit controller 15 to that effect, and the unit controller 15 deactivates the unit decoder 16 and brings the word lines WL and all of the plate lines $PL_M$ back to a non-selected state.

By the above steps, any memory cell can be rapidly accessed. Further, data can be written into other memory cells in the same sub-memory unit.

The operation of writing data into the nonvolatile memory in Example 5 will be explained below with reference to FIG. 11 showing operation waveforms. As an example, it is assumed that data "1" and data "0" are written into the memory cells $MC_{L11}$ and $MC_{L21}$, respectively, connected to the plate line $PL_1$. In the drawing showing operation waveforms, parenthesized numerals correspond to Nos. of steps to be explained below.

(1) In a standby state, the word line and all of the plate lines have 0 volt. Further, the bit lines $BL_{L1}$ and $BL_{L2}$ are equalized to have 0 volt. The sense amplifier $SA_L$ has data to be written.

(2) When writing of data in [Step-520] is started, a high potential $V_{BL-H}$ (=$V_{cc}$) is applied to the bit line $BL_{L1}$, and a low potential $V_{BL-L}$ (=0 volt) is applied to the bit line $BL_{L2}$. The above $V_{cc}$ is a power source voltage.

(3) Then, the word line WL is brought into a high level, thereby to bring the transistors for selection $TR_{L1}$ and $TR_{L2}$ into an ON-state. At the same time, a high potential $V_{BL-H}$ (=$V_{cc}$) is applied to the selected plate line $PL_1$, and an intermediate potential $V_{PL-M}$ [=(½)$V_{cc}$] is applied to the non-selected plate lines $PL_k$ (k=2, 3 . . . 8). By this operation, the selected plate line $PL_1$ has a high potential $V_{PL-H}$ and the bit line $BL_{L2}$ has a low potential $V_{BL-L}$, so that data "0" is written into the memory cell $MC_{L21}$.

(4) Then, the selected plate line $PL_1$ is brought to a level of a low potential $V_{PL-L}$ (=0 volt). By this operation, the selected plate line $PL_1$ has a low potential $V_{PL-L}$ and the bit line $BL_{L1}$ has a high potential $V_{BL-H}$, so that data "1" is written into the memory cell $MC_{L11}$.

(5) Then, the word line WL is brought into a low level, to bring the transistors for selection $TR_{L1}$ and $TR_{L2}$ into an OFF-state. Then, the bit line $BL_{L1}$ is discharged to 0 volt, and the non-selected plate lines $PL_k$ (k=2, 3 . . . 8) are discharged to 0 volt.

(6) Thereafter, the operations in steps (1) to (5) are performed with regard to the memory cells ($MC_{L1m}$, $MC_{L2m}$) (m=2, 3 . . . 8).

EXAMPLE 6

Figure 4:
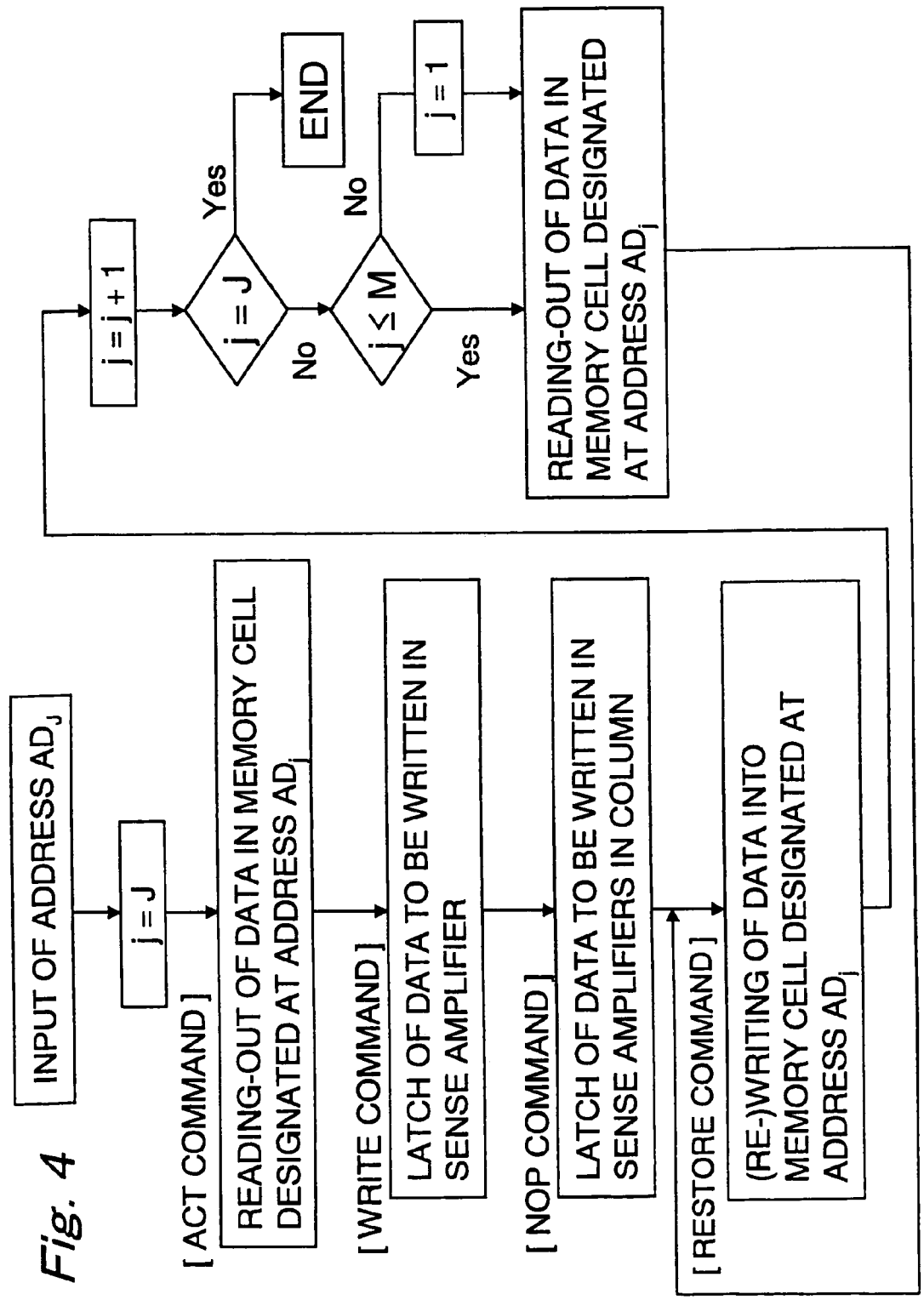
FIG. 4 is a flow chart of an operation method of a ferroelectric-type nonvolatile semiconductor memory in Example 6.

Example 6 is also concerned with the nonvolatile memory operation method according to the second aspect of the present invention and the nonvolatile memory of the present invention. More specifically, it is concerned with the nonvolatile memory operation method according to No. 2B constitution. FIG. 4 shows a flow chart of the nonvolatile memory operation method of Example 6. While Example 6 also uses a nonvolatile memory having an equivalent circuit diagram shown in FIG. 8, there may be used a nonvolatile memory having an equivalent circuit diagram shown in FIG. 5 or FIG. 10.

In the nonvolatile memory operation method in Example 6, data latched in the sense amplifier $SA_L$ is written into the memory cells $MC_{L1J}$ and $MC_{L2J}$ at the designated address, data stored in other memory cells $MC_{L1k}$ and $MC_{L2k}$ constituting a sub-memory unit are read out without external addressing (without externally designating any address) and latched in the sense amplifier $SA_L$, and then the data latched in the sense amplifier $SA_L$ are re-written into the other memory cells $MC_{L1k}$ and $MC_{L2k}$. In Example 6, data is written only into the memory cells $MC_{L1J}$ and $MC_{L2J}$ at the designated address, and reading-out and re-writing of data are carried out in the other memory cells $MC_{L1k}$ and $MC_{L2k}$. In all of the other memory cells constituting the sub-memory units $SMU_{L1}$ and $SMU_{L2}$, data are read out from and re-written into the memory cells consecutively, that is, in the order of the memory cells $MC_{L,1,J+1}$ and $MC_{L,2,J+1}$ in the (J+1)-th place, the memory cells $MC_{L,1,J+2}$ and $MC_{L,2,J+2}$ in the (J+2)-th place . . . , the memory cells $MC_{L,1,M}$ and $MC_{L,2,M}$ in the M-th place, the memory cells $MC_{L,1,1}$ and $MC_{L,2,1}$ in the first place, the memory cells $MC_{L,1,2}$ and $MC_{L,2,2}$ in the second place . . . the memory cells $MC_{L,1,J-2}$ and $MC_{L,2,J-2}$ in the (J-2)-th place and the memory cells $MC_{L,1,J-1}$ and $MC_{L,2,J-1}$ in the (J-1)-th place.

In the nonvolatile memory operation method in Example 6, substantially, [Step-500] and [Step-510] in Example 5 and [Step-140] in Example 1 can be consecutively carried out as shown in the flow chart of FIG. 4, so that a detailed explanation thereof is omitted.

While the present invention is explained with reference to Examples hereinabove, the present invention shall not be limited thereto. The structures of the nonvolatile memories, the materials used, the various forming conditions, the circuit constitutions, the operation methods, etc., which are explained in Examples, are give for an illustrative purpose, and may be changed or altered as required.

In the nonvolatile memory operation method explained in each of Examples 1 to 4, No. 1A constitution and No. 1B constitution may be combined. In this case, it is made possible to drive a nonvolatile memory flexibly and at high degrees of freedom. That is, there may be employed a constitution in which the operation method according to No. 1B constitution is carried out with regard to a predetermined number of memory cells starting at the memory cell $MC_{J+1}$ in the (J+1)-th place, and then, the operation method according to No. 1A constitution is carried out with regard to the remaining other memory cells. Specifically, RAS_INC command is executed a predetermined or desired number of times, and then RESTORE command is executed with regard to the remaining other memory cells. Alternatively, there may be employed a constitution in which the operation method according to No. 1A constitution is carried out with regard to a predetermined number of memory cells starting at the memory cell $MC_{J+1}$ in the (J+1)-th place, and the operation method according to No. 1B constitution is carried out with regard to the remaining other memory cells. Specifically, the execution of RESTORE command is discontinued in the middle of the operation, and RAS_INC command is executed with regard to the remaining other memory cells.

In the nonvolatile memory operation method explained in each of Examples 5 and 6, No. 2A constitution and No. 2B constitution may be combined. In this case, it is made possible to drive a nonvolatile memory flexibly and at high degrees of freedom. That is, there may be employed a constitution in which the operation method according to No. 2B constitution is carried out with regard to a predetermined number of memory cells starting at the memory cell $MC_{J+1}$ in the (J+1)-th place, and then, the operation method according to No. 2A constitution is carried out with regard to the remaining other memory cells. Specifically, RAS_INC command is executed a predetermined or desired number of times, and then RESTORE command is executed with regard to the remaining other memory cells. Alternatively, there may be employed a constitution in which the operation method according to No. 2A constitution is carried out with regard to a predetermined number of memory cells starting at the memory cell $MC_{J+1}$ in the (J+1)-th place, and the operation method according to No. 2B constitution is carried out with regard to the remaining other memory cells. Specifically, the execution of RESTORE command is discontinued in the middle of the operation, and RAS_INC command is executed with regard to the remaining other memory cells.

Various variants of structure of a nonvolatile memory will be explained below, while these nonvolatile memories can be operated by operation methods similar to the operation methods explained in Examples, so that detailed explanations of the operation methods are omitted. In FIGS. 12 to 25, showing of suffixes "L" designating an address of a sub-memory unit is omitted. In FIGS. 13, 14, 16, 17, 22 and 25, further, showing of the command decoder 10, etc., is omitted.

Figure 12:
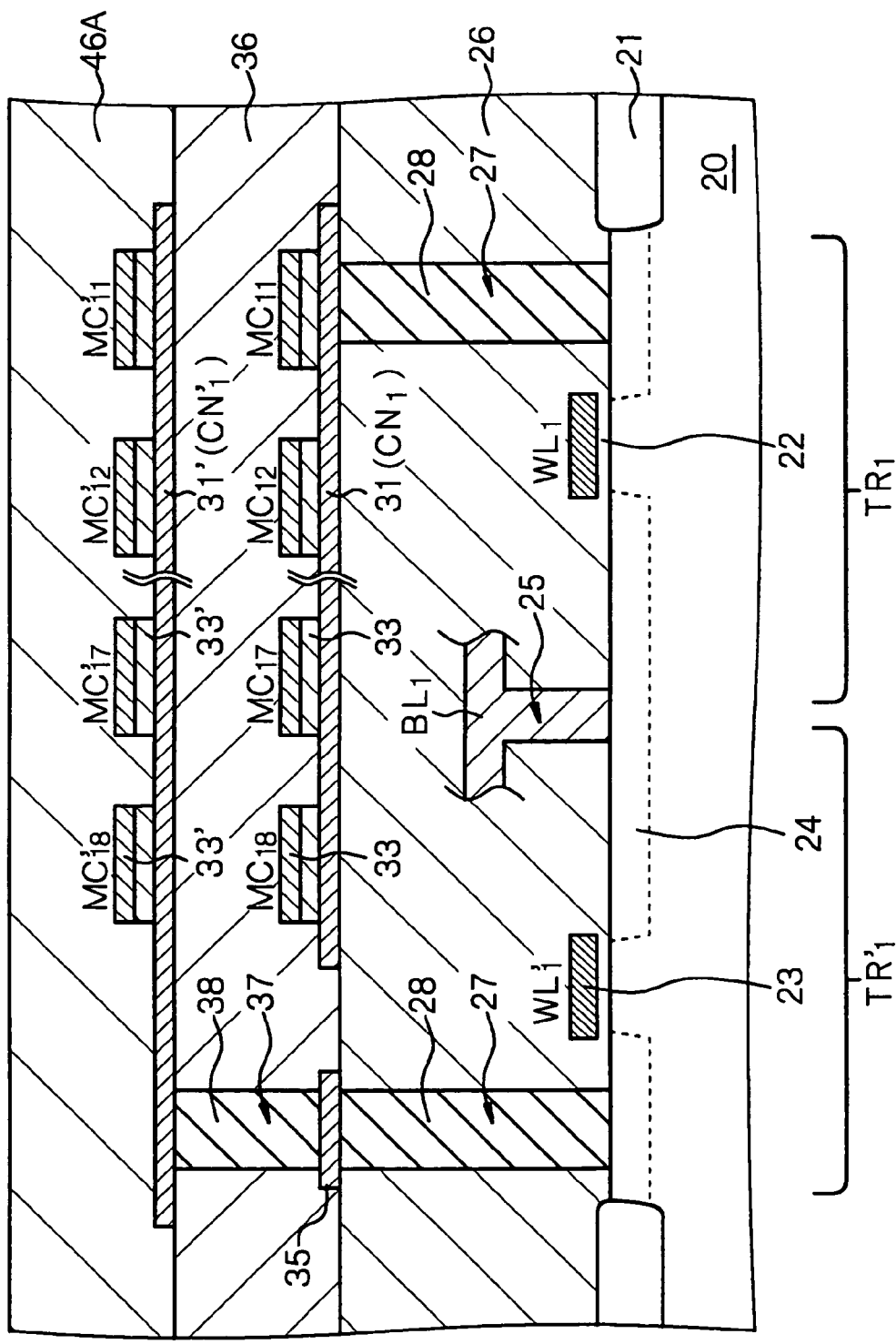
FIG. 12 is a schematic partial cross-sectional view of a memory unit of the ferroelectric-type nonvolatile semiconductor memory whose equivalent circuit diagram is shown in FIG. 8.

For example, a nonvolatile memory having an equivalent circuit diagram shown in FIG. 8 has a constitution in which a first memory unit and a first memory unit constituting a nonvolatile memory contiguous to the above nonvolatile memory in the extending direction of the first bit line $BL_{L1}$ are stacked with an insulating interlayer 36 interposed between them, and a second memory unit constituting the nonvolatile memory and a second memory unit constituting the nonvolatile memory contiguous to the above nonvolatile memory in the extending direction of the second bit line $BL_{L2}$ are stacked with the insulating interlayer 36 interposed between them. FIG. 12 shows a schematic partial cross-sectional view of the above nonvolatile memory. In FIG. 12, however, the first memory units alone are shown. The second memory units are contiguous to the first memory units in the direction perpendicular to the paper surface of FIG. 12. In addition, ['] is added to reference numerals that indicate elements of the first memory unit constituting the nonvolatile memory and being contiguous in the extending direction of the first bit line $BL_{L1}$.

More specifically, in the nonvolatile memory shown in FIG. 12, a transistor for selection $TR_1$, $TR'_1$, constituted of a MOS type FET is formed in an active region surrounded by a device isolation region 21 formed in a p-type silicon semiconductor substrate 20 and made of a LOCOS structure, a shallow trench structure or a combination of a LOCOS structure and a shallow trench structure. The transistor for selection $TR_1$, $TR'_1$ comprises a gate insulating layer 22 formed on the surface of the silicon semiconductor substrate 20 and made, for example, of a silicon oxide film, a gate electrode 23 (which also works as a word line $WL_1$, $WL'_1$) formed on the gate insulating layer 22, and source/drain regions 24 that are formed in the active region of the silicon semiconductor substrate 20 and contain an $n^+$ type impurity.

And, the bit line $BL_1$ is formed on a lower insulating layer formed on the entire surface, and the bit line $BL_1$ is connected to one source/drain region 24 of the transistor for selection $TR_1$, $TR'_1$ through a contact hole 25 made through the lower insulating layer. Further, an upper insulating layer is formed on the lower insulating layer including the bit line $BL_1$. In the drawings, the lower insulating layer and the upper insulating layer are collectively shown as an insulating layer 26. Further, the bit line $BL_1$ is extending leftward and rightward on FIG. 12 so as not to be in contact with a contact hole 28 to be described later.

A first electrode (lower electrode) 31 is formed on the insulating layer 26, a ferroelectric layer 32 is formed on the first electrode 31, a second electrode (upper electrode) 33 is formed on the ferroelectric layer 32, and these constitute the memory cells $MC_{1M}$. The first electrodes 31 are in common with the memory cells $MC_{1M}$ and have a stripe-shaped plan form. The first electrode 31 is connected to the other source/drain region 24 of the transistor for selection $TR_1$ through a contact hole 28 made in an opening portion 27 formed through the insulating layer 26. The common first electrode 31 is shown as a common node $CN_1$. The ferroelectric layer 32 is formed so as to have nearly the same pattern as that of the second electrode 33.

Further, an insulating interlayer 36 is formed on the memory cells $MC_{1M}$ and the insulating layer 26. A first electrode (lower electrode) 31' is formed on the insulating interlayer 36, a ferroelectric layer 32' is formed on the first electrode 31', a second electrode (upper electrode) 33' is formed on the ferroelectric 32', and these constitute the memory cells $MC'_{1M}$. The first electrodes 31' are in common with the memory cells $MC'_{1M}$ and have a stripe-shaped plan form. The first electrode 31' is connected to the other source/drain region 24 of the transistor for selection $TR'_1$ through a contact hole 38 made in an opening portion 37 formed through the insulating interlayer 36, a pad portion 35 formed on the insulating layer 26 and a contact hole 28 formed in the opening portion 27 made through the insulating layer 26. The common first electrode 31' is shown as a common node $CN'_1$. The ferroelectric layer 32' is formed so as to have nearly the same pattern as that of the second electrode 33'. Further, an upper insulating layer 46A is formed on the memory cells $MC'_{1M}$ and the insulating interlayer 36.

The word line $WL_1$, $WL'_1$ is extending in the direction perpendicular to the paper surface of FIG. 12. Further, the second electrodes 33, 33' are shared with the memory cells $MC_{2m}$, $MC'_{2m}$ contiguous in the direction perpendicular to the paper surface of FIG. 12, and also works as a plate line $PL_m$. Further, the memory cells $MC_{1M}$ and the memory cells $MC'_{1M}$ are aligned in the perpendicular direction. Such a structure serves to decrease the area that the memory cells occupy and can improve the degree of integration.

Figure 10:
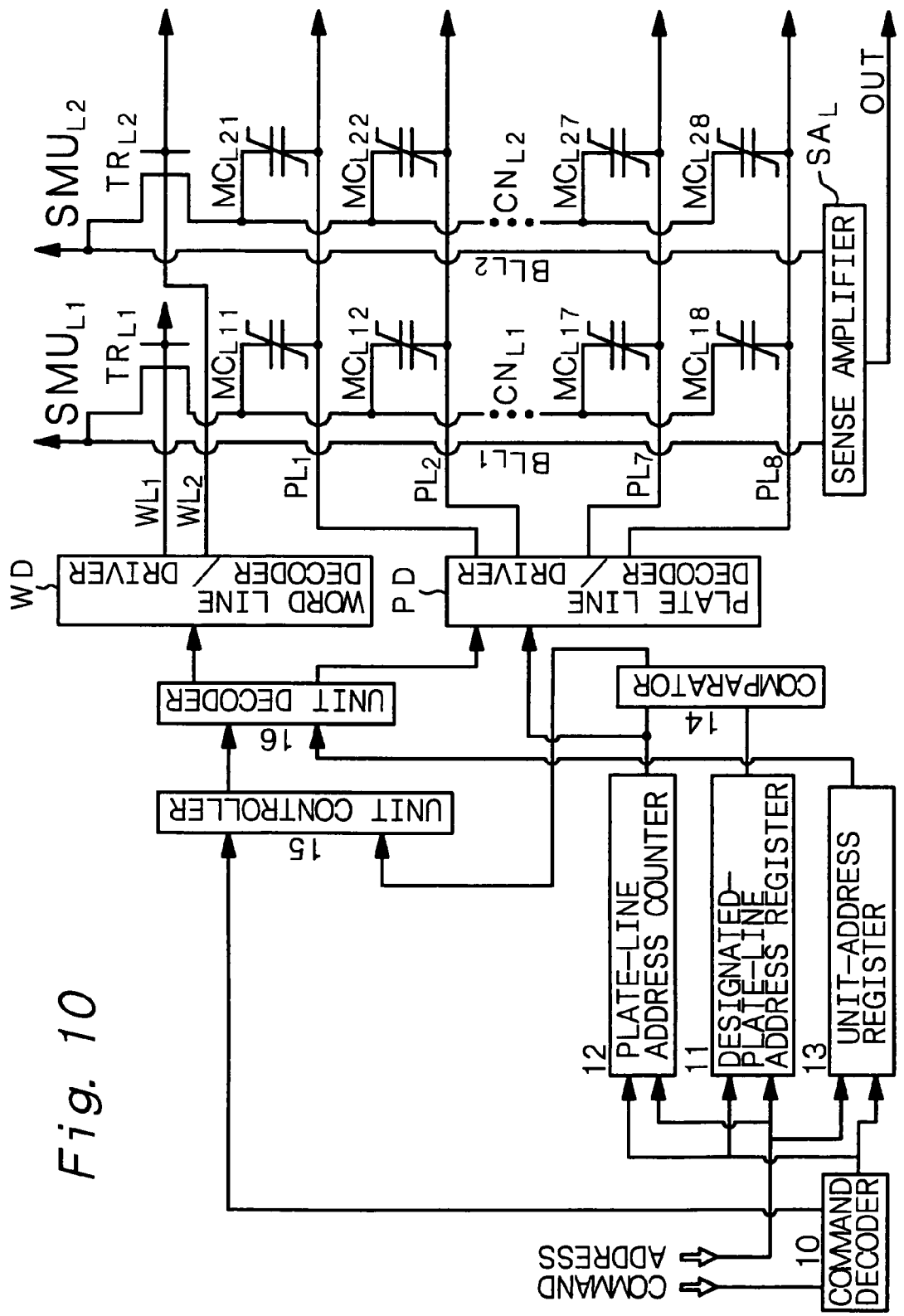
FIG. 10 is an equivalent circuit diagram of a ferroelectric-type nonvolatile semiconductor memory in Example 3.
Figure 11:
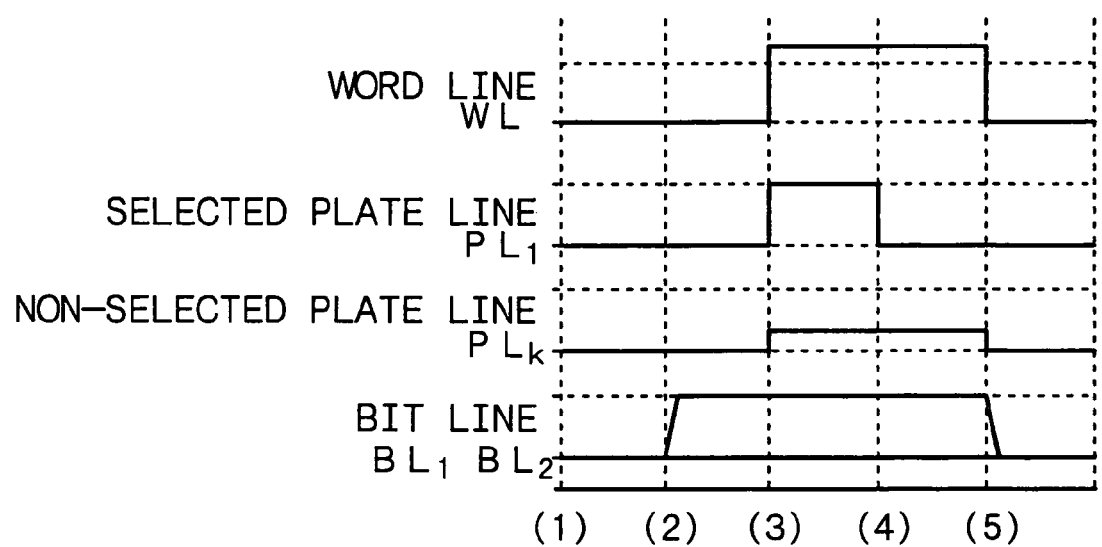
FIG. 11 is a diagram for showing waveforms in operations in a ferroelectric-type nonvolatile semiconductor memory in Example 5 and a ferroelectric-type nonvolatile semiconductor memory disclosed in JP-A-9-121032.
Figure 13:
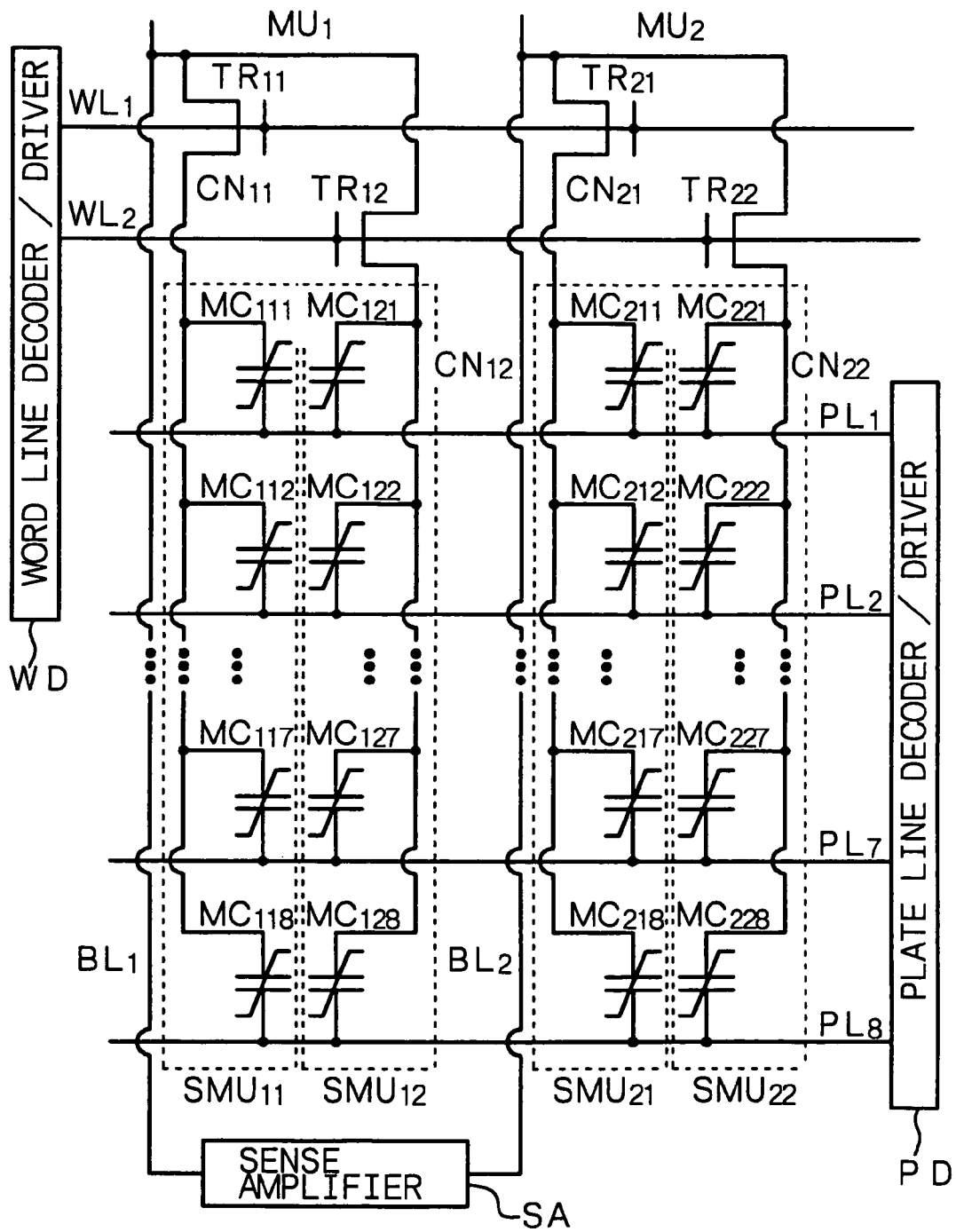
FIG. 13 is an equivalent circuit diagram of a variant of the ferroelectric-type nonvolatile semiconductor memory whose equivalent circuit diagram is shown in FIG. 8.
Figure 14:
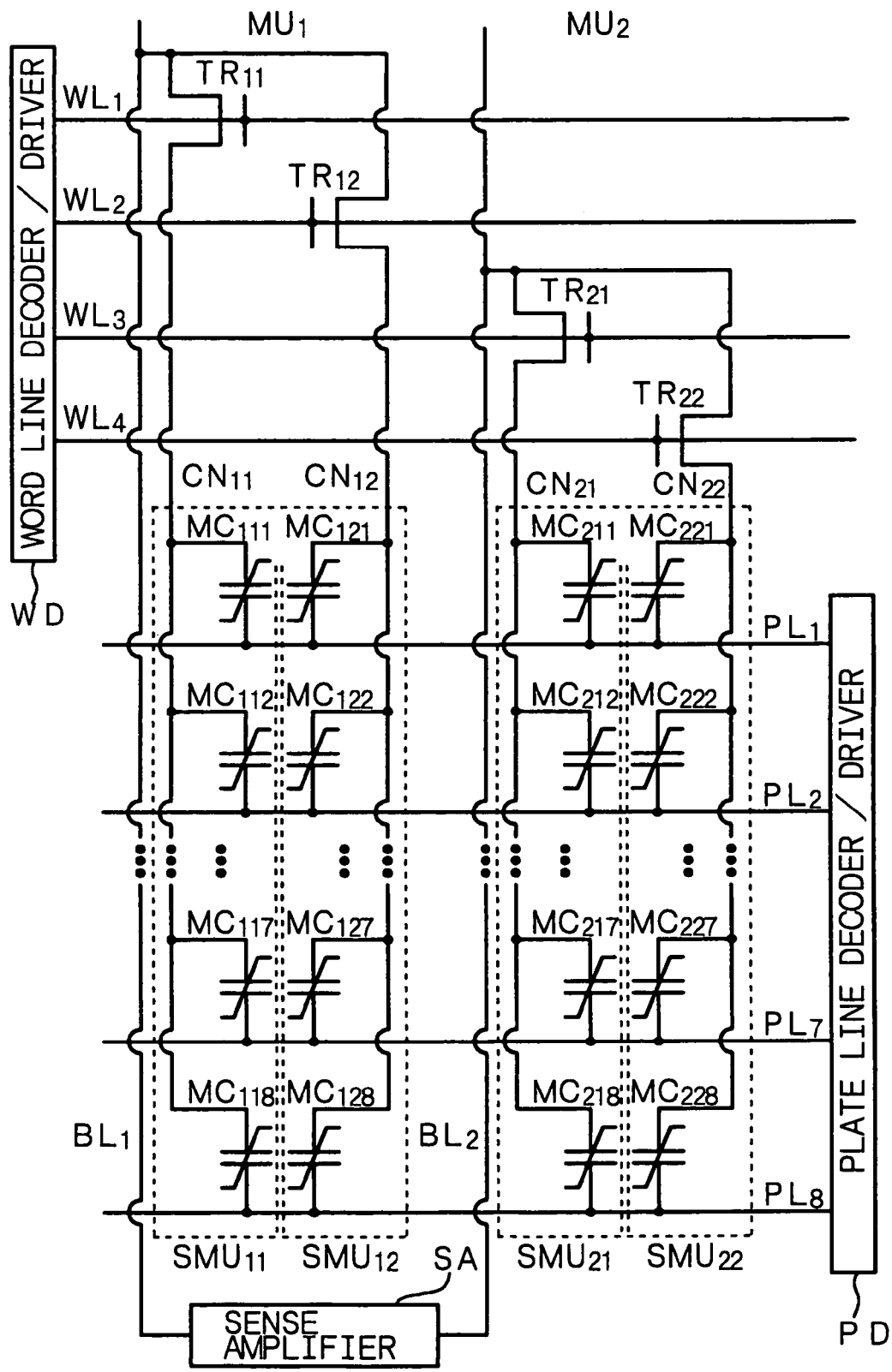
FIG. 14 is an equivalent circuit diagram of a variant of the ferroelectric-type nonvolatile semiconductor memory whose equivalent circuit diagram is shown in FIG. 10.
Figure 15:
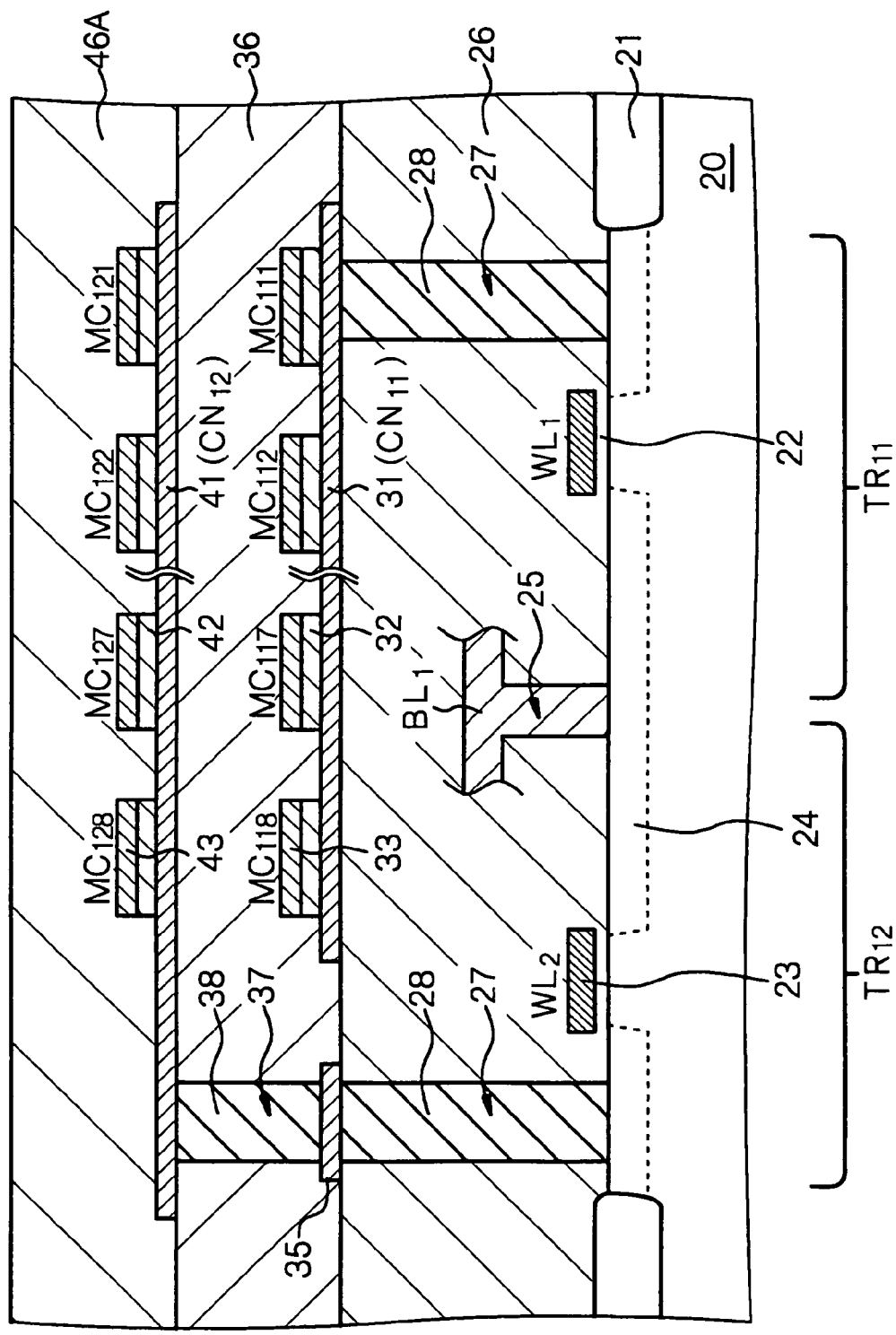
FIG. 15 is a schematic partial cross-sectional view of a memory unit of the ferroelectric-type nonvolatile semiconductor memory whose equivalent circuit diagram is shown in FIG. 13 or 14.

FIGS. 13 and 14 show equivalent circuit diagrams of variants of the nonvolatile memories having equivalent circuit diagrams shown in FIGS. 8 and 10. FIG. 15 shows a schematic partial cross-sectional view of such nonvolatile memories.

In the nonvolatile memory having an equivalent circuit diagram shown in FIG. 13, gate electrodes of transistors for selection $TR_{11}$, $TR_{21}$, connected to sub-memory units $SMU_{11}$ and $SMU_{21}$, are connected to a word line $WL_1$, and gate electrodes of transistors for selection $TR_{12}$ and $TR_{22}$, connected to sub-memory units $SMU_{12}$ and $SMU_{22}$, are connected to a word line $WL_2$. In the nonvolatile memory having an equivalent circuit diagram shown in FIG. 14, gate electrodes of transistors for selection $TR_{11}$, $TR_{12}$, $TR_{21}$ and $TR_{22}$, connected to sub-memory units $SMU_{11}$, $SMU_{12}$, $SMU_{21}$ and $SMU_{22}$, are connected to word lines $WL_1$, $WL_2$, $WL_3$ and $WL_4$.

The above nonvolatile memory comprises a first memory unit $MU_1$ and a second memory unit $MU_2$.

The first memory unit $MU_1$ comprises;

(A-1) a first bit line $BL_1$, (B-1) first transistor(s) for selection $TR_{1N}$ that are N ($N \geq 1$, specifically, N=2 in a shown example) in number, (C-1) first sub-memory unit(s) $SMU_{1N}$ that are N ($N \geq 1$; N=2 in the shown example) in number, each of which is composed of first memory cells $MC_{1nM}$ (n=1, 2 ... N) that are M ($M \geq 2$; M=8 in the shown example) in number, and (D-1) plate lines $PL_m$ that are M in number, each plate line $PL_m$ being shared with each first memory cell $MC_{1nm}$ (m=1, 2 ... M) constituting each of the sub-memory units $SMU_{1N}$ that are N in number.

The second memory unit $MU_2$ comprises;

(A-2) a second bit line $BL_2$, (B-2) second transistor(s) for selection $TR_{2N}$ that are N in number, (C-2) second sub-memory unit(s) $SMU_{2N}$ that are N in number, each of which is composed of second memory cells $MC_{2nM}$ that are M in number, and (D-2) the plate lines $PL_m$ that are M in number, each plate line $PL_m$ being shared with each second memory cell $MC_{2nm}$ constituting each of the sub-memory units $SMU_{2N}$ that are N in number, said plate lines being shared with the plate lines $PL_m$ that are M in number and constitute said first memory unit $MU_1$.

In the schematic partial cross-sectional view of FIG. 15, the above second bit line $BL_2$, the above second transistors for selection $TR_{21}$ and $TR_{22}$ and the above second memory unit MU2 are contiguous to the first bit line $BL_1$, the first transistors for selection $TR_{11}$ and $TR_{12}$ and the first memory unit $MU_1$ in the direction perpendicular to the paper surface of FIG. 15.

Each memory cell $MC_{1nm}$ (m=1, 2 ... M, n=1, 2 ... N; and in a shown example, m=1, 2 ... 8 and n=1, 2) comprises a first electrode (lower electrodes) 31, 41, a ferroelectric layer 32, 42 and a second electrode (upper electrodes) 33, 43. In the first memory unit $MU_1$, the first electrodes 31, 41 of the first cell $MC_{1nm}$ constituting the first sub-memory unit $SMU_{1n}$ in the n-th place (n=1, 2 ... N) are in common with the n-th place first sub-memory unit $SMU_{1n}$. The above common first electrode 31, 41 (to be sometimes referred to as "common node $CN_{1n}$") is connected to the first bit line $BL_1$ through the n-th place first transistor for selection $TR_{1n}$, and each second electrode 33, 43 is connected to each shared plate line $PL_m$. In the second memory unit $MU_2$, the first electrodes 31, 41 of the second memory cell $MC_{2nm}$ constituting the n-th place second sub-memory unit $SMU_{2n}$ are in common with the n-th place second sub-memory unit $SMU_{2n}$. The above common first electrode 31, 41 (to be sometimes referred to as "common node $CN_{2n}$") is connected to the second bit line $BL_2$ through the n-th place second transistor for selection $TR_{2n}$, and each second electrode 33, 43 is connected to each shared plate line $PL_m$.

The number of the memory cells for constituting the memory unit of the nonvolatile memory is not limited to 8, and it can be 2×M (M=1, 2, 3 ... ). Preferably, it is an exponent of 2 (2, 4, 8, 16, 32 ... ).

The plate line $PL_m$ in the memory cells $MC_{11m}$, $MC_{12m}$, $MC_{21m}$ and $MC_{22m}$ is shared with these memory cells and is connected to the plate line decoder/driver PD. Further, the gate electrode of the first transistor for selection $TR_{11}$ and the gate electrode of the second transistor for selection $TR_{21}$ are connected to the word line $WL_1$, the gate electrode of the first transistor for selection $TR_{12}$ and the gate electrode of the second transistor for selection $TR_{22}$ are connected to the word line $WL_2$, and the word lines $WL_1$ and $WL_2$ are connected to the word line decoder/driver WD. Further, the first bit line $BL_1$ and the second bit line $BL_2$ are connected to the sense amplifier SA.

In the nonvolatile memory shown in FIG. 15, the first sub-memory units $SMU_{11}$ and $SMU_{12}$ constituting the first memory unit $MU_1$ are stacked with an insulating interlayer 36 interposed between them, and the second sub-memory units $SMU_{21}$ and $SMU_{22}$ constituting the second memory unit $MU_2$ are stacked with the insulating interlayer 36 interposed between them. That is, the first-place sub-memory unit $SMU_{11}$ and the second-place sub-memory unit $SMU_{12}$, which constitute the first memory unit $MU_1$, are stacked with the insulating interlayer 36 interposed between them. Further, the first-place sub-memory unit $SMU_{21}$ and the second-place sub-memory unit $SMU_{22}$, which constitute the second memory unit $MU_2$, are also stacked with the insulating interlayer 36 interposed between them. Such a structure can serve to improve the degree of integration.

Particulars of the nonvolatile memory shown in FIG. 15 will be explained. The following explanation addresses the first memory unit $MU_1$, while the second memory unit $MU_2$ also has a similar structure.

More specifically, in the nonvolatile memory. shown in FIG. 15, each of the first transistors for selection $TR_{11}$ and $TR_{12}$ constituted of a MOS type FET each is formed in an active region surrounded by a device isolation region 21 formed in a p-type silicon semiconductor substrate 20 and made of a LOCOS structure, a shallow trench structure or a combination of a LOCOS structure and a shallow trench structure. The first transistor for selection $TR_{11}$, $TR_{12}$ comprises a gate insulating layer 22 formed on the surface of the silicon semiconductor substrate 20 and made, for example, of a silicon oxide film, a gate electrode 23 (which also works as a word line $WL_1$, WL2) formed on the gate insulating layer 22, and source/drain regions 24 that are formed in the active region of the silicon semiconductor substrate 20 and contain an $n^+$ type impurity.

And, the bit line $BL_1$ is formed on a lower insulating layer formed on the entire surface, and the bit line $BL_1$ is connected to one source/drain region 24 of the transistor for selection $TR_1$, $TR_2$ through a contact hole 25 made through the lower insulating layer. Further, an upper insulating layer is formed on the lower insulating layer including the bit line $BL_1$. In the drawing, the lower insulating layer and the upper insulating layer are collectively shown as an insulating layer 26. Further, the bit line $BL_1$ is extending leftward and rightward on FIG. 15 so as not to be in contact with a contact hole 28 to be described later.

A first electrode (lower electrode) 31 is formed on the insulating layer 26, a ferroelectric layer 32 is formed on the first electrode 31, a second electrode (upper electrode) 33 is formed on the ferroelectric layer 32, and these constitute the memory cells $MC_{11M}$ and further constitute the first-place sub-memory unit $SMU_{11}$. The first electrodes 31 are in common with the memory cells $MC_{11M}$ and have a stripe-shaped plan form. The first electrode 31 is connected to the other source/drain region 24 of the transistor for selection $TR_{11}$ through a contact hole 28 made in an opening portion 27 formed through the insulating layer 26. The common first electrode 31 is shown as a common node $CN_{11}$. The ferroelectric layer 32 is formed so as to have nearly the same pattern as that of the second electrode 33.

Further, an insulating interlayer 36 is formed on the memory cells $MC_{11M}$ (sub-memory unit $SMU_{11}$) and the insulating layer 26. A first electrode (lower electrode) 41 is formed on the insulating interlayer 36, a ferroelectric layer 42 is formed on the first electrode 41, a second electrode (upper electrode) 43 is formed on the ferroelectric layer 42, and these constitute the memory cells $MC_{12M}$ and further constitute the second-place sub-memory unit $SMU_{12}$. The first electrodes 41 are in common with the memory cells $MC_{12M}$ and have a stripe-shaped plan form. The first electrode 41 is connected to the other source/drain region 24 of the transistor for selection $TR_{12}$ through a contact hole 38 formed in an opening portion 37 made through the insulating interlayer 36, a pad portion 35 formed on the insulating layer 26, and a contact hole 28 made in an. opening portion 27 formed through the insulating layer 26. The common first electrode 41 is shown as a common node $CN_{12}$. The ferroelectric layer 42 is formed so as to have nearly the same pattern as that of the second electrode 43. Further, an upper insulating layer 46A is formed on the memory cells $MC_{12M}$ and the insulating interlayer 36.

The word lines $WL_1$ and $WL_2$ are extending in the direction perpendicular to the paper surface of FIG. 15. Further, the second electrode 33 is shared with the memory cell $MC_{21m}$ of the first-place sub-memory unit $SMU_{21}$ that is contiguous in the direction perpendicular to the paper surface of FIG. 15 and constitute the second memory unit $MU_2$, and the second electrode 33 also works as a plate line $PL_m$. Further, the second electrode 43 is also shared with the memory cell $MC_{22m}$ of the second-place sub-memory unit $SMU_{22}$ that is contiguous in the direction perpendicular to the paper surface of FIG. 15 and constitute the second memory unit $MU_2$, and the second electrode 43 also works as a plate line $PL_m$. The plate lines $PL_m$ shared by the memory cells $MC_{11m}$, $MC_{12m}$, $MC_{21m}$ and $MC_{22m}$ are extending in the direction perpendicular to the paper surface of FIG. 15 and are connected together through a contact hole in a region (not shown). Further, the memory cell $MC_{11M}$ and the memory cell $MC_{12M}$ are aligned in the perpendicular direction. The above structure can serve to decrease the area that the memory cells occupy, and it can improve the degree of integration.

Figure 16:
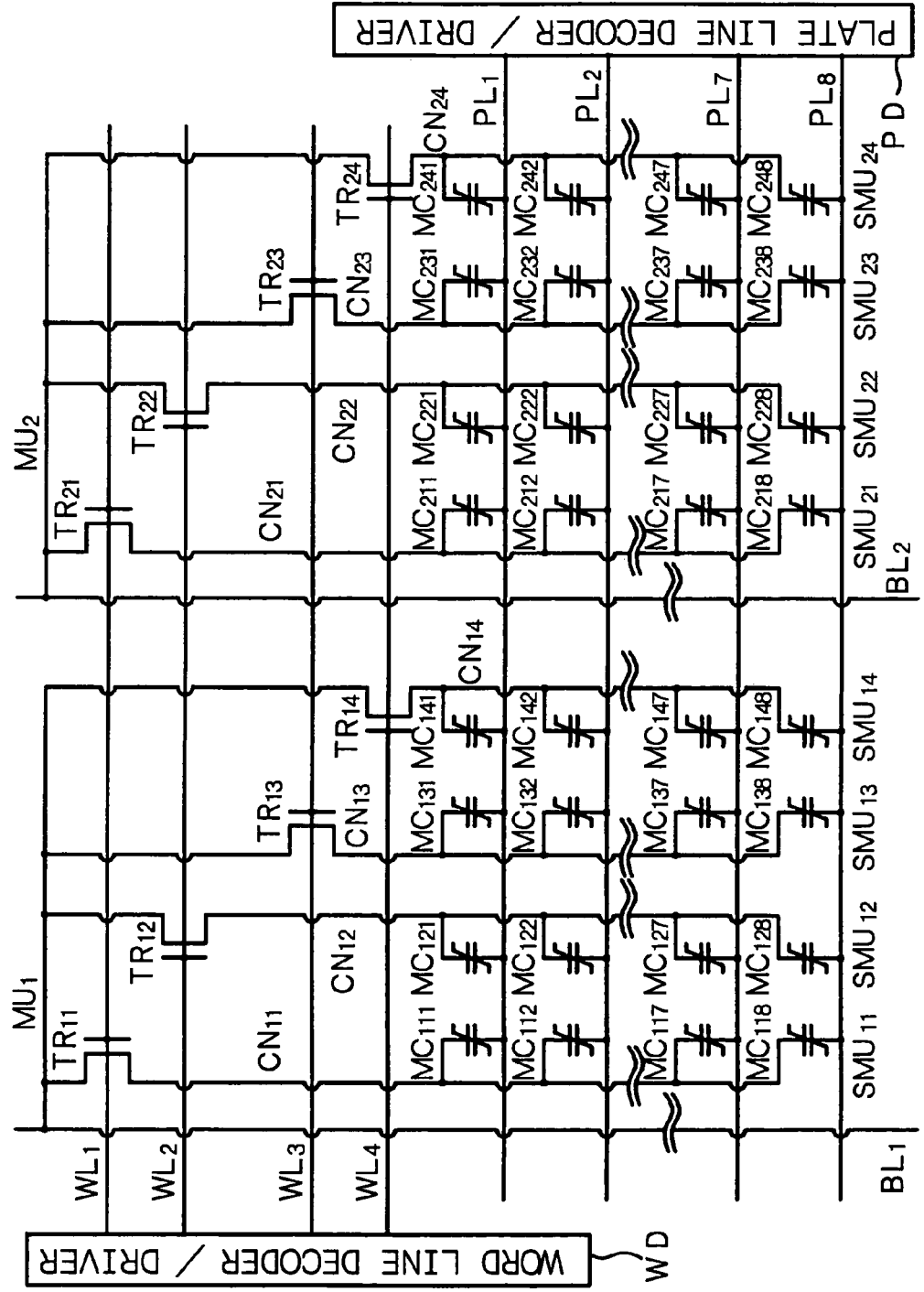
FIG. 16 is an equivalent circuit diagram of another variant of the ferroelectric-type nonvolatile semiconductor memory whose equivalent circuit diagram is shown in FIG. 8.
Figure 17:
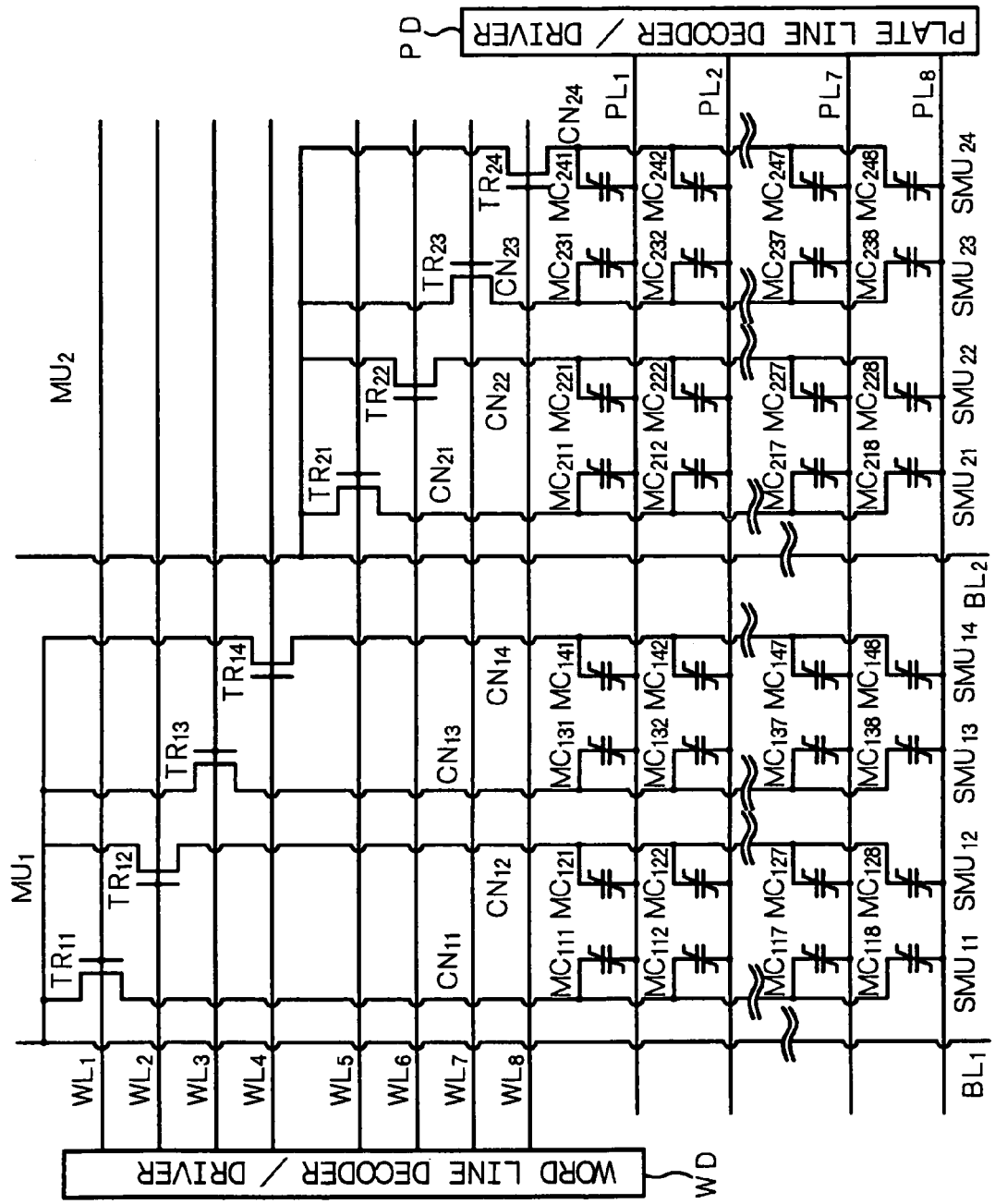
FIG. 17 is an equivalent circuit diagram of another variant of the ferroelectric-type nonvolatile semiconductor memory whose equivalent circuit diagram is shown in FIG. 10.
Figure 18:
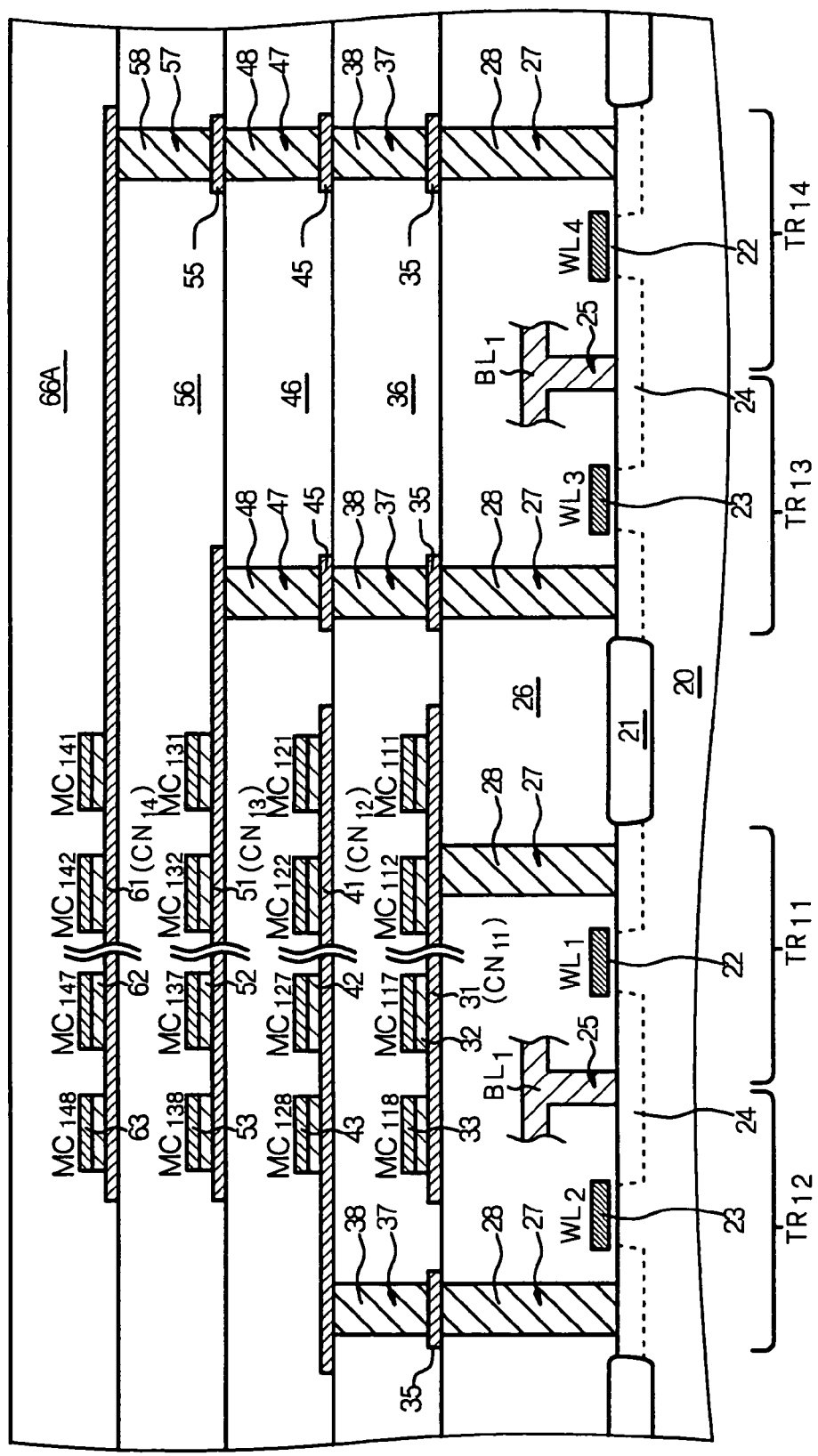
FIG. 18 is a schematic partial cross-sectional view of a memory unit of the ferroelectric-type nonvolatile semiconductor memory whose equivalent circuit diagram is shown in FIG. 16 or 17.

FIGS. 16 and 17 show variants of the nonvolatile memories having equivalent circuit diagrams shown in FIGS. 8 and 10, and FIG. 18 shows a schematic partial cross-sectional view of such nonvolatile memories.

In the nonvolatile memory having an equivalent circuit diagram shown in FIG. 16, the gate electrodes of the transistors for selection $TR_{11}$ and $TR_{21}$ connected to the sub-memory units $SMU_{11}$ and $SMU_{21}$ are connected to a word line $WL_1$, the gate electrodes of the transistors for selection $TR_{12}$ and $TR_{22}$ connected to the sub-memory units $SMU_{12}$ and $SMU_{22}$ are connected to a word line $WL_2$, the gate electrodes of the transistors for selection $TR_{13}$ and $TR_{23}$ connected to the sub-memory units $SMU_{13}$ and $SMU_{23}$ are connected to a word line $WL_3$, and the gate electrodes of the transistors for selection $TR_{14}$ and $TR_{24}$ connected to the sub-memory units $SMU_{14}$ and $SMU_{24}$ are connected to a word line $WL_4$. In the nonvolatile memory having an equivalent circuit diagram shown in FIG. 17, the gate electrodes of transistors for selection $TR_{11}$, $TR_{12}$, $TR_{13}$, $TR_{14}$, $TR_{21}$, $TR_{22}$, $TR_{23}$ and $TR_{24}$ connected to the sub-memory units $SMU_{11}$, $SMU_{12}$, $SMU_{13}$, $SMU_{14}$, $SMU_{21}$, $SMU_{22}$, $SMU_{23}$ and $SMU_{24}$ are connected to word lines $WL_1$, $WL_2$, $WL_3$, $WL_4$, $WL_5$, $WL_6$, $WL_7$, and $WL_8$. FIGS. 16 and 17 omit showing of a sense amplifier SA to which the first bit line $BL_1$ and second bit line $BL_2$ are connected.

In the above nonvolatile memory, the sub-memory unit $SMU_{11}$, $SMU_{12}$, $SMU_{13}$ and $SMU_{14}$ constituting the first memory unit $MU_1$ are stacked forming four stages. Although not shown, the sub-memory unit $SMU_{21}$, $SMU_{22}$, $SMU_{23}$ and $SMU_{24}$ constituting the second memory unit MU2 are also stacked forming four stages.

The above nonvolatile memory comprises a first memory unit $MU_1$ and a second memory unit $MU_2$.

The first memory unit $MU_1$ comprises;

(A-1) a first bit line $BL_1$, (B-1) first transistor(s) for selection $TR_{1N}$ ($TR_{11}$, $TR_{12}$, $TR_{13}$ and $TR_{14}$) that are N (N≧1; specifically, N=4 in a shown embodiment) in number, (C-1) first sub-memory unit(s) $SMU_{1N}$ ($SMU_{11}$, $SMU_{12}$, $SMU_{13}$ and $SMU_{14}$) that are N in number, each of which is composed of first memory cells $MC_{1nM}$ ($MC_{11M}$, $MC_{12M}$, $MC_{13M}$ and $MC_{14M}$) that are M ($M \geq 2$; M=8) in number, and (D-1) plate lines $PL_m$ that are M in number, each plate line $PL_m$ being shared with each first memory cell $MC_{1nm}$ ($MC_{11m}$, $MC_{12m}$, $MC_{13m}$ and $MC_{14m}$) constituting each of the sub-memory units $SMU_{1n}$ that are N in number.

The second memory unit $MU_2$ comprises;

(A-2) a second bit line $BL_2$, (B-2) second transistor(s) for selection $TR_{2N}$ ($TR_{21}$, $TR_{22}$, $TR_{23}$ and $TR_{24}$) that are N in number, (C-2) second sub-memory unit(s) $SMU_{2N}$ ($SMU_{21}$, $SMU_{22}$, $SMU_{23}$ and $SMU_{24}$) that are N in number, each of which is composed of second memory cells $MC_{2nM}$ ($MC_{21M}$, $MC_{22M}$, $MC_{23M}$ and $MC_{24M}$) that are M in number, and (D-2) the plate lines $PL_m$ that are M in number, each plate line $PL_m$ being shared with each second memory cell $MC_{2nm}$ ($MC_{21m}$, $MC_{22m}$, $MC_{23m}$ and $MC_{24}$m) constituting each of the sub-memory units $SMU_{2n}$ that are N in number, said plate lines being shared with the plate lines $PL_m$ that are M in number and constitute said first memory unit.

That is, in the above nonvolatile memory, the sub-memory units constituting the memory unit have a constitution of four layers. The number of the memory cells constituting each sub-memory unit is not limited to 8, and the number of the memory cells constituting each memory unit is not limited to 32, either.

Each memory cell comprises a first electrode, a ferroelectric and a second electrode. Specifically, each of the memory cell $MC_{11M}$ and the memory cell $MC_{21M}$ comprises a first electrode 31, a ferroelectric layer 32 and a second electrode 33. Further, each of the memory cell $MC_{12M}$ and the memory cell $MC_{22M}$ comprises a first electrode 41, a ferroelectric layer 42 and a second electrode 43. Further, each of the memory cell $MC_{13M}$ and the memory cell $MC_{23M}$ comprises a first electrode 51, a ferroelectric layer 52 and a second electrode 53. Each of the memory cell $MC_{14M}$ and the memory cell $MC_{24M}$ comprises a first electrode 61, a ferroelectric 62 and a second electrode 63.

In the first memory unit $MU_1$, the first electrodes 31, 41, 51, 61 of the first memory cells $MC_{1nm}$ constituting the first sub-memory unit $SMU_{1n}$ in the n-th place (n=1, 2 ... N) are in common with the n-th place first sub-memory unit $SMU_{1n}$, the above common first electrode 31, 41, 51, 61 is connected to the first bit line $BL_1$ through the n-th place first transistor for selection $TR_{1n}$, and each second electrode 33, 43, 53, 63 is connected to each shared plate line $PL_m$.

In the second memory unit $MU_2$, the first electrodes 31, 41, 51, 61 of the second memory cells $MC_{2nm}$ constituting the n-th place second sub-memory unit $SMU_{2n}$ are in common with the n-th place second sub-memory unit $SMU_{2n}$, and the above common first electrode 31, 41, 51, 61 is connected to the second bit line $BL_2$ through the n-th place second transistor for selection $TR_{2n}$, and each second electrode 33, 43, 53, 63 is connected to each shared plate line $PL_m$.

More specifically, in the nonvolatile memory shown in FIG. 18, each of first transistors for selection $TR_{11}$, $TR_{12}$, $TR_{13}$ and $TR_{14}$ constituted of a MOS type FET each is formed in an active region surrounded by a device isolation region 21 formed in a p-type silicon semiconductor substrate 20 and made of a LOCOS structure, a shallow trench structure or a combination of a LOCOS structure and a shallow trench structure. The first transistor for selection $TR_{11}$, $TR_{12}$, $TR_{13}$, $TR_{14}$ comprises a gate insulating layer 22 formed on the surface of the silicon semiconductor substrate 20 and made, for example, of a silicon oxide film, a gate electrode 23 (which also works as a word line $WL_1$, $WL_2$, $WL_3$, $WL_4$) formed on the gate insulating layer 22, and source/drain regions 24 that are formed in the active region of the silicon semiconductor substrate 20 and contain an $n^+$ type impurity.

A bit line $BL_1$ is formed on a lower insulating layer formed on the entire surface, and the bit line $BL_1$ is connected to one source/drain region 24 of each of the first-place and second-place first transistors for selection $TR_{11}$ and $TR_{12}$ and one source/drain region 24 of each of the third-place and fourth-place first transistors for selection $TR_{13}$ and $TR_{14}$ through a contact hole 25 made through the lower insulating layer. Further, an upper insulating layer is formed on the lower insulating layer including the bit line $BL_1$. The bit line $BL_1$ is extending leftward and rightward on FIG. 18 so as not to be in contact with a contact hole 28 to be described later.

A first electrode (lower electrode) 31 is formed on the insulating layer 26, a ferroelectric layer 32 is formed on the first electrode 31, a second electrode (upper electrode) 33 is formed on the ferroelectric layer 32, and these constitute the memory cells $Mc_{11M}$ and constitute the sub-memory unit $SMC_{11}$. The first electrodes 31 are in common with the sub-memory unit $SMC_{11}$ and have a stripe-shaped plan form. The first electrode 31 is connected to the other source/drain region 24 of the first-place first transistor for selection $TR_{11}$ through a contact hole 28 made in an opening portion 27 formed through the insulating layer 26. The above common first electrode 31 is shown as a common node $CN_{11}$. The ferroelectric 32 is formed so as to have nearly the same pattern as that of the second electrode 33.

Further, a first insulating interlayer 36 is formed on the sub-memory unit $SMC_{11}$ and the insulating layer 26. A first electrode (lower electrode) 41 is formed on the first insulating interlayer 36, a ferroelectric layer 42 is formed on the first electrode 41, a second electrode (upper electrode) 43 is formed on the ferroelectric layer 42, and these constitute the memory cells $MC_{12M}$ and the sub-memory unit $SMU_{12}$. The first electrodes 41 are in common with the memory cells $MC_{12M}$ and have a stripe-shaped plan form. The first electrode 41 is connected to the other source/drain region 24 of the second-place first transistor for selection $TR_{12}$ through a contact hole 38 made in an opening portion 37 formed through the first insulating interlayer 36, a pad portion 35 formed on the insulating layer 26 and a contact hole 28 made in an opening portion 27 formed through the insulating layer 26. The above common first electrode 41 is shown as a common node $CN_{12}$. The ferroelectric 42 is formed so as to have nearly the same pattern as that of the second electrode 43.

Further, a second insulating interlayer 46 is formed on the sub-memory unit $SMC_{12}$ and the first insulating interlayer 36. A first electrode (lower electrode) 51 is formed on the second insulating interlayer 46, a ferroelectric layer 52 is formed on the first electrode 51, a second electrode (upper electrode) 53 is formed on the ferroelectric layer 52, and these constitute the memory cells $MC_{13M}$ and the sub-memory unit $SMU_{13}$. The first electrodes 51 are in common with the memory cells $MC_{13M}$ and have a stripe-shaped plan form. The first electrode 51 is connected to the other source/drain region 24 of the third-place first transistor for selection $TR_{13}$ through a contact hole 48 made in an opening portion 47 formed through the second insulating interlayer 46, a pad portion 45 formed on the first insulating interlayer 36, a contact hole 38 made in an opening portion 37 formed through the first insulating interlayer 36, a pad portion 35 formed on the insulating layer 26 and a contact hole 28 made in an opening portion 27 formed through the insulating layer 26. The above common first electrode 51 is shown as a common node $CN_{13}$. The ferroelectric 52 is formed so as to have nearly the same pattern as that of the second electrode 53.

Further, a third insulating interlayer 56 is formed on the sub-memory unit $SMC_{13}$ and the second insulating interlayer 46. A first electrode (lower electrode) 61 is formed on the third insulating interlayer 56, a ferroelectric layer 62 is formed on the first electrode 61, a second electrode (upper electrode) 63 is formed on the ferroelectric 62, and these constitute the memory cells $MC_{14M}$ and the sub-memory unit $SMU_{14}$. The first electrodes 61 are in common with the memory cells $MC_{14M}$ and have a stripe-shaped plan form. The first electrode 61 is connected to the other source/drain region 24 of the fourth-place first transistor for selection $TR_{14}$ through a contact hole 58 made in an opening portion 57 formed through the third insulating interlayer 56, a pad portion 55 formed on the second insulating interlayer 46, a contact hole 48 made in an opening portion 47 formed through the second insulating interlayer 46, a pad portion 45 formed on the first insulating interlayer 36, a contact hole 38 made in an opening portion 37 formed through the first insulating interlayer 36, a pad portion 35 formed on the insulating layer 26 and a contact hole 28 made in an opening portion 27 formed through the insulating layer 26. The above common first electrode 61 will be sometimes referred to as a common node $CN_{14}$. The ferroelectric 62 is formed so as to have nearly the same pattern as that of the second electrode 63. Further, an upper insulating layer 66A is formed on the memory cell $MC_{14M}$ and the third insulating interlayer 56.

The word lines $WL_1$, $WL_2$, $WL_3$ and $WL_4$ are extending in the direction perpendicular to the paper surface of FIG. 18. Further, the second electrode 33 is shared with each memory cell $MC_{21m}$ contiguous in the direction perpendicular to the paper surface of FIG. 18, and also works as a plate line $PL_m$. Further, each of the second electrodes 43, 53 and 63 is also shared with each of the memory cells $MC_{22m}$, $MC_{23m}$ and $MC_{24m}$ contiguous in the direction perpendicular to the paper surface of FIG. 18, and also works as a plate line $PL_m$. The plate lines $PL_m$ shared by the memory cells $MC_{11m}$, $MC_{12m}$, $MC_{13m}$, $MC_{14m}$, $MC_{21m}$, $MC_{22m}$, $MC_{23m}$ and $MC_{24m}$ are extending in the direction perpendicular to the paper surface of FIG. 18 and connected together through a contact hole in a region (not shown). Further, the memory cell $MC_{11M}$ the memory cell $MC_{12M}$, the memory cell $MC_{13M}$ and the memory cell $MC_{14M}$ are aligned in the perpendicular direction. Such a structure can serve to further decrease the area that the memory cells occupy, and it can further improve the degree of integration.

In the above nonvolatile memory, the first-place transistors for selection $TR_{11}$ and $R_{21}$ are connected to the word line $WL_1$, the second-place transistors for selection $TR_{12}$ and $TR_{22}$ are connected to the word line $WL_2$, the third-place transistors for selection $TR_{13}$ and $TR_{23}$ are connected to the word line $WL_3$, and the fourth-place transistors for selection $TR_{14}$ and $TR_{24}$ are connected to the word line $WL_4$.

Complement data is written into the memory cells $MC_{11m}$ and $MC_{21m}$ sharing the plate line $PL_1$, the memory cells $MC_{12m}$ and $MC_{22m}$ sharing the plate line $PL_2$, the memory cells $MC_{13m}$ and $MC_{23m}$ sharing the plate line $PL_3$ and the memory cells $MC_{14m}$ and $MC_{24m}$ sharing the plate line $PL_4$, whereby 1 bit is stored, and 32 bits are stored in one memory unit (access unit) (see the equivalent circuit diagram in FIG. 16). The structure of the second transistors for selection $TR_{21}$, $TR_{22}$, $TR_{23}$ and $TR_{24}$ and the structure of the memory cells $MC_{21m}$, $MC_{22m}$, $MC_{23m}$ and $MC_{24m}$ are the same as structures shown in FIG. 18, and these are contiguous in the direction perpendicular to the paper surface of FIG. 18. Alternatively, eight transistors for selection $TR_{11}$ to $TR_{14}$ and $TR_{21}$ to $TR_{24}$ and 64 memory cells $MC_{11m}$ to $MC_{14m}$ and $MC_{21m}$ to $MC_{24m}$ constitute one memory unit (access unit), 1 bit is stored in each memory cell, and 64 bits are stored in the memory unit (see the equivalent circuit diagram of FIG. 17).

The word lines $WL_1$, $WL_2$, $WL_3$ and $WL_4$ are connected to the word line decoder/driver WD. The bit lines $BL_1$ and $BL_2$ are connected to the sense amplifier (not shown). Further, the plate line $PL_m$ is connected to the plate line decoder/driver PD.

In an actual nonvolatile memory, a set of the above nonvolatile memories for storing 32 bits or 64 bits each are arranged in the form an array as an access unit.

Figure 19:
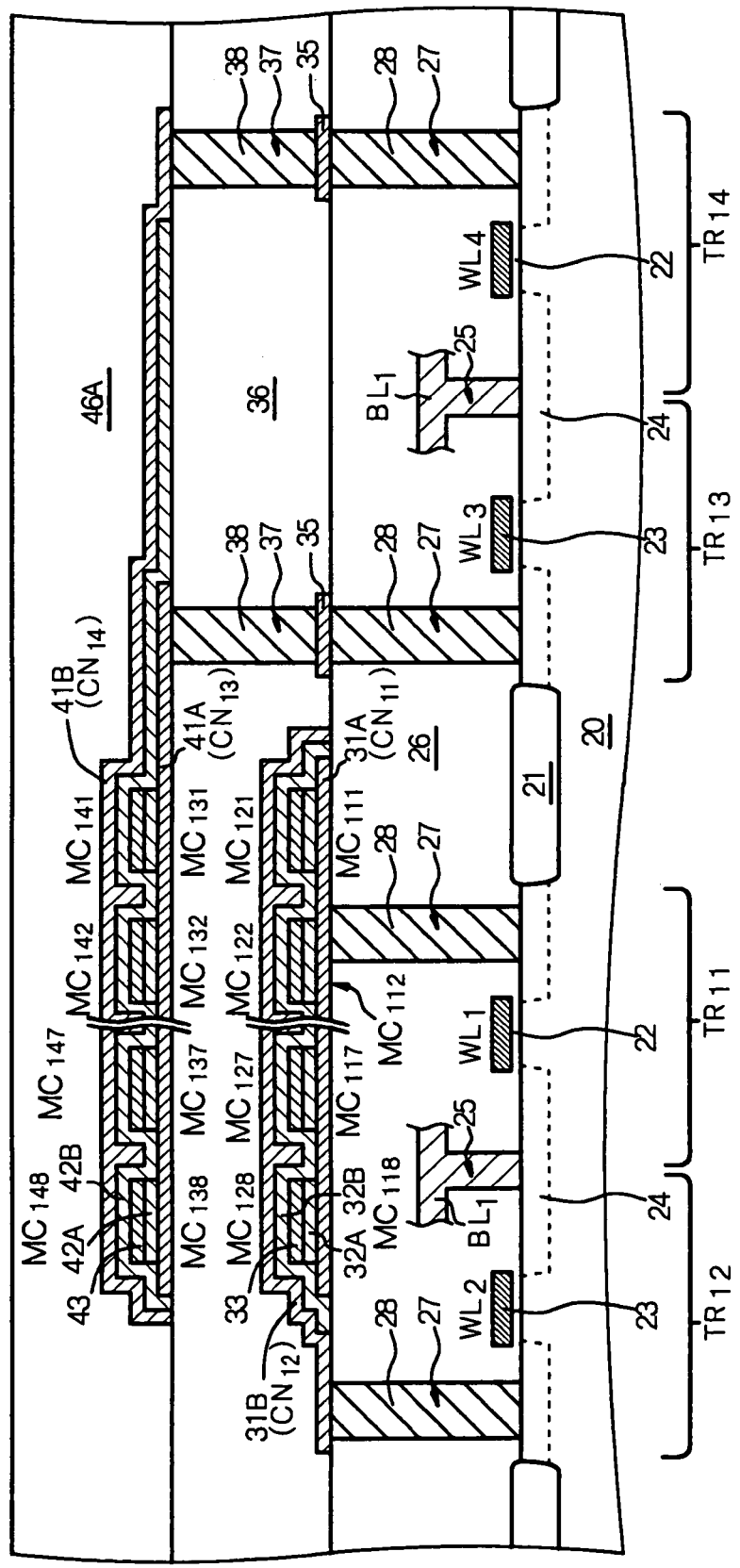
FIG. 19 is a schematic partial cross-sectional view of a memory unit of a variant of the ferroelectric-type nonvolatile semiconductor memory shown in FIG. 18.

FIG. 19 shows a schematic partial cross-sectional view of a variant of the nonvolatile memory shown in FIG. 18.

The nonvolatile memory shown in FIG. 19 differs from the nonvolatile memory shown in FIG. 18 in that the second electrode (plate line) is shared with (or common in) the memory cell $MC_{11m}$ of the first-place sub-memory unit $SMU_{11}$ and the memory cell $MC_{12m}$ of the second-place sub-memory unit $SMU_{12}$ and that the second electrode (plate line) is shared with (or common in) the memory cell $MC_{13m}$ of the third-place sub-memory unit $SMU_{13}$ and the memory cell $MC_{14m}$ of the fourth-place sub-memory unit $SMU_{14}$. Further, the second electrode (plate line) is shared with (or common in) the memory cell $MC_{21m}$ of the first-place sub-memory unit $SMU_{21}$ and the memory cell $MC_{22m}$ of the second-place sub-memory unit $SMU_{21}$, and the second electrode (plate line) is shared with (or common in) the memory cell $MC_{23m}$ of the third-place sub-memory unit $SMU_{23}$ and the memory cell $MC_{24m}$ of the fourth-place sub-memory unit $SMU_{24}$.

The nonvolatile memory having a schematic partial cross-sectional view comprises;

① memory cells $MC_{11m}$ (m=1, 2, 3 ... 7, 8) comprising a first electrode 31A, a ferroelectric layer 32A and a second electrode 33 (specifically, $MC_{111}$, $MC_{112}$, $MC_{113}$ ... $MC_{117}$ and $MC_{118}$, sub-memory unit $SMU_{11}$), ② memory cells $MC_{12m}$ (m=1, 2, 3 ... 7, 8) comprising a first electrode 31B, a ferroelectric layer 32B and a second electrode 33 (specifically, $MC_{121}$, $MC_{122}$, $MC_{123}$ ... $MC_{127}$ and $MC_{128}$, sub-memory unit $SMU_{12}$), ③ memory cells $MC_{13m}$ (m=1, 2, 3 ... 7, 8) comprising a first electrode 41A, a ferroelectric layer 42A and a second electrode 43 (specifically, $MC_{131}$, $MC_{132}$, $MC_{133}$ ... $MC_{137}$ and $MC_{138}$, sub-memory unit $SMU_{13}$), and ④ memory cells $MC_{14m}$ (m=1, 2, 3 ... 7, 8) comprising a first electrode 41B, a ferroelectric layer 42B and a second electrode 43 (specifically, $MC_{141}$, $MC_{142}$, $MC_{143}$ ... $MC_{147}$ and $MC_{148}$, sub-memory unit $SMU_{14}$)

That is, in the nonvolatile memory shown in FIG. 19, the sub-memory units constituting each memory unit have a constitution of 4 layers. The number of the memory cells constituting each memory unit is not limited to 8, and the number of memory cells constituting the nonvolatile memory is not limited to 32, either.

The structure of the transistors for selection $TR_{11}$, $TR_{12}$, $TR_{13}$, $TR_{14}$, $TR_{21}$, $TR_{22}$, $TR_{23}$ and $TR_{24}$ is the same as the structure of the nonvolatile memory shown in FIG. 18, so that a detailed explanation thereof is omitted.

The first electrode 31A is formed on an insulating layer 26, the ferroelectric layer 32A is formed on the first electrode 31A, the second electrode 33 is formed on the ferroelectric 32A, and these constitute the memory cells $MC_{11M}$. The first electrodes 31A are in common with the memory cells $MC_{11M}$ and have a stripe-shaped plan form. The first electrode 31A is connected to the other source/drain region 24 of the transistor for selection $TR_{11}$ through a contact hole 28 made in an opening portion 27 formed through the insulating layer 26. The ferroelectric layer 32A is formed so as to have nearly the same pattern as that of the second electrode 33.

Further, the ferroelectric layer 32B is formed on the memory cells $MC_{11M}$ and the insulating layer 26, and the first electrode 31B is formed thereon. The first electrode 31B, the ferroelectric 32B and the second electrode 33 constitute the memory cells $MC_{12M}$. The first electrodes 31B are in common with the memory cells $MC_{12M}$ and have a stripe-shaped plan form. The first electrode 31B is connected to the other source/drain region 24 of the transistor for selection $TR_{12}$ through a contact hole 28 made in an opening portion 27 formed through the insulating layer 26. The ferroelectric layer 32B is formed so as to have nearly the same pattern as that of the first electrode 31B.

Further, an insulating interlayer 36 is formed on the memory cells $MC_{12M}$ and the insulating layer 26. The first electrode 41A is formed on the insulating interlayer 36, the ferroelectric layer 42A is formed on the first electrode 41A, the second electrode 43 is formed on the ferroelectric layer 42A, and these constitute the memory cells $MC_{13M}$. The first electrodes 41A are in common with the memory cells $MC_{13M}$ and have a stripe-shaped plan form. The first electrode 41A is connected to the other source/drain region 24 of the transistor for selection $TR_{13}$ through a contact hole 38 made in an opening portion 37 formed through the insulating interlayer 36, a pad portion 35 formed on the insulating layer 26 and a contact hole 28 made in an opening portion 27 formed through the insulating layer 26. The ferroelectric layer 42A is formed so as to have nearly the same pattern as that of the second electrode 43.

Further, the ferroelectric layer 42B is formed on the memory cells $MC_{13M}$ and the insulating interlayer 36, and the first electrode 41B is formed thereon. The first electrode 41B, the ferroelectric layer 42B and the second electrode 43 constitute the memory cells $MC_{14M}$. The first electrodes 41B are in common with the memory cells $MC_{14M}$ and have a stripe-shaped plan form. The first electrode 41B is connected to the other source/drain region 24 of the transistor for selection $TR_{14}$ through a contact hole 38 made in an opening portion 37 formed through the insulating interlayer 36, a pad portion 35 formed on the insulating layer 26 and a contact hole 28 made in an opening portion 27 formed through the insulating layer 26. The ferroelectric layer 42B is formed so as to have nearly the same pattern as that of the first electrode 41B. Further, an upper insulating layer 46A is formed on the memory cells $MC_{14M}$ and the insulating interlayer 36.

The memory cells $MC_{11M}$, the memory cells $MC_{12M}$, the memory cells $MC_{13M}$ and the memory cell $MC_{14M}$ are aligned in the perpendicular direction. Such a structure can serve to further decrease the area that the memory cells occupy and can further improve the degree of integration.

The memory unit $MU_2$ can be similarly constituted. The nonvolatile memory shown in FIG. 19 has an equivalent circuit diagram similar to that shown in FIG. 16 or 17. Further, the word lines WL1 to $WL_4$ or the word line $WL_1$ to $WL_8$ and the plate line $PL_m$ can be substantially structurally the same as that of the nonvolatile memory shown in FIG. 18, so that a detailed explanation thereof is omitted.

Figure 20:
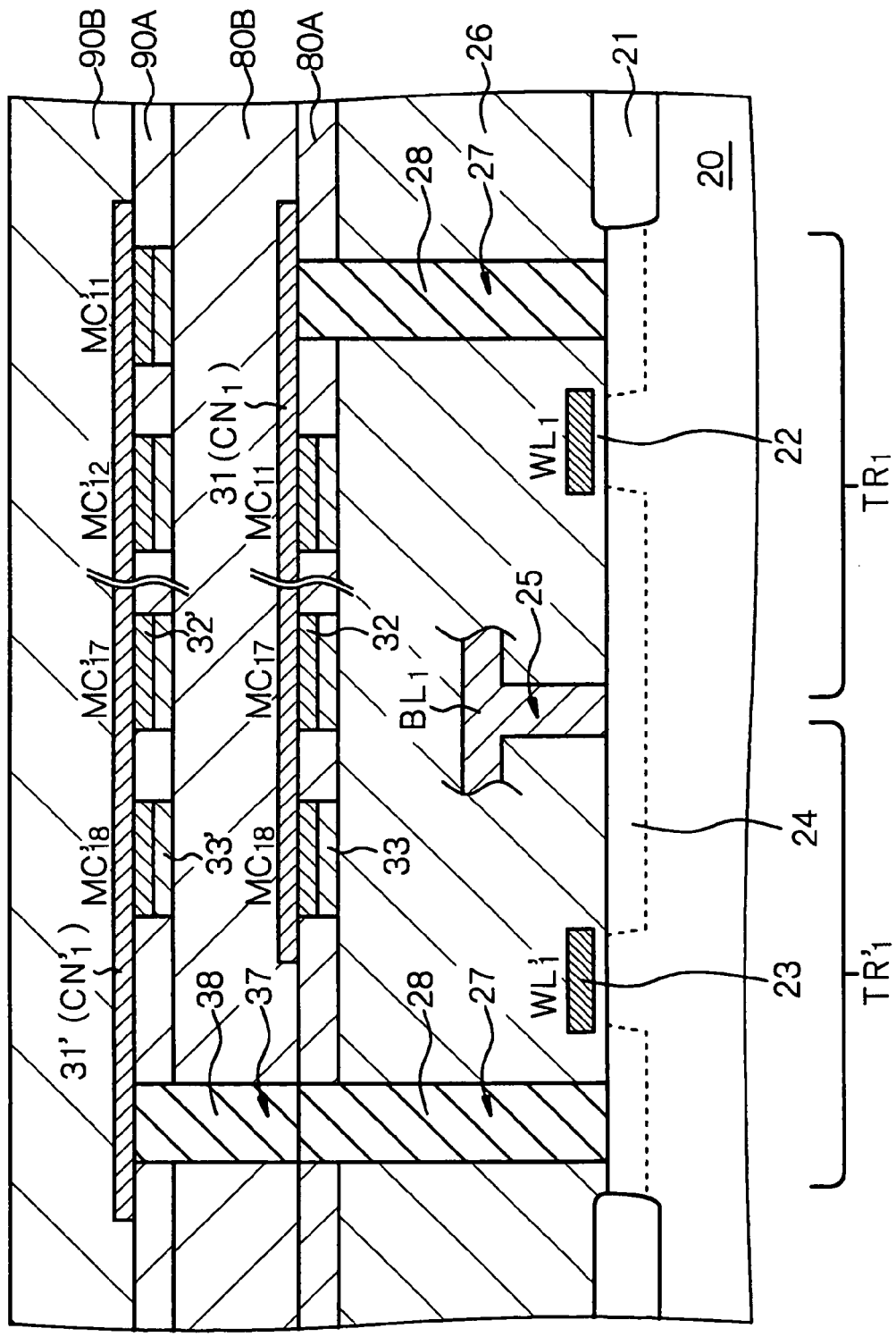
FIG. 20 is a schematic partial cross-sectional view of a memory unit of a variant of the ferroelectric-type nonvolatile semiconductor memory shown in FIG. 12.

Further, a variant of the nonvolatile memory shown in FIG. 12 may be employed, for example, as shown in FIG. 20, in which the first electrode 31 is formed as an upper electrode and the second electrode 33 is formed as a lower electrode. The above structure can be applied to the other nonvolatile memories. In FIG. 20, reference numerals 80A and 80B indicate a lower layer and an upper layer of the first insulating layer, and reference numerals 90A and 90B indicate a lower layer and an upper layer of the upper insulating layer.

Figure 21:
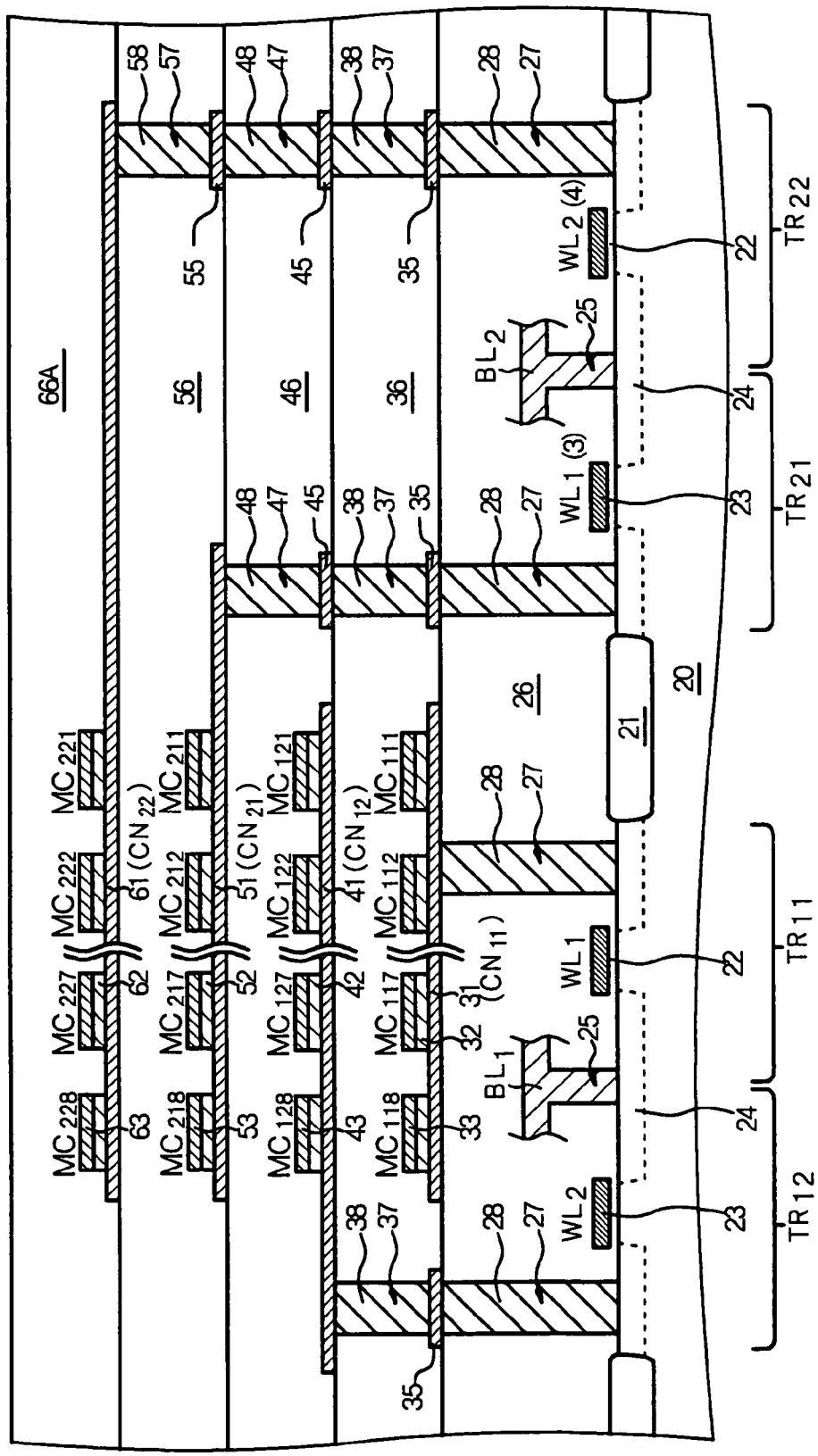
FIG. 21 is a schematic partial cross-sectional view of a memory unit of the ferroelectric-type nonvolatile semiconductor memory whose equivalent circuit diagram is shown in FIG. 13 or 14.

FIG. 21 shows a schematic partial cross-sectional view of a variant of the nonvolatile memory having an equivalent circuit diagram shown in FIG. 13 or 14. In this variant, first sub-memory units $SMU_{11}$ (memory cells $MC_{11M}$) and $SMU_{12}$ (memory cells $MC_{12M}$) constituting the first memory unit $MU_1$ and second sub-memory units $SMU_{21}$ (memory cells $MC_{21M}$) and $SMU_{22}$ (memory cell $MC_{22M}$) constituting the second memory unit $MU_2$ are stacked with insulating interlayers 36, 46 and 56 interposed between one unit and another unit. The structure of the above nonvolatile memory (variant) can be the same as the structure of the nonvolatile memory shown in FIG. 15 except for the above point, so that a detailed explanation thereof is omitted. The above structure can be applied to the other nonvolatile memory.

Figure 22:
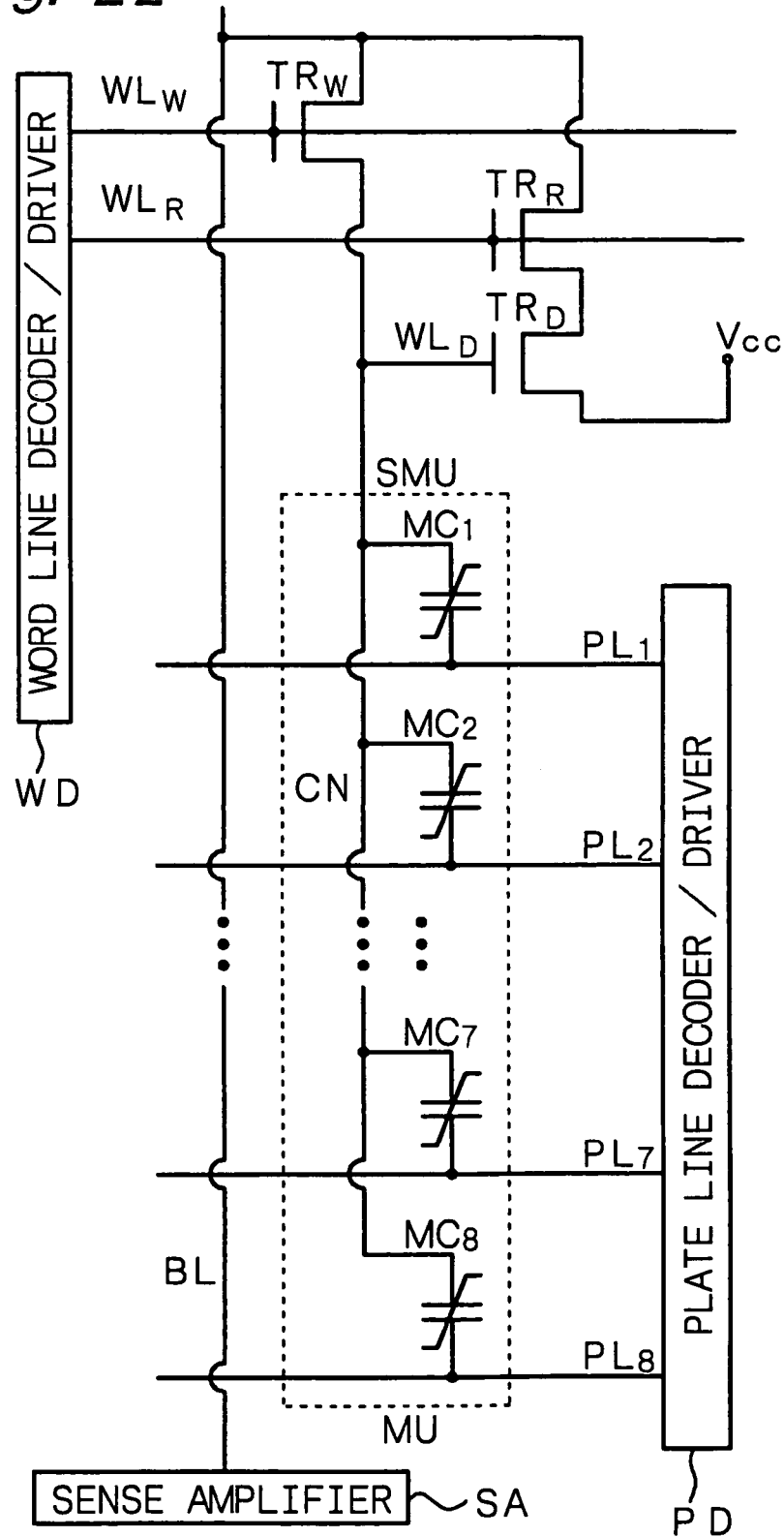
FIG. 22 is an equivalent circuit diagram of a gain-cell type ferroelectric-type nonvolatile semiconductor memory.

Further, a so-called gain cell type ferroelectric-type nonvolatile semiconductor memory can be employed. FIG. 22 shows an equivalent circuit diagram of a gain cell type nonvolatile memory. The gain cell type nonvolatile memory has a memory unit MU which comprises a bit line BL, a transistor for writing-in $TR_W$, a sub-memory unit SMU composed of memory cells $MC_M$ that are M (M≧2; for example, M=8) in number, and plate lines $PL_M$ that are M in number. Each memory cell $MC_M$ comprises a first electrode 31, a ferroelectric layer 32 and a second electrode 33. The first electrodes 31 of the memory cells $MC_M$ constituting the sub-memory unit SMU are in common with the sub-memory unit SMU, the above common first electrode (to be sometimes referred to as "common node CN" hereinafter) is connected to the bit line BL through the transistor for writing-in $TR_W$, and each second electrode 33 is connected to each plate line $PL_m$. The number (M) of the memory cells constituting the sub-memory unit SMU of the nonvolatile memory is not limited to 8, and it is generally sufficient to satisfy M≧2. It is preferably an exponent of 2 (M=2, 4, 8, 16, 32 . . . ).

Further, the above nonvolatile memory has a transistor for detection $TR_D$ and a transistor for read-out $TR_R$. One end of the transistor for detection $TR_D$ is connected to a wiring (for example, a power source line made of an impurity layer) having a predetermined potential $V_{cc}$, and the other end thereof is connected to the bit line BL through the transistor for read-out $TR_R$. When data stored in each memory cell $MC_m$ is read out, the transistor for read-out $TR_R$ is brought into a conduction state, and the operation of the transistor for detection $TR_D$ is controlled on the basis of a potential that occurs in the common first electrode (common node CN) due to the data stored in each memory cell $MC_m$. The transistor for writing-in $TR_W$, the transistor for detection $TR_D$ and the transistor for read-out $TR_R$ constitute the transistor for selection.

Specifically, the various transistors are constituted of MOS type FETs. One source/drain region of the transistor for writing-in $TR_W$ is connected to the bit line BL, and the other source/drain region thereof is connected to the common first electrode (common node CN). Further, one source/ drain region of the transistor for detection $TR_D$ is connected to a wiring having a predetermined potential $V_{cc}$, and the other source/drain region thereof is connected to one source/drain region of the transistor for read-out $TR_R$. More specifically, the other source/drain region of the transistor for detection $TR_D$ and one source/drain region of the transistor for read-out $TR_R$ occupy one source/drain region. Further, the other source/drain region of the transistor for read-out $TR_R$ is connected to the bit line BL. Further, the first electrode (common node CN or the other source/drain region of the transistor for writing-in $TR_W$) is connected to a gate portion of the transistor for detection $TR_D$ through a word line $WL_D$. Further, a word line $WL_W$ constituting the transistor for writing-in $TR_W$ and a word line $WL_R$ constituting the transistor for read-out $TR_R$ are connected to the word line decoder/driver WD. Each plate line $PL_m$ is connected to the plate line decoder/driver PD. Further, the bit line BL is connected to the sense amplifier SA.

Figure 23:
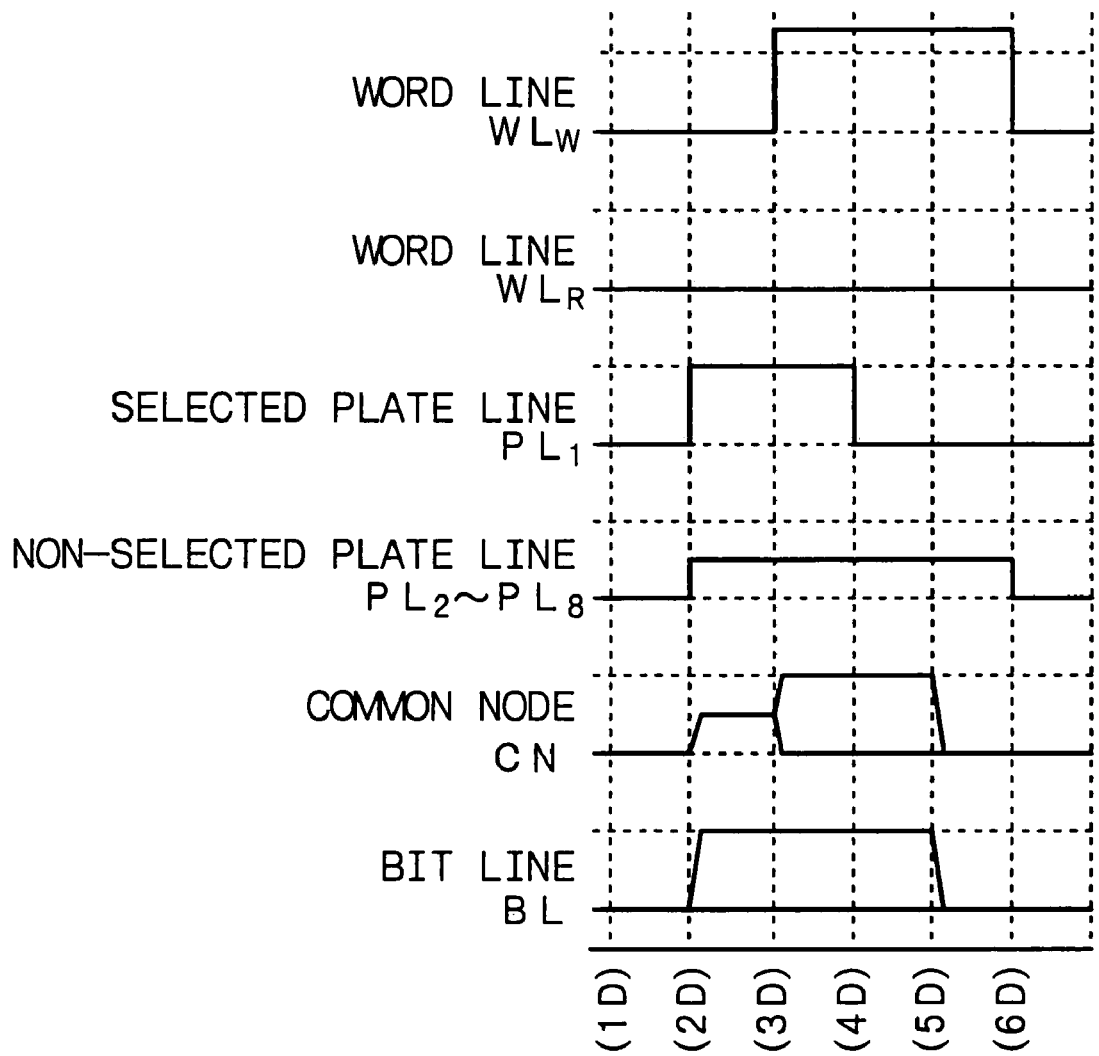
FIG. 23 is a diagram for showing waveforms of a gain-cell type ferroelectric-type nonvolatile semiconductor memory.
Figure 24:
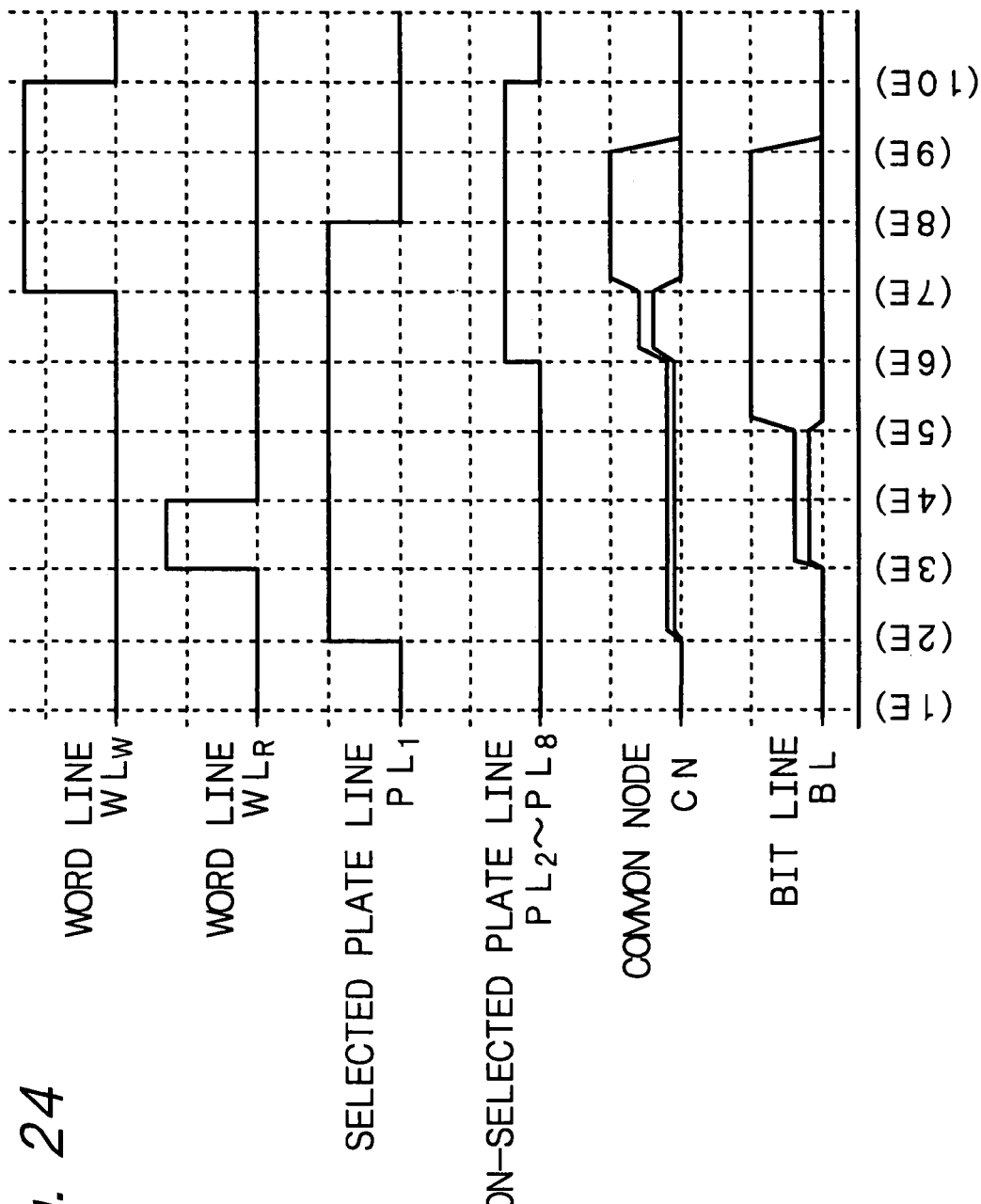
FIG. 24 is a diagram for showing waveforms of a gain-cell type ferroelectric-type nonvolatile semiconductor memory.

The operation of writing data into the above nonvolatile memory will be explained below. As an example, it is assumed that data is written into a memory cell $MC_1$ connected to a plate line $PL_1$. FIG. 23 shows operation waveforms. In FIG. 23 and FIG. 24 to be referred to later, parenthesized numerals correspond to Nos. of steps to be explained below.

(1D) In a standby state, the bit line, the word line and all of the plate lines have 0 volt. Further, the common node CN has 0 volt and is in a floating state.

(2D) When writing of data is started, the potential of the selected plate line $PL_1$ is brought to $V_{cc}$, and the potential of the non-selected platelines $PL_k$ (k=2, 3 . . . 8) is brought to $(\frac{1}{2})V_{cc}$. By this operation, the potential of the common node CN in a floating state increases approximately close to $(\frac{1}{2})V_{cc}$ due to a coupling with the plate line $PL_M$. When data "1" is written into the selected memory cell $MC_1$, the potential of the bit line BL is brought to $V_{cc}$, and when data "0" is written, the potential of the bit line BL is brought to 0 volt.

(3D) Then, the transistor for writing-in $TR_W$ is brought into an ON-state. By this operation, the potential of the common node CN comes to be $V_{cc}$ when data "1" is written into the selected memory cell $MC_1$, and it comes to be 0 volt when data "0" is written. The selected plate line $PL_1$ in a state where it has $V_{cc}$ applied thereto. When the potential of the common node CN is 0 volt, therefore, data "0" is written into the selected memory cell $MC_1$. When the potential of the common node CN is $V_{cc}$, no data is written into the selected memory cell $MC_1$.

(4D) Then, the potential of the selected plate line $PL_1$ is brought to 0 volt. When the potential of the common node CN is $V_{cc}$, data "1" is written into the selected memory cell $MC_1$. When the selected memory cell $MC_1$ has data "0" already written therein, no change takes place in the selected memory cell $MC_1$.

(5D) Then, the bit line BL is brought to 0 volt.

(6D) Further, the non-selected plate lines $PL_k$ are brought to 0 volt, and the transistor for writing-in $TR_W$ is brought into an OFF-state.

When data is written into other memory cell $MC_k$ (k=2, 3 . . . 8), a similar operation is repeated. In the above writing operation, a disturbance of $(\pm\frac{1}{2})V_{cc}$ takes place in the non-selected memory cell $MC_k$. However, destruction of data in the non-selected memory cell $MC_k$ can be reliably prevented by properly setting the value of $V_{cc}$.

The operation of reading-out and re-writing of data in the above nonvolatile memory will be explained below. As an example, it is assumed that data is read out from and re-written into the memory cell $MC_1$ connected to the plate line $PL_1$.

(1E) In a standby state, the bit line, the word line and all of the plate lines have 0 volt. Further, the common node CN has 0 volt and is in a floating state.

(2E) When data is read out, $V_{cc}$ is applied to the selected plate line $PL_1$. In this case, if data "1" is stored in the selected memory cell $MC_1$, polarization inversion takes place in the ferroelectric layer, an accumulated charge amount increases, and the potential of the common node CN increases. When data "0" is stored in the selected memory cell $MC_1$, no polarization inversion takes place in the ferroelectric layer, and the potential of the common node CN hardly increases. That is, the common node CN is coupled with a plurality of non-selected plate lines $PL_k$ through the ferroelectric layers, so that the potential of the common node CN is held at a level relatively close to 0 volt. In this manner, a change takes place in the common node CN depending upon data stored in the selected memory cell $MC_1$. Therefore, the ferroelectric layer of the selected memory cell $MC_1$ can be provided with an electric field sufficient for polarization inversion.

(3E) Then, the bit line BL is brought into a floating state, and the transistor for read-out $TR_R$ is brought into an ON-state. By this operation, the operation of the transistor for detection $TR_D$ is controlled on the basis of a potential that is caused in the common first electrode (common node CN) due to data stored in the selected memory cell $MC_1$. Specifically, since one source/drain region of the transistor for detection $TR_D$ is connected to a wiring having a predetermined potential $V_{cc}$, an electric current flows to the bit line BL from the above wiring through the transistor for detection $TR_D$ and the transistor for read-out $TR_R$, and the potential of the bit line BL increases. In this case, the potential of the bit line BL comes to be approximately $(V_g-V_{th})$ in which $V_{th}$ is a threshold value of the transistor for detection $TR_D$ and $V_g$ is a potential of gate portion of the transistor for detection $TR_D$ (i.e., potential of the common node CN). When the transistor for detection $TR_D$ is a depression type NMOSFET, the threshold value $V_{th}$ is a negative value. In such a constitution, stabilized sense signal amount can be secured regardless of the size of a load on the bit line BL. The transistor for detection $TR_D$ may be formed of PMOSFET.

(4E) Then, the transistor for read-out $TR_R$ is brought into an OFF-state.

(5E) Then, the sense amplifier SA connected to the bit line BL is activated to amplify the data, and the operation of reading-out of data is completed.

By the above operation, the data stored in the selected memory cell is once destroyed, so that the operation of re-writing data is carried out.

(6E) For the above purpose, first, the potential of each non-selected plate lines $PL_k$ (k=2, 3 . . . 8) are brought to $(\frac{1}{2})V_{cc}$.

(7E) Then, the transistor for writing-in $TR_W$ is brought into an ON-state. By this operation, the potential of the common node CN comes to be equal to the potential of the bit line BL. That is, when data stored in the selected memory cell $MC_1$ is "1", the potential of the common node CN comes to be $V_{cc}$, and when data stored in the selected memory cell $MC_1$ is "0", the potential of the common node CN comes to be 0 volt. The selected plate line $PL_1$ continues having a potential of $V_{cc}$. When the potential of the common node CN is 0 volt, therefore, data "0" is re-written into the selected memory cell $MC_1$.

(8E) Then, the potential of the selected plate line $PL_1$ is brought to 0 volt. By this operation, when data stored in the selected memory cell $MC_1$ is "1", data "1" is re-written since the potential of the common node CN is $V_{cc}$. When the selected memory cell $MC_1$ has data "0" already written therein, no change takes place in the selected memory cell.

(9E) Then, the bit line BL is brought to 0 volt.

(10E) Finally, the non-selected plate lines $PL_k$ are brought to 0 volt, and the transistor for writing-in $TR_W$ is brought into an OFF-state.

When reading-out and re-writing of date in other memory cell $MC_k$ (k=2, 3 . . . 8) is carried out, the above operation is repeated.

In the above step (2E), the number (M) of the memory cells constituting the sub-memory unit SMU is required to be such a number that the ferroelectric layer of the selected memory cell is provided with a sufficiently large electric field to cause reliable polarization inversion. That is, if the value of M is too small, when $V_{cc}$ is applied to the selected plate line $PL_1$ in the above step (2E), the potential of the first electrode in a floating state comes to increase to a great extent due to a coupling of the second electrode and the first electrode, and no sufficient electric field is formed between the second electrode and the first electrode, so that no polarization inversion takes place in the ferroelectric layer. On the other hand, the potential (called "signal potential") that appears in the first electrode has a value obtained by dividing an accumulated charge amount with a load capacitance. If the value of M is too large, therefore, the potential that appears in the first electrode comes to be too low. Desirably, the value of M satisfies $2 \leq M \leq 128$, preferably satisfies $4 \leq M \leq 32$.

Figure 25:
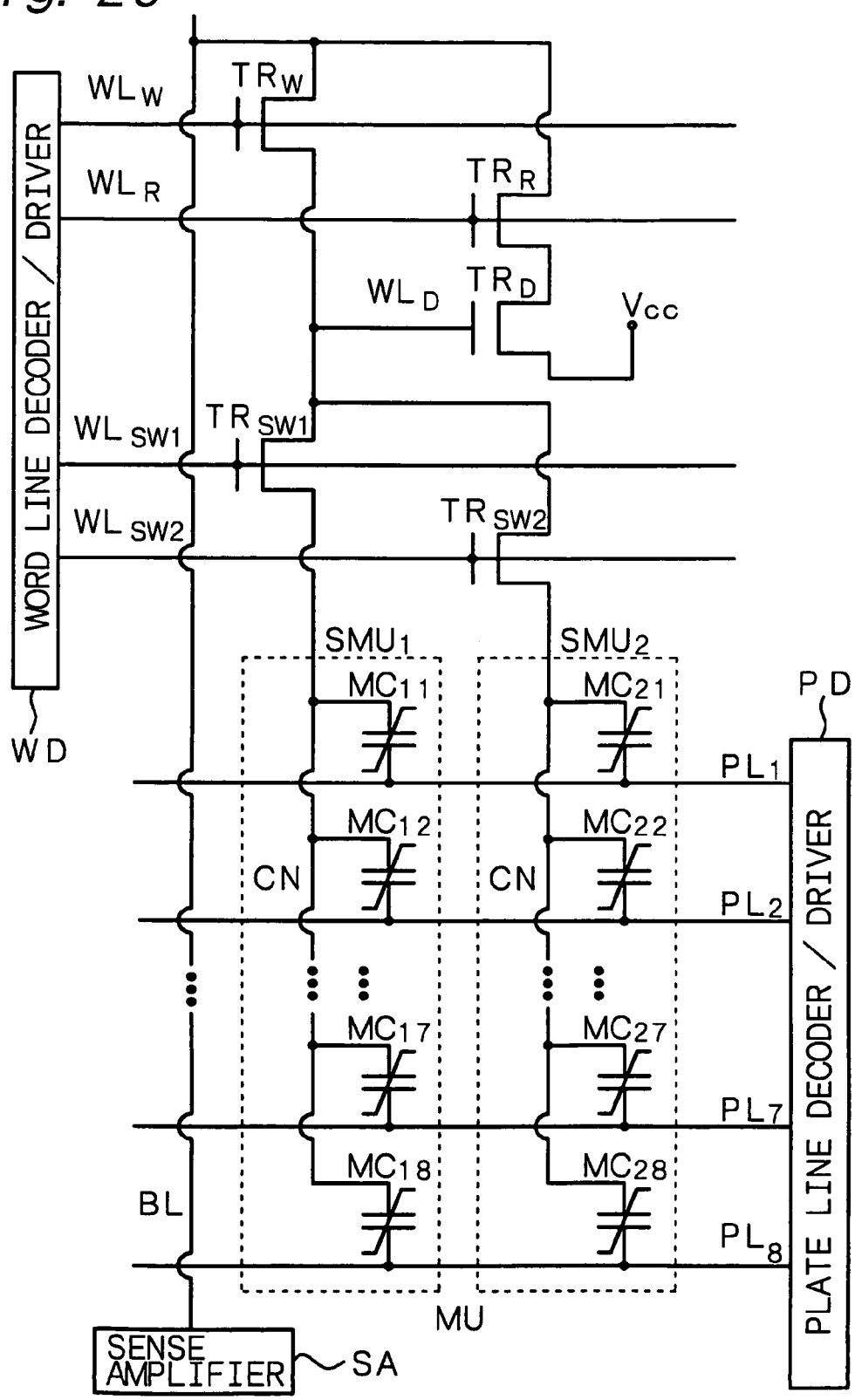
FIG. 25 is an equivalent circuit diagram of a variant of the gain-cell type ferroelectric-type nonvolatile semiconductor memory.

Alternatively, FIG. 25 shows an equivalent circuit diagram of a variant of the gain cell type nonvolatile memory. The gain cell type nonvolatile memory shown in FIG. 25 comprises a bit line BL; a transistor for writing-in $TR_W$; sub-memory units $SMU_1$ and $SMU_2$ that are N ($N \geq 2$; for example, N=2) in number and each of which is composed of memory cells $MC_M$ that are M ($M \geq 2$; for example, M=8) in number; transistors for switching $TR_{SW1}$ and $TR_{SW2}$ that are N in number; and plate lines $PL_m$ that are M in number and shared with the memory cells $MC_{1M}$ and $MC_{2M}$ constituting the sub-memory units $SMU_1$ and $SMU_2$ that are N in number.

Each memory cell $MC_M$ comprises a first electrode 31, a ferroelectric layer 32 and a second electrode 33. The first electrodes 31 of the memory cells $MC_{1M}$, $MC_{2M}$ constituting the sub-memory unit $SMU_1$, $SMU_2$ in the n-th place (n=1, 2 . . . N; n=1 or 2) are in common with the n-th place sub-memory unit $SMU_1$, $SMU_2$. The above common first electrode (common node $CN_1$, $CN_2$) is connected to the bit line BL through the n-th place transistor for switching $TR_{SW1}$, $TR_{SW2}$ and the transistor for writing-in $TR_W$, and each second electrode 33 is connected to each shared plate line $PL_m$. The number (M) of the memory cells constituting the sub-memory unit $SMU_1$, $SMU_2$ of the nonvolatile memory is not limited to 8, and generally, it is sufficient to satisfy $M \geq 2$. It is preferably an exponent of 2 (M=2, 4, 8, 16, 32 . . . ). The number of N is not limited to 2, either, and it can be, for example, an exponent of 2 (2, 4, 8 . . . ).

Further, the above nonvolatile memory has a transistor for detection $TR_D$ and a transistor for read-out $TR_R$. The transistor for writing-in $TR_W$, the transistor for detection $TR_D$ and the transistor for read-out $TR_R$ constitute the transistor for selection. One end of the transistor for detection $TR_D$ is connected to a wiring (power source line made of an impurity layer) having a predetermined potential $V_{cc}$, and the other end thereof is connected to the bit line BL through the transistor for read-out $TR_R$. When data stored in the memory cells $MC_{1m}$ and $MC_{2m}$ constituting the sub-memory units $SMU_1$ and $SMU_2$ is read out, the n-th place transistors $TR_{SW1}$ and $TR_{SW2}$ for switching and the transistor for read-out $TR_R$ are brought into a conduction state, and the operation of the transistor for detection $TR_D$ is controlled on the basis of a potential that occurs in the common first electrodes (common nodes $CN_1$ and $CN_2$) due to data stored in the memory cells $MC_{1m}$ and $MC_{2m}$.

Specifically, the various transistors are constituted of MOS type FETs. One source/drain region of the transistor for writing-in $TR_W$ is connected to the bit line BL, the other source/drain region thereof is connected to one source/drain region of one end of each of the transistors for switching $TR_{SW1}$ and $TR_{SW2}$. The other source/drain region of the transistor for switching $TR_{SW1}$, $TR_{SW2}$ is connected to the common first electrode (common node $CN_1$, $CN_2$) constituting the sub-memory unit $SMU_1$, $SMU_2$. Further, one source/drain region of the transistor for detection $TR_D$ is connected to a wiring having a predetermined potential $V_{cc}$, and the other source/drain region thereof is connected to one source/drain region of the transistor for read-out $TR_R$. The other source/drain region of the transistor for read-out $TR_R$ is connected to the bit line BL. The common first electrode constituting each of the sub-memory units $SMU_1$ and $SMU_2$ (common nodes $CN_1$ and $CN_2$ or the other source/drain region of the transistor for writing-in $TR_W$) is connected to the gate portion of the transistor for detection $TR_D$. The other source/drain region of the transistor for detection $TR_D$ and the one source/drain region of the transistor for read-out $TR_R$ occupy one source/drain region. Further, the word line $WL_W$ constituting the transistor for writing-in $TR_W$, the word line $WL_R$ constituting the transistor for read-out TRR and the word line $WL_{SW1}$ and $WL_{SW2}$ constituting the transistors for switching $TR_{SW1}$, $TR_{SW2}$ are connected to the word line decoder/driver WD. Each plate line $PL_m$ is connected to the plate line decoder/driver PD, and the bit line BL is connected to the sense amplifier SA.

The structure of each of the sub-memory units $SMU_1$ and $SMU_2$ can be substantially the same as the structure of the sub-memory unit SMU explained with reference to FIG. 22, so that a detailed explanation thereof is omitted. The common first electrode (common node $CN_1$) constituting the sub-memory unit $SMU_1$ is connected to the other source/drain region of the transistor for switching $TR_{SW1}$ through a contact hole 28 made through the insulating layer 26, and the common first electrode (common node $CN_2$) constituting the sub-memory unit $SMU_2$ is connected to the other source/drain region of the transistor for switching $TR_{SW2}$ through a contact hole 28 made through the insulating layer 26. Further, one source/drain region of the transistor for writing-in $TR_W$ and the other source/drain region of the transistor for read-out $TR_R$ are connected to the bit line BL formed on a lower insulating layer through a contact hole 25 formed through the lower insulating layer. Further, one source/drain region of the transistor for switching $TR_{SW1}$, $TR_{SW2}$, the other source/drain region of the transistor for writing-in $TR_W$ and the gate portion (word line $WL_D$) of the transistor for detection $TR_D$ are connected to a secondary bit line formed on the lower insulating layer through a contact hole formed through the lower insulating layer. The above secondary bit line is extending on the lower insulating layer and is connected to the bit line BL. The above-explained structure can be nearly the same, for example, as the structure of the nonvolatile memory shown in FIG. 15.

In the above nonvolatile memory, a plurality of sub-memory units are provided, so that the cell area per bit can be further decreased as compared with the nonvolatile memory explained with reference to FIG. 22. That is, in principle, the size (occupation area) of the nonvolatile memory is determined depending upon the pitch and number (value of M) of the plate lines $PL_M$ in one direction, and the above size is determined depending upon the pitch and number (value of N) of the common nodes CN in the direction at right angles with the above direction. The area (size) of the region that the nonvolatile memory occupies in a semiconductor substrate is mainly determined depending upon the area (size) that the transistors for switching $TR_{SW1}$ and $TR_{SW2}$ occupy. The transistor for writing-in $TR_W$, the transistor for read-out $TR_R$ and the transistor for detection $TR_D$ can be formed in an empty region of the semiconductor substrate. The area of the empty region increases with an increase in the number (N) of the sub-memory units and the number (M) of the memory cells constituting the sub-memory unit. When the transistor for writing-in $TR_W$, the transistor for read-out $TR_R$ and the transistor for detection $TR_D$ are formed in the empty region of the semiconductor substrate as described above, therefore, the semiconductor substrate can be remarkably effectively used.

Writing, reading-out and re-writing of data in the above nonvolatile memory can be operated in the same manner as in the operation of writing, reading-out and re-writing of data in the nonvolatile memory explained with reference to FIG. 22 in a state where the sub-memory units $SMU_1$ and $SMU_2$ are properly selected with the transistors for switching $TR_{SW1}$ and $TR_{SW2}$, so that a detailed explanation thereof is omitted.

Figure 26:
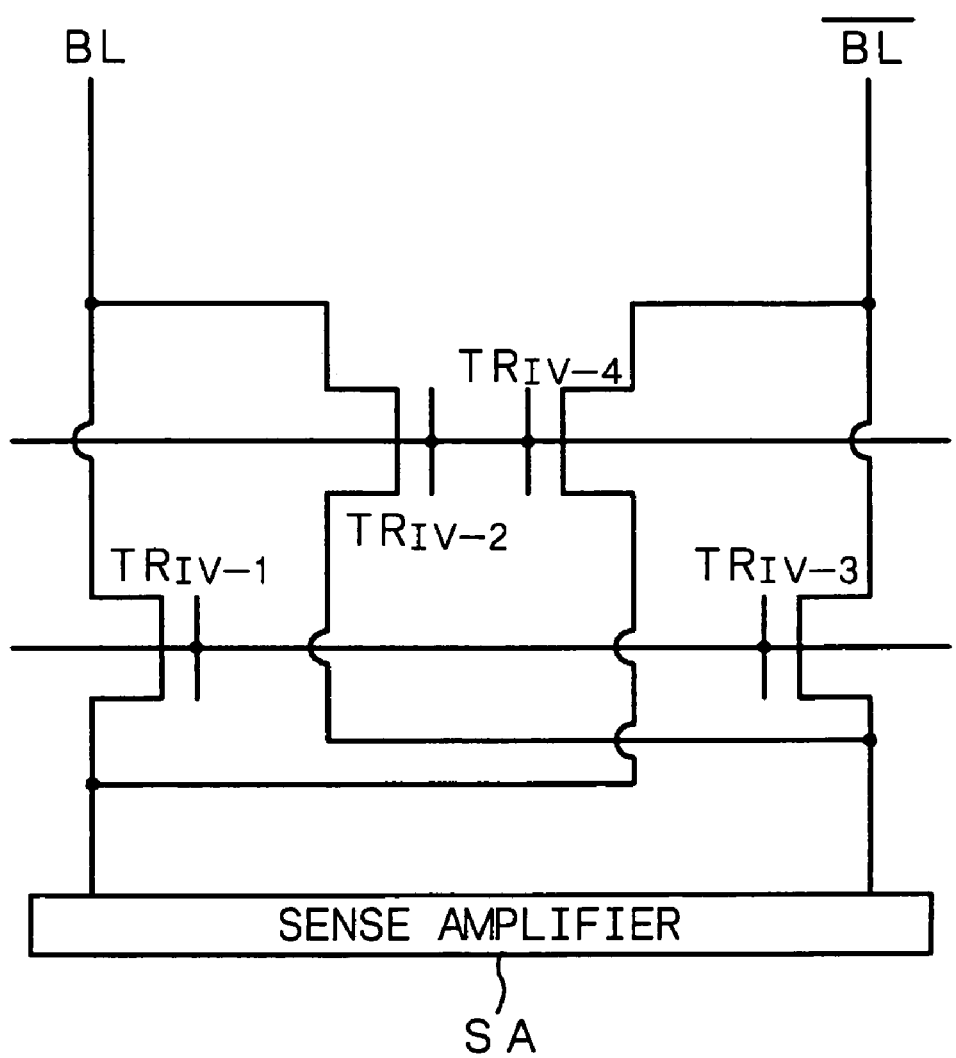
FIG. 26 is a circuit diagram of a kind of switch circuit disposed between bit lines when the predetermined potential of a wiring to which one end of a transistor for detection is connected is 0 volt in the gain-cell type ferroelectric-type nonvolatile semiconductor memory.
Figure 27:
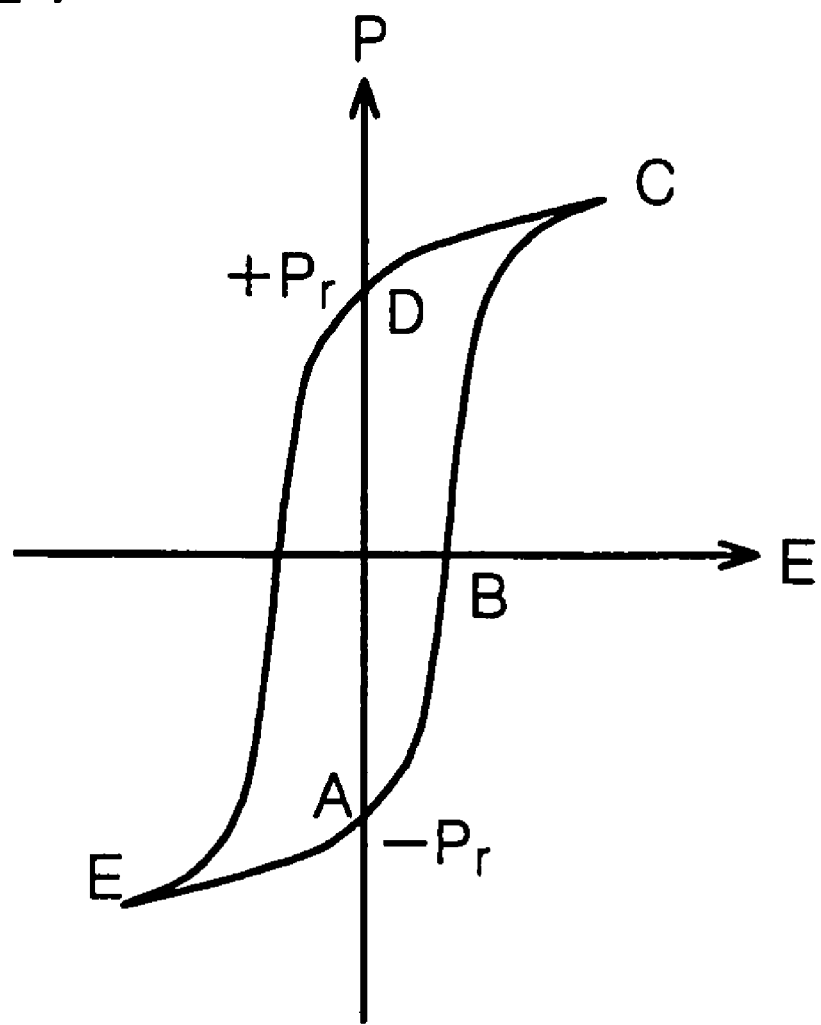
FIG. 27 is a P-E hysteresis loop diagram of a ferroelectric material.
Figure 28:
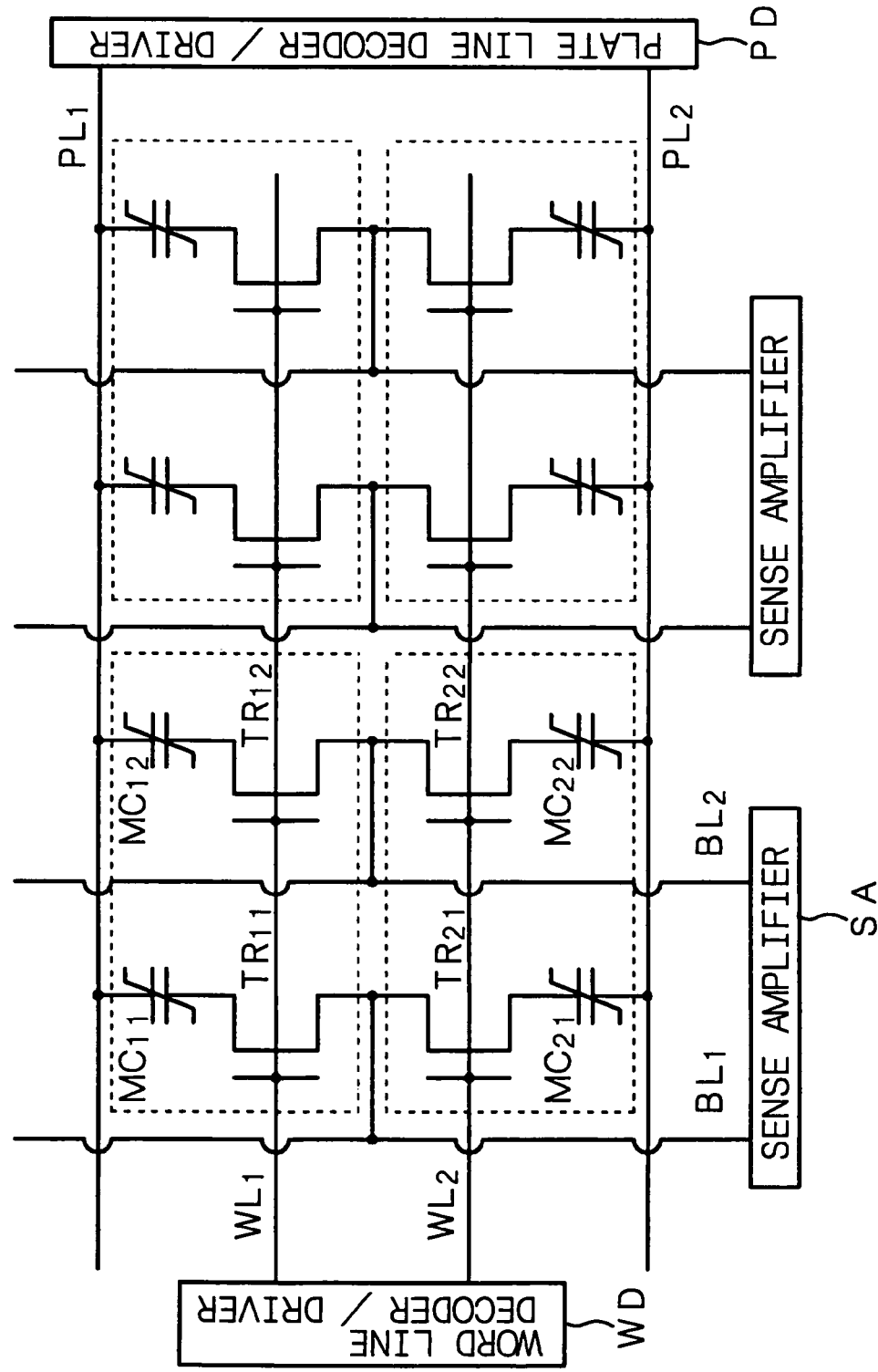
FIG. 28 is an equivalent circuit diagram of a ferroelectric-type nonvolatile semiconductor memory disclosed in U.S. Pat. No. 4,873,664.
Figure 29:
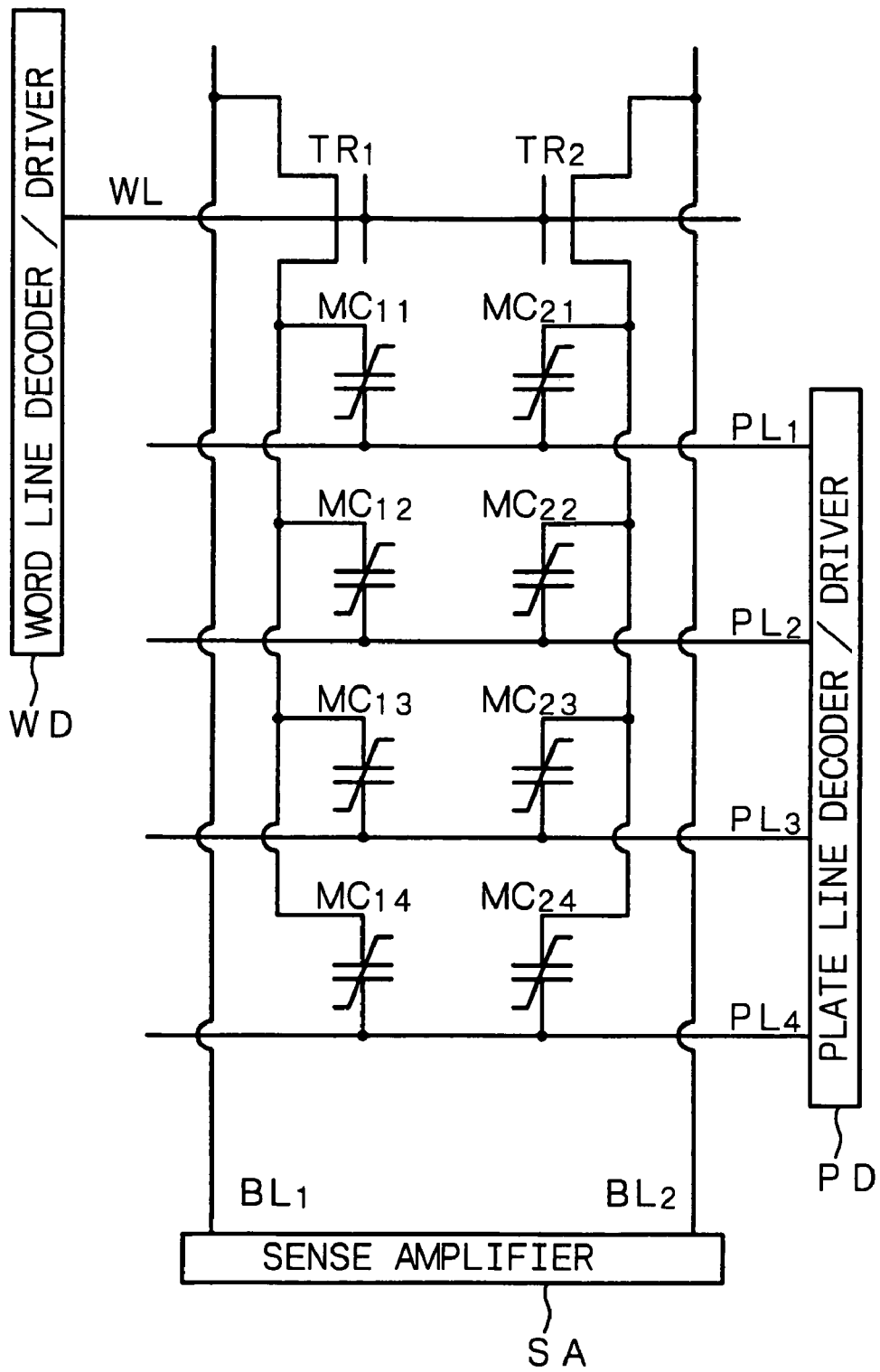
FIG. 29 is an equivalent circuit diagram of a ferroelectric-type nonvolatile semiconductor memory disclosed in JP-A-9-121032.

In the gain cell type nonvolatile memory, the predetermined potential of the wiring to which one end of the transistor for detection is connected is not limited to $V_{cc}$, and the wiring may be grounded. That is, the predetermined potential of the wiring to which one end of the transistor for detection is connected may be 0 volt. In this case, however, when a potential ($V_{cc}$) appears in the bit line in reading out data in the selected memory cell, the potential of the bit line is required to be 0 volt in re-writing, and when 0 volt is appears in the bit line in reading out data in the selected memory cell, the potential of the bit line is required to be $V_{cc}$ in re-writing. For this purpose, there can be employed a constitution in which a kind of switching circuit (inversion circuit) formed of transistors $TR_{IN-1}$, $TR_{IN-2}$, $TR_{IN-3}$ and $TR_{IN-4}$ as shown in FIG. 26 is provided between the bit lines, and, the transistors $TR_{IN-2}$ and $TR_{IN-4}$ are brought into an ON-state when data is read out, and the transistors $TR_{IN-1}$ and $TR_{IN-3}$ are brought into an ON-state when data is re-written.

In the gain cell type nonvolatile memory, the operation of the transistor for detection is controlled on the basis of a potential that occurs in the common first electrode due to data stored in each memory cell. Since the first electrodes are in common with the memory cells that are M in number, the first electrodes are in a state where a kind of additional load capacitance is added to the first electrodes. As a result, when a voltage is applied to the plate line in reading out data, an increase in the potential of the first electrode can be inhibited, and a sufficient potential difference is caused between the first electrode and the second electrode. As a result, polarization inversion reliably takes place in the ferroelectric layer.

In the nonvolatile memory of the present invention or the nonvolatile memory in the nonvolatile memory operation method of the present invention, when nonvolatile memories are stacked, or when memory units are stacked, or when sub-memory units are stacked, preferably, the crystallization temperature of the ferroelectric layer constituting the memory cell of the nonvolatile memory, memory unit or sub-memory unit (these will be generally referred to as "memory unit and the like" hereinafter) that are positioned at an upper stage is lower than the crystallization temperature of the ferroelectric layer constituting the memory cell of the memory unit and the like that are positioned at a lower stage. The crystallization temperature of the ferroelectric layer constituting the memory cell can be investigated, for example, by means of an X-ray diffraction apparatus or a surface scanning electron microscope. Specifically, the crystallization temperatures of the ferroelectric layers can be determined as follows. For example, a ferroelectric material layer is formed and then heat-treated at various heat treatment temperatures for crystallization of the ferroelectric material layer, and the heat-treated ferroelectric material layer is subjected to X-ray diffraction analysis, to evaluate a diffraction pattern strength (height of diffraction peak) characteristic of the ferroelectric material.

Meanwhile, when a ferroelectric-type nonvolatile semiconductor memory having a constitution of stacked memory unit and the like is produced, it is required to carry out heat treatments (to be referred to as "crystallization heat treatment" hereinafter) for crystallization of the ferroelectric layer or a ferroelectric thin film constituting the ferroelectric layer as many times as the number of stages of the stacked memory unit and the like. As a result, a memory unit and the like in a lower position undergoes the crystallization heat treatment for a longer period of time, and a memory unit and the like in a higher position undergoes the crystallization heat treatment for a shorter period of time. When an optimum crystallization heat treatment is carried out on the memory unit and the like in a higher position, the memory unit and the like in a lower position may suffer an excess heat load and may deteriorate in properties. It is conceivable to employ a method in which multi-staged memory unit and the like are formed and then subjected to the crystallization heat treatment once. However, the ferroelectric layers are caused to have a great change in volume, or the ferroelectric layers highly possibly cause degassing, and there is liable to be a problem that the ferroelectric layers undergo cracking or peeling. It is therefore arranged that the crystallization temperature of the ferroelectric layer constituting the memory unit and the like in a higher position is lower than the crystallization temperature of the ferroelectric layer constituting the memory unit and the like in a lower position. In this case, even if the crystallization heat treatments are carried out as many times as the number of stages of the memory unit and the like, there is caused no problem that the memory cells constituting the memory unit and the like in a lower position deteriorate in properties. Further, with regard to the memory cells constituting the memory unit and the like in each stage, the crystallization heat treatment can be carried out under optimum conditions, and a nonvolatile memory excellent in properties can be obtained. Table 8 below shows crystallization temperatures of typical materials for constituting the ferroelectric layer, while the material for constituting the ferroelectric layer shall not be limited thereto. With regard to the already explained various materials for constituting the ferroelectric layer, the crystallization temperature can be varied by deviating the compositions thereof from their stoichiometric compositions.

TABLE 8

| Material | Crystallization temperature |
| --- | --- |
| $Bi_2SrTa_2O_9$ | 700–800° C. |
| $Bi_2Sr(Ta_{1.5}Nb_{0.5})O_9$ | 650–750° C. |
| $Bi_4Ti_3O_{12}$ | 600–700° C. |
| $Pb(Zr_{0.48}Ti_{0.52})O_3$ | 550–650° C. |
| $PbTiO_3$ | 500–600° C. |

In the nonvolatile memory operation method of the present invention, data is read out from a memory cell at a designated address externally designated or data is written into such a memory cell, so that a desired memory cell can be readily accessed. Further, in some constitutions of the present invention, data is written or re-written into other memory cell, so that the disturbance in other memory cell can be reliably suppressed. Furthermore, since the nonvolatile memory is constituted of memory units comprised of a plurality of memory cells each, the cell area per bit can be decreased.

The invention claimed is:

1. A method of operating a ferroelectric-type nonvolatile semiconductor memory comprising a memory unit having;
   (A) a bit line,
   (B) a transistor for selection, wherein the transistor is an MIS-type FET or an MOS-type FET;
   (C) a sub-memory unit composed of memory cells that are M ($M \geq 2$) in number,
   (D) plate lines that are M in number, and
   (E) a sense amplifier connected to the bit line,
   wherein each memory cell comprises a first electrode, a ferroelectric layer and a second electrode,
   the first electrodes of the memory cells constituting the sub-memory unit are in common with the sub-memory unit, said common first electrode is connected to the bit line through the transistor for selection, and each second electrode is connected to each plate line,
   said method comprising reading out data stored in the memory cell at a designated address externally designated, latching said data in the sense amplifier, and then outputting said data latched in the sense amplifier,
   said ferroelectric-type nonvolatile semiconductor memory further comprising:
   a designated-plate-line address register for storing a plate-line address externally designated, and
   a plate-line-address counter for consecutively incrementing a plate-line address which designates the plate line, and wherein
   the ferroelectric-type nonvolatile semiconductor memory further comprises a comparator that is connected to the designated plate-line address register and the plate-line address counter and is for comparing a value of a designated plate-line address stored in the designated-plate-line address register and a value of a plate-line address in the plate-line address counter.

* * * * *